(12) United States Patent
Igarashi et al.

(10) Patent No.: US 7,447,444 B2
(45) Date of Patent: Nov. 4, 2008

(54) LIGHT SOURCE IN OPTICAL TRANSMISSION SYSTEM, WAVEFORM SHAPER, OPTICAL PULSE TRAIN GENERATOR, AND OPTICAL REPRODUCTION SYSTEM

(75) Inventors: Koji Igarashi, Tokyo (JP); Yoshihiro Emori, Tokyo (JP); Atsushi Oguri, Tokyo (JP); Shu Namiki, Tokyo (JP); Osamu Aso, Tokyo (JP); Masateru Tadakuma, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 562 days.

(21) Appl. No.: 11/134,275

(22) Filed: May 23, 2005

(65) Prior Publication Data

US 2006/0002715 A1 Jan. 5, 2006

Related U.S. Application Data

(63) Continuation of application No. PCT/JP03/14925, filed on Nov. 21, 2003.

(60) Provisional application No. 60/465,990, filed on Apr. 28, 2003, provisional application No. 60/428,001, filed on Nov. 21, 2002.

(51) Int. Cl.
*H04B 10/04* (2006.01)
(52) U.S. Cl. .................. 398/189; 398/183; 398/192
(58) Field of Classification Search ......... 398/183–190, 398/192–194
See application file for complete search history.

(56) References Cited

U.S. PATENT DOCUMENTS 5,900,959 A * 5/1999 Noda et al. ............... 398/195

(Continued)

FOREIGN PATENT DOCUMENTS

| EP | 0 863 630 A2 | 9/1998 |
| EP | 1 130 704 A2 | 9/2001 |
| EP | 1 237 304 A2 | 9/2002 |
| JP | 62-1332 | 1/1987 |

OTHER PUBLICATIONS

S. V. Chernikov, et al., "Comblike dispersion-profiled fiber for soliton pulse train generation", Optics Letters, vol. 19, No. 8 Apr. 15, 1994, 4 cover pages and pp. 539-541.

(Continued)

*Primary Examiner*—Dzung D Tran
(74) *Attorney, Agent, or Firm*—Oblon, Spivak, McClelland, Maier & Neustadt, P.C.

(57) ABSTRACT

The present invention provides a pulse train generator comprising: a dual-frequency signal light source for generating a dual-frequency signal; a soliton shaper for soliton-shaping output light from the dual-frequency signal light source; and an adiabatic soliton compressor for performing adiabatic soliton compression on output light from the soliton shaper, and also provides a waveform shaper used in this pulse train generator, including a plurality of highly nonlinear optical transmission lines and a plurality of low-nonlinearity optical transmission lines which has a nonlinearity coefficient lower than that of the plurality of highly nonlinear optical transmission lines and which has a second-order dispersion value of which an absolute value is different from that of the plurality of highly nonlinear optical transmission lines. Further, the present invention provides a light source comprising a plurality of continuous light sources of which at least one oscillates in a multimode; a multiplexer for multiplexing output light from the continuous light sources; and a nonlinear phenomenon producer for producing a nonlinear phenomenon on output light from the multiplexer so as to suppress SBS (Stimulated Brillouin Scattering).

8 Claims, 57 Drawing Sheets

U.S. PATENT DOCUMENTS 6,175,437 B1 * 1/2001 Diels et al. ............... 398/201
2003/0012492 A1 * 1/2003 Tadakuma et al. ........... 385/27

OTHER PUBLICATIONS

P. C. Reeves-Hall, et al., "Picosecond soliton pulse-duration-selectable source based on adiabatic compression in Raman amplifier", Electronics Letters, vol. 36, No. 7, Mar. 30, 2000, 4 cover pages and pp. 622-624.

T. E. Murphy, "10-GHz 1.3-ps Pulse Generation Using Chirped Soliton Compression in a Raman Gain Medium", IEEE Photonics Technology Letters, vol. 14, No. 10, Oct. 2002, 3 cover pages and pp. 1424-1426.

J. Hansryd, et al., "Increase of the SBS Threshold in a Short Highly Nonlinear Fiber by Applying a Temperature Distribution", Journal of Lightwave Technology, vol. 19, No. 11, Nov. 2001, pp. 1691-1697.

T. Tsuzaki, et al., "Broadband Discrete Fiber Raman Amplifier with High Differential Gain Operating Over 1.65 µm-band" Tech. Dig. MA3, OFC 2001, 3 pages.

E. M. Dianov, et al., "Generation of a train of fundamental solitons at a high repetition rate in optical fibers", Optics Letters, vol. 14, No. 18, Sep. 15, 1989, pp. 1008-1010.

Y. Takushima, et al., "Suppression of Simulated Brillouin Scattering Using Optical Isolators", Electronics Letters, vol. 28, No. 12, Jun. 4, 1992, 4 cover pages and pp. 1155-1157.

Sang Soo Lee, et al., "Stimulated Brillouin Scattering Suppression Using Cross-Phase Modulation Induced by an Optical Supervisory Channel in WDM Links", IEEE Photonics Technology Letters, vol. 13, No. 7, Jul. 2001, 3 cover pages and pp. 741-743.

R. P. Espindola, et al., "High power, low RIN, spectrally-broadened 14xx DFB pump for application in co-pumped Raman amplification", ECOC' 2001, vol. 6, Sep. 30-Oct. 4, 2001, 9 cover pages and pp. 36-37.

* cited by examiner

LIGHT SOURCE IN OPTICAL TRANSMISSION SYSTEM, WAVEFORM SHAPER, OPTICAL PULSE TRAIN GENERATOR, AND OPTICAL REPRODUCTION SYSTEM

TECHNICAL FIELD

The present invention relates to a continuous light source in optical transmission systems, a controlling method of the light source, an apparatus applied to the pulse train generating technique and an optical regenerating system.

BACKGROUND ART

In the optical transmission system, as one of factors to limit the power of light input to the optical fiber, Stimulated Brillouin Scattering (SBS) occurs, which then causes backscattering of a part of the input power and this may adversely affect the transmission system. Conventionally, the technique of suppressing the SBS include: (1) electrically controlling a light source; and (2) optically controlling a light source. The technique (1) is electrical modulation such as frequency modulation, amplitude modulation and dither, which is disclosed in U.S. Pat. No. 5,329,396 December 1994 Fishman et al. The technique (2) relates to control of an optical spectrum using nonlinear phenomenon of an optical fiber, such as Cross-Phase modulation (XPM) and Self-Phase Modulation (SPM), which is particularly effective to pulse light and disclosed in Y. Horinouchi et al., "Stimulated Brillouin Scattering suppression effects induced by cross-phase modulation in high power WDM repeaterless transmission", Electron Lettr., Vol. 34, No. 4, pp.390-391, (1998) and U.S. Pat. No. 6,516,113 B1 April 2003 Glingener et al.

Besides, in recent years, a demand for large-capacity in the optical signal transmission system has been increased. In response to this demand for the large capacity, attempts are being made to achieve terabit capacity of the basis transmission system. This terabit transmission system can be achieved mainly by wavelength division multiplexing (WDM) and optical time division multiplexing (OTDM). The former is a system such that a plurality of signals of different wavelengths is multiplexed to be transmitted as a single signal and the latter is a system of enhancing optical transmission speed (transmission capacity per unit time) itself.

In the optical transmission system using these systems, there is a method of using a repeater for regenerating a signal in an optical area not electrically in the transmission line (optical regeneration). In such optical regeneration, a report has been made as shown in the following Table 1.

The systems (1), (3) and (5) shown in Table 1 are based on electrical signal modulation, while the systems (2) and (4) are based on the all-optical technique which needs no electrical circuit. The system (1) is disclosed in M. Nakazawa and E. Yoshida, IEEE Photon. Technol. Lett., 12, 1613 (2000), (2) in K. Tamura et al., Opt. Lett., 18, 1080 (1993), (3) in H. Kurita et al., IEICE Trans. Electron. E81-C. 129 (1998)., (4) in K. Sato, Electron. Lett., 37, 763 (2001) and (5) in H. Kawatani et al., OFC2001, MJ3-1 (2001).

Further, as a system other than those shown in Table 1, there is proposed a system of converting dual-frequency light into a soliton pulse train by a soliton compression fiber (E. M. Dianov et al., OL, 14 1008(1989)).

Furthermore, in order to realize high-speed signal transmission, there is a technique of utilizing a light source for generating a high-bit-rate optical signal. One example of this technique is an optical pulse compressor using adiabatic soliton compression, which is disclosed in "Picosecond soliton pulse-duration-selectable source based on adiabatic compression in Raman Amplifier" (R. C. Reeves-Hall et al, Electron. Lett., 2000, Vol. 36, pp.622-624).

From the description made up to this point, the present invention has an object to provide a light source having an SBS suppressing effect in optical communication and also a downsized and configurationally simple waveform shaper, an optical pulse train generator and an optical regenerating system.

SUMMARY OF THE INVENTION

The present invention relates to a light source in an optical transmission system, a waveform shaper, an optical pulse train generator and an optical regenerating system.

An optical pulse train generator of the present invention includes a dual-frequency beat light generating portion, a soliton shaper and a soliton compressor. In the conventional system shown in FIG. 1, dual-frequency beat signal light is lead to the adiabatic soliton compressor as it is. On the other hand, according to the present invention, as shown in FIG. 2, beat light is first subjected to conversion of a sin waveform into a soliton waveform in the soliton shaper before being input to the adiabatic soliton compressor. This consequently allows enhancement of a compression efficiency of the adiabatic soliton compression as well as suppression of SBS (Stimulated Brillouin scattering) in the compression fiber.

Further, the soliton shaper and the soliton compressor on which light source performance depends are implemented by a CDPF. The CDPF is configured by a combination of a dispersion fiber and a nonlinearity fiber. Average dispersion values of this fiber pair is controlled to allow pulse control.

TABLE 1

|  | mode-locked fiber laser | | mode-locked laserdiode | | (5) | required spec. |
| --- | --- | --- | --- | --- | --- | --- |
|  | (1) active | (2) passive | (3) active | (4) passive | LD + EAM |  |
| repetition-rate | <40 GHz | M~GHz | <40 GHz | >10 GHz | <40 GHz | >10 GHz |
| temporal duration | >sub-ps | <sub-ps | >sub-ps | >sub-ps | >ps | <ps |
| timing jitter | low | large | low | large | low | low |
| stability | low | low | high | high | high | high |
| synchro. | easy | not easy | easy | easy | easy | easy |

This CDPF technique facilitates optimization of dispersion profiles of a soliton converter and a soliton compressor. The light source of the present invention adopts as one of optimal profiles a profile of increasing average dispersion in the soliton shaper and a profile of decreasing average dispersion in the soliton compressor.

Furthermore, in order to realize an ideal CDPF, it is important to utilize as a nonlinear fiber a fiber of which the nonlinearity coefficient is as large as possible. In view of this, it is preferable to use a highly nonlinear fiber (HNLF) having a nonlinearity coefficient higher than that of a SMF used in transmission. Use of such a low-dispersion HNLF, not only dispersion value but also nonlinearity coefficient presents comb like profiles, and CDPF which is combination of a dispersion fiber and a nonlinear fiber can be manufactured ideally. However, it should be noted that interaction of remaining dispersion and dispersion slope and nonlinearity effect results in a noise amplification phenomenon. In order to suppress this, it is effective to use normal dispersion HNLF. This is because in the normal dispersion area a parametric gain caused by interaction between the nonlinearity effect and dispersion is prevented from occurring thereby suppressing noise amplification.

Furthermore, it is also important to reduce noise at a beat light generating portion. Generally beat light is obtained by multiplexing CW light outputs from two semiconductor laser diodes (LD). However, LD output power is generally the order of tens of milliwatts, which is insufficient for following soliton shaping and soliton compression. Then, beat light amplification is required, but at this stage noise is always added. On the other hand, if an LD of high output ($\geq 50$ mW) is used, it become possible to realize a beat light generating portion that does not require optical amplification, that is, a beat light generating portion which has no noise added (FIG. 7). Actually, a distributed-feedback LD of 100 mW output has been developed and by use of this, a low-noise optical beat generating portion can be manufactured.

In summary, an optical pulse train generator according to the present invention is characterized by the following:

(1) Generation of soliton trains from a dual-frequency beat light signal by combination of a CDPF waveform shaper and a CDPF soliton compressor.

(2) Combination of a waveform shaper of dispersion-increasing CDPF with a soliton compressor of dispersion-decreasing CDPF.

(3) Use of a low-dispersion HNLF in a CDPF waveform shaper and a CDPF soliton compressor.

(4) Noise reduction associated with omission of an EDFA by using two LDs of high outputs.

These result in realization of an adiabatic soliton compressor which has not only high quality but also high compression performance, and if such a compressor is adopted as a light source, it becomes possible to generate a soliton train of ultra high purity having a repetition frequency of more than 100 GHz and time width in subpicosecond range.

On the other hand, this light source can realize synchronization of soliton train repetition frequency with an external signal (electric or optical), which is necessary for application of an optical transmission system. The configuration of this light source which enables external synchronization is shown in FIG. 8. The configuration is made by combination of a light source shown in FIG. 7 and an optical phase locked loop (OPLL), in which a reference optical signal, which is in this figure an optical clock pulse train obtained by combination of a LD and a modulator driven by an external electric input signal, and a part of light source output light are compared in repetition frequency in an optical area. Frequency comparison utilizes four wave mixing (FWM) in an optical fiber. An LD wavelength of the beat light generating portion is adjusted so that the power of generated FWM light can become maximal. Particularly, as this system utilizes frequency comparison in the optical area, it should be noted that upper limit thereto is not set.

In addition, the above-described light source is also applicable to an optical clock pulse light source of an optical regenerating subsystem, which is shown in FIG. 9. After deteriorated transmission signal light is subjected to waveform shaping, before a clock pulse train generated based on a clock frequency extracted from the light signal (clock extraction) is switched by an optical signal. The light source shown in FIG. 8 is applied to this clock extraction and clock pulse train generation. The quality of the clock pulse train is extremely important light source performance for determining the performance of the transmission path. In other words, the light source of this invention enabling generation of a soliton train of extremely high purity is suitable for an optical clock pulse light source in the optical regenerating system. Further, from the same reason as described above, the light source of this invention is suitable for application to an OTDM-DEMUX portion, which is shown in FIG. 10.

Further, the present invention relates to the technique to suppress SBS in a continuous light source by using a optical fiber nonlinear phenomenon such as XPM, SPM or FWM. Specifically speaking, the present invention provides a method and a device for SBS suppression by broadening the spectrum width of each mode of the multimode continuous light source by using a nonlinear phenomenon or by reducing power of a mode of which the peak power is larger.

The present invention relates to a light source having a further SBS suppressing effect as compared with the conventional art. Particularly, the present invention allows SBS suppression without increase of relative intensity noise (RIN).

In order to cause a nonlinear phenomenon such as XPM or SPM, it is necessary to change the refractive index corresponding to the optical intensity caused in a medium having third-order nonlinear sensitivity. As pulse light is relatively apt to generate the effect, pulse light is often utilized. Therefore, study on continuous light, which is a subject of the present invention, has not been made.

Further, description of another embodiment of the present invention is made on a waveform shaper. This waveform shaper can have both functions of waveform shaper and compression. In other words, if two waveform shapers are connected, waveform shaping and compression can be both performed.

One embodiment of the waveform shaper of the present invention is a waveform shaper for converting input light into soliton light, including a plurality of highly nonlinear optical transmission line segments and a plurality of low nonlinear optical transmission line segments which has a nonlinearity coefficient lower than that of the plurality of highly nonlinear optical transmission lines and a second-order dispersion value of which an absolute value is different from that of the plurality of highly nonlinear optical transmission lines.

According to this embodiment, since the plurality of highly nonlinear optical transmission line segments and the plurality of low nonlinear optical transmission line segments are arranged, an equivalently dispersion-decreasing transmission path can be realized. Since the highly nonlinear optical transmission line is used, it is possible to manufacture a waveform shaper having a high dispersion value as a whole.

Another embodiment of the waveform shaper of the present invention is the waveform shaper of the above-described invention, further including an optical isolator away from the input end by a distance that is equal to or shorter than a soliton period.

According to this embodiment, since the optical isolator is arranged away from the input end by a distance equal to or shorter than the soliton period, it is possible to prevent SBS in the waveform shaper from occurring, thereby outputting soliton light of high intensity.

Another embodiment of the waveform shaper of the present invention is the waveform shaper of the above-described invention, in which the optical isolator is arranged at a connecting point of the different optical transmission line segments.

According to this embodiment, since the optical isolator is arranged at the connecting portion of the different transmission path segments, it becomes possible to decrease the number of connecting portions, thereby reducing an optical loss of the waveform shaper.

Another embodiment of the waveform shaper of the present invention is the waveform shaper of the above-described invention, in which the optical isolator is arranged anterior to the highly nonlinear optical transmission line segment.

Since the optical isolator is arranged anterior to the highly nonlinear optical transmission line segment, it is possible to prevent SBS from occurring effectively. As the SBS is one nonlinear phenomenon, it often occurs in the highly nonlinear optical transmission line. Accordingly, if the optical isolator is arranged anterior to the highly nonlinear optical transmission line, SBS occurrence can be suppressed effectively.

One embodiment of an optical pulse generator according to the present invention is an optical pulse generator including a highly nonlinear optical transmission line of 3 km−1.W−1 or more in nonlinearity coefficient, and comprising pulse width compressing means for compressing a pulse width by adiabatic soliton compression while performing Raman amplification on input light; a pumping light source for providing the pulse width compressing means with pumping light for Raman amplification; and optical coupling means for optically coupling the pumping light source to the pulse width compressing means.

According to this embodiment, since Raman amplification is performed on light propagating in the highly nonlinear optical transmission line, the length of the highly nonlinear optical transmission line can be shortened and the pulse width of output light can be compressed into a narrower width.

Another embodiment of an optical pulse generator according to the present invention is an optical pulse generator of the above described invention, further including a waveform shaper arranged anterior to the pulse width compressing means and light emitting means arranged anterior to the waveform shaper.

One embodiment of an optical pulse generator according to the present invention is an optical pulse generator of the above described invention, further comprising an optical amplifier arranged anterior to the pulse width compressing means.

One embodiment of an optical pulse generator according to the present invention is an optical pulse generator of the above described invention, further comprising SBS suppressing means arranged anterior to the pulse width compressing means.

One embodiment of an optical pulse generator according to the present invention is an optical pulse generator including a clock extracting device for extracting a repetition frequency of transmitted light; an optical clock pulse train generating device with a waveform shaper or an optical pulse generator; and an optical shutter device for modulating light output from the optical clock pulse train generating device based on a frequency extracted by the clock extracting device.

According to this embodiment, as the optical pulse generator is used as an optical clock pulse train generator, it is possible to obtain an optical clock pulse train with less intensity fluctuation of the optical pulse and less time fluctuation.

DETAILED DESCRIPTION OF THE INVENTION

With reference to the drawings, preferred embodiments of the present invention will be described in detail below.

(Embodiments of an Optical Pulse Train Generator)

Figure 1:
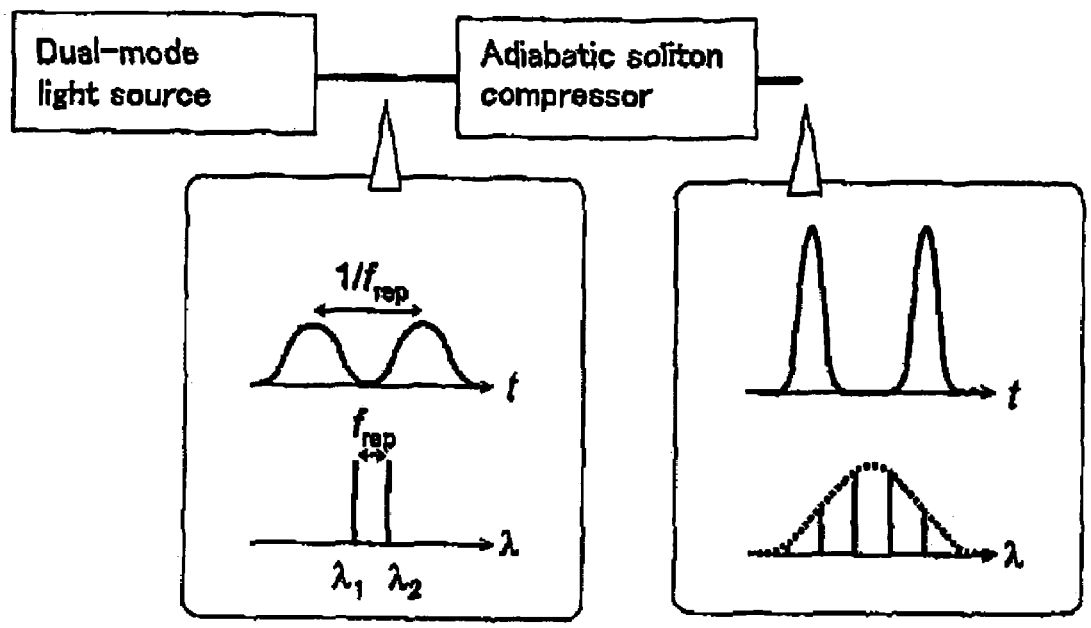
FIG. 1 is a view illustrating a configuration of a conventional system for generating high repetition rate soliton trains by soliton compression of dual-frequency beat light.
Figure 2:
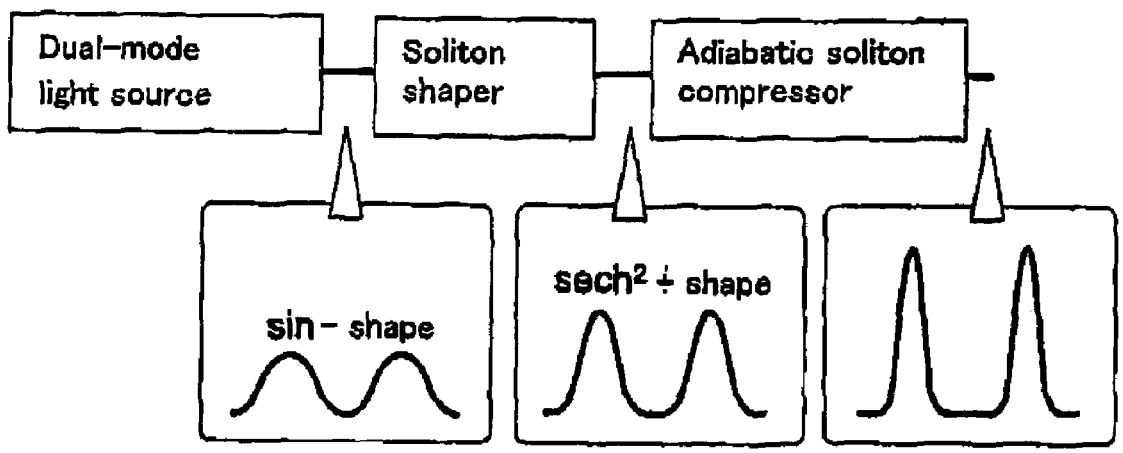
FIG. 2 is a view illustrating a configuration of a system for generating high repetition rate soliton trains from dual-frequency beat light, including a combination of soliton shaper and a adiabatic soliton compressor according to the present invention.
Figure 3:
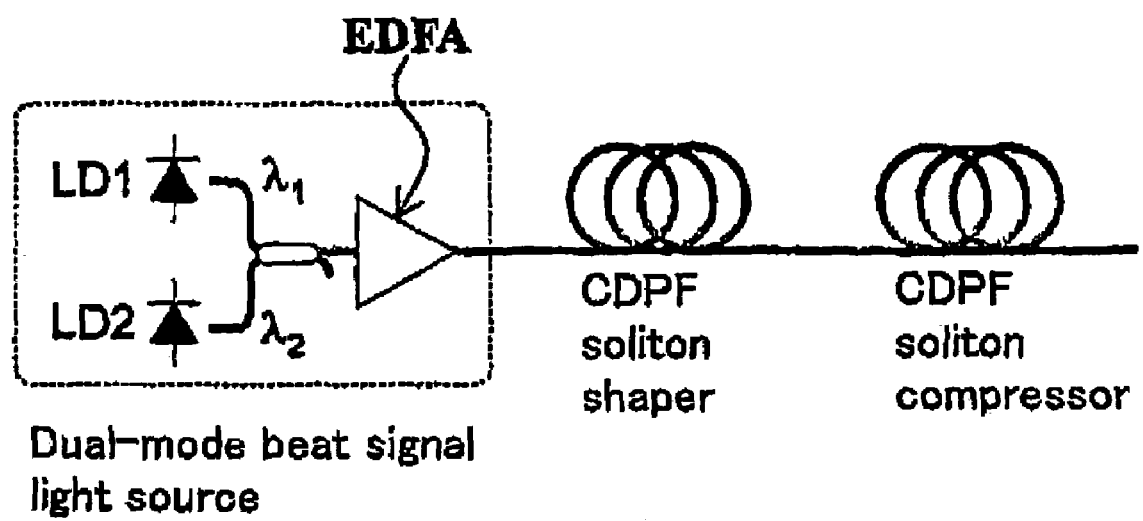
FIG. 3 is a view illustrating a configuration such that in the system shown in FIG. 2 a dispersion-increasing CDPF is used in a soliton shaper and a dispersion-decreasing CDPF is used in a adiabatic soliton compressor.

First description is made about embodiments of an optical pulse train generator according to the present invention. FIGS. 2 and 3 show examples of an optical pulse train generator according to the present invention.

FIG. 2 is a view for illustrating a configuration of the whole system of the optical pulse train generator of the present invention. In FIG. 2, a waveform of signal light output from a dual-frequency optical source is sin waveform, and a waveform of output light after being shaped by a soliton shaper is sech$^2$ waveform that is appropriate for adiabatic soliton compression. After that, the signal light is made to pass though an adiabatic soliton compressor to be a pulse light signal appropriate for terabit transmission. In the conventional technique, a pulse is soliton-converted in an anterior part of the compressor and compressed in a posterior part thereof. On the other hand, in the present invention, a pulse is compressed in an anterior part of the compressor thereby realizing compression ability. Further, the soliton shaper makes it possible to achieve an effective broad spectrum before SBS effect occurs. As a result of this, the SBS effect of the whole SDPF can be reduced.

FIG. 3 shows an example in which a dispersion-increasing CDPF is applied to the soliton shaper and a dispersion-decreasing CDPF is adopted to the adiabatic soliton compressor. After light outputs from two semiconductor lasers of different wavelength are combined to be input to an erbium-doped fiber amplifier or semiconductor optical amplifier. The amplified beat light is input to the two CDPFs. Since these two CDPFs are implemented by combination of the dispersion-decreasing CDPF and dispersion-increasing CDPF, it is possible to realize high compressibility without reducing pulse quality. In addition, use of CDPF technique allows not only easy realization of a dispersion-increasing and dispersion-decreasing profile but also precise and continuous control of a dispersion value by adjusting the fiber length.

Specifically, an optical pulse train generator according to the present invention will be implemented by the following:

(1) Dual-frequency light source including two semiconductor lasers for outputting light signals of different mode and a multiplexer for multiplexing the light signals into dual-frequency signal light.

(2) Soliton shaper for, configured by a dispersion-increasing CDPF, soliton converting the dual-frequency signal light.

(3) Adiabatic soliton compressor, configured by a dispersion-decreasing CDPF, for subjecting the soliton converted signal light to adiabatic soliton compression.

In addition, in order to generate a soliton train of high quality, it is important to use a HNLF (highly nonlinear fiber) of which the nonlinearity coefficient is as large as possible. With a nonlinear fiber implemented by an ideal CDPF, there occurs only nonlinearity and it is necessary to cancel dispersion. Conventionally, this nonlinear fiber is often implemented by a dispersion-shifted fiber of which the second-order dispersion value is extremely small. When such a fiber of extremely small second-order dispersion value is used, higher-order dispersion effect is enhanced thereby deteriorating the pulse quality. On the other hand, a HNLP of small dispersion value provides not only a small dispersion effect but also enhanced nonlinearity, and therefore, this fiber can serve as an ideal nonlinear fiber. This consequently improves the freedom of CDPF design and facilitates suppression of deterioration of compressed pulse quality.

These dispersion-increasing CDPF and dispersion-decreasing CDPF are each manufactured by fusion splicing of a HNKP and a SMF. Accordingly, these CDPFs can be readily manufactured by adjusting the lengths of these only two kinds of fibers, SMF and HNLP of which a D value is fixed in the longitudinal direction of the fiber, which results in bringing about a great merit in actual manufacturing and working. On the other hand, as mentioned above, the conventional dispersion-increasing fiber and the conventional dispersion-decreasing fiber have to be configured by an optical fiber of which D values are adjusted precisely. Manufacturing of these fibers is extremely difficult and manufacturing and construction actually need much time and costs.

Further, HNLF is a fiber having a minus dispersion value called normal dispersion HNLF. The soliton shaper made of a dispersion-increasing CDPF using this fiber is able to reduce SBS by a compression fiber thereby suppressing noise. Furthermore, this is compatible with soliton compressor made of a CDPF using the normal dispersion HNLF, thereby allowing noise-reduced light to be output.

CDPF fiber characteristics are summarized in Table 2.

TABLE 2

|  | $D_{ave}$ [ps/nm/km] | HNLF length [m] | SMF length [m] |
| --- | --- | --- | --- |
| 1st pair | 3.5 | 40 | 10 |
| 2nd pair | 5.8 | 40 | 20 |
| 3rd pair | 7.5 | 40 | 30 |

TABLE 2-continued

|  | $D_{ave}$ [ps/nm/km] | HNLF length [m] | SMF length [m] |
|---|---|---|---|
| 4th pair | 3.5 | 100 | 25 |
| 5th pair | 1.6 | 100 | 10 |
| 6th pair | 0.8 | 100 | 5 |

Table 2 shows fiber characteristics of a CDPF used in the soliton shaper and adiabatic soliton compressor. $D_{ave}$ indicates an average dispersion value. In $1^{st}$ pair through $3^{rd}$ pair, as the HNLF length is fixed at 40 m and as SMF is set longer, the $D_{ave}$ value becomes larger, which realizes a dispersion-increasing CDPF. This is used in the soliton shaper.

In $4^{th}$ pair through $6^{th}$ pair, as the HNLF length is fixed at 100 m and SMF is set shorter, the $D_{ave}$ value becomes smaller, which realizes a dispersion-decreasing SCPF. This is used in the adiabatic soliton compressor.

Hence, given dispersion-increasing CDPF and dispersion-decreasing CDPF can be obtained by adjusting lengths of two kinds of fibers, HNLF and SMF.

Figure 4:
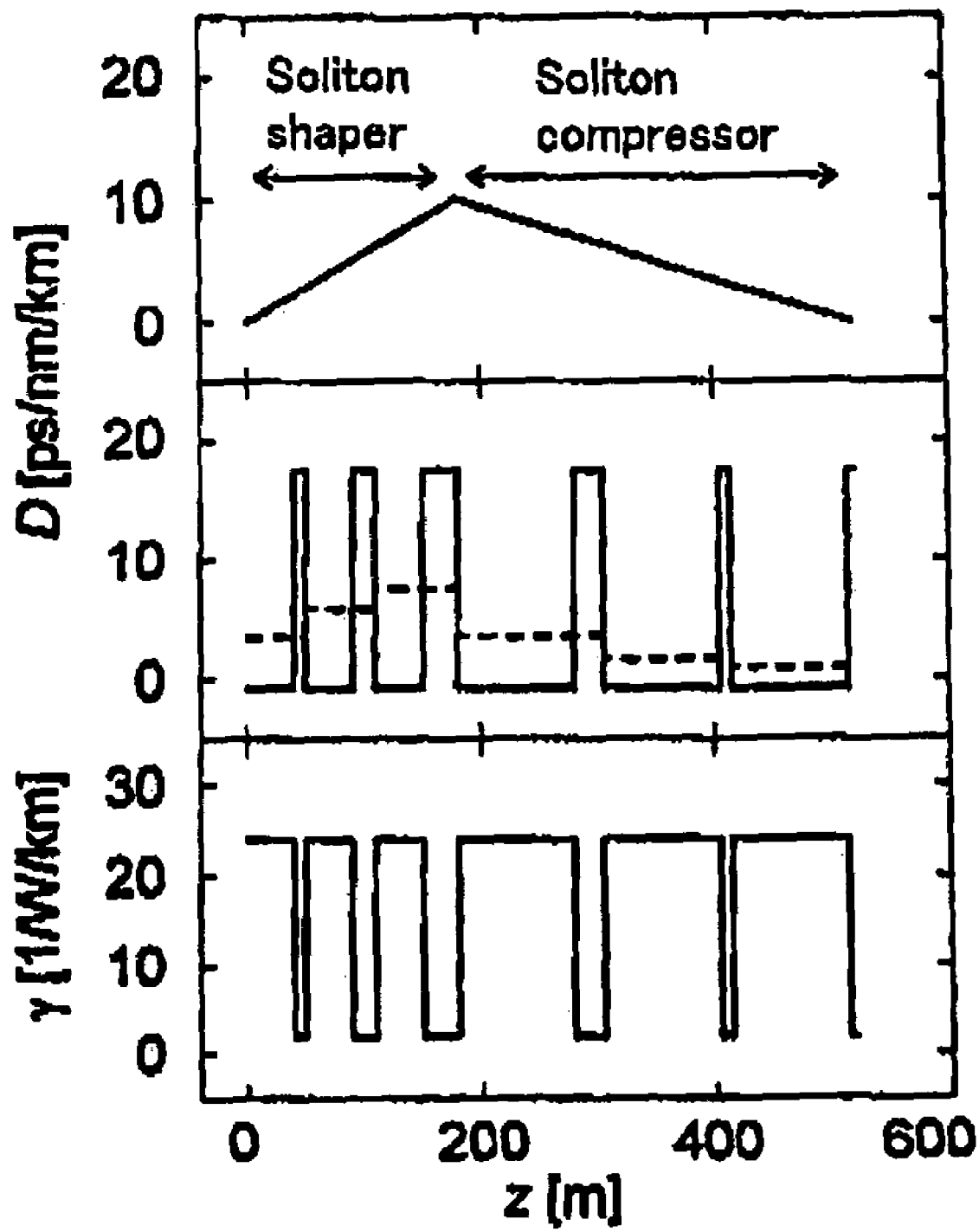
FIG. 4 is a view illustrating a profile of fiber characteristic of a soliton shaping SDPF and a soliton compressing CDPF.

FIG. 4 shows a fiber profile for waveform shaping and soliton compression. The upper graph of FIG. 4 shows an ideal dispersion profile. The vertical axis of the graph indicates dispersion value D in ps/nm/km. The horizontal axis indicates a fiber longitudinal distance z in m.

The middle graph of FIG. 4 shows a CDPF dispersion profile of the CDPF of Table 2. The measures of the vertical and horizontal axes are the same as those in the upper graph of FIG. 4. A broken line shows an average dispersion value $D_{ave}$.

The lower graph of FIG. 4 shows a profile of nonlinearity coefficient γ of the CDPF of Table 2. The vertical axis of the graph indicates nonlinearity coefficient γ in 1/w/km and the vertical axis indicates the fiber longitudinal distance z in m.

As is seen from the average dispersion value $D_{ave}$ shown in the middle graph of FIG. 4, a CDPF for waveform shaping has a predetermined dispersion-increasing profile while a CFPF for adiabatic soliton compression has a predetermined dispersion-decreasing profile.

It is noted that as is clear from the lower graph of FIG. 4, use of HNLF in CDPF enables realization of a fiber having a comb like profile of nonlinearity coefficient as well as a comb like profile of fiber dispersion. This makes it possible to obtain an ideal profile in which the nonlinearity effect and the dispersion effect are executed alternately.

In other words, if dimensions of a nonlinear medium and a dispersion medium are adjusted, transmission characteristics can be controlled. The term "dimension" used here includes fiber length, medium length, thickness and others that have effects on the nonlinearity and dispersion.

Here, HNLF actual dispersion value and nonlinearity coefficient are 0.8 ps/nm/km and 24 l/w/km. Normal dispersion in which the HNLF dispersion value presents a minus value makes it possible to suppress parametric gain occurrence during soliton compression, which results in suppression in noise amplification.

Figure 5A:
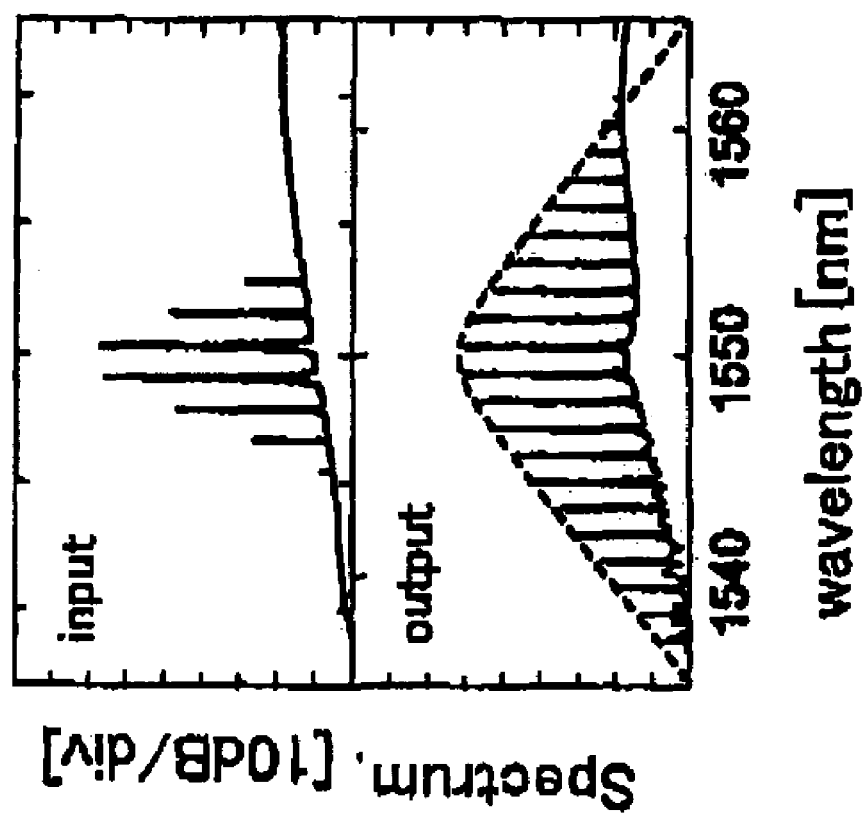
FIG. 5A is a view illustrating autocorrelation traces of input/output pulses by an optical pulse train generator according to the present invention.
Figure 5B:
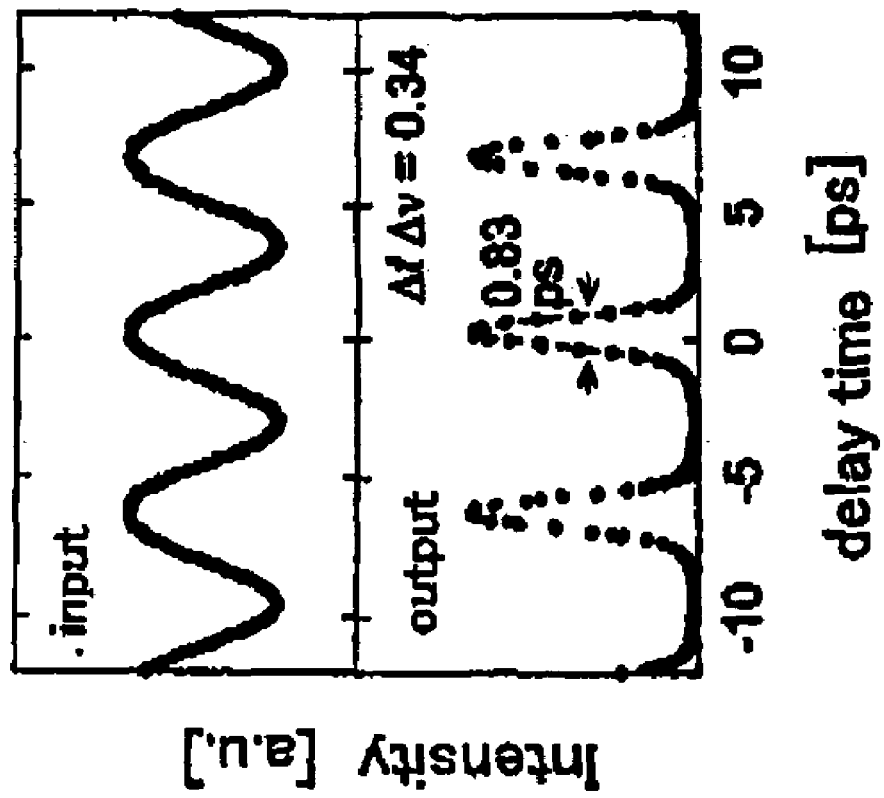
FIG. 5B is a view illustrating spectrums of input/output pulses by an optical pulse train generator according to the present invention.

Next, FIGS. 5A and 5B show results of such beat light as described above which is subjected to soliton conversion using a dispersion-increasing CDPF and soliton compression using a dispersion-decreasing CDPF, that is, input/output pulse waveforms which show performance of the optical pulse train generator according to the present invention.

In FIG. 5A, autocorrelation traces of input/output pulses are shown by black dots. The vertical axis of the graph shows optical intensity in arbitrary unit and the horizontal axis of the graph shows time delay in ps. An ideal autocorrelation trace of sech$^2$ pulses is shown by a broken line.

FIG. 5B shows optical spectral profiles. The vertical axis of the graph shows a spectrum in 10 dB/div and the horizontal axis of the graph shows wavelengths in nm. An ideal sech$^2$ waveform is shown by a broken line.

It is noted here that the experimental result and the broken line are matched well not only on the autocorrelation trace but also on the optical spectrum. Further, as there is no significant change in the mode width of the CDPF input/output pulse spectrum, noise increase at the soliton compression stage is proved to be less.

The above described results show that an optical pulse obtained by the optical pulse train generator according to the present invention is a soliton of ultra high purity. The time width obtained from autocorrelation fitting is 830 fs.

Accordingly, use of the optical pulse train generator configured by combining a soliton shaper by dispersion-increasing CDPF using normal dispersion HNLF and an adiabatic soliton compressor by dispersion-decreasing CDPF using normal dispersion HNLF allows to obtain soliton of ultra high purity compressed into subpicosecond level, which shows great strides forward practical application of terabit transmission.

In addition, it is proved that if CDPF of modest dispersion decrease as compared with the CDPF of the example in FIG. 4 is applied, the performance of soliton compression can be further improved. As an example, fiber characteristics of a soliton compressor having 6-pair CDPF adiabatic soliton compressing portions are shown in Table 3.

TABLE 3

|  | $D_{ave}$ [ps/nm/km] | HNLF length [m] | SMF length [m] |
|---|---|---|---|
| 1st pair | 3.5 | 40 | 10 |
| 2nd pair | 5.8 | 40 | 20 |
| 3rd pair | 7.5 | 40 | 30 |
| 4th pair | 3.5 | 100 | 30 |
| 5th pair | 1.6 | 100 | 25 |
| 6th pair | 0.8 | 100 | 20 |
| 7th pair | 0.8 | 100 | 15 |
| 8th pair | 0.8 | 100 | 10 |
| 9th pair | 0.8 | 100 | 5 |

$D_{ave}$ indicates an average dispersion value. In $1^{st}$ pair through $3^{rd}$ pair, as the HNLF length is fixed at 40 m and the SMF is set longer, the $D_{ave}$ value becomes larger, which realizes a dispersion-increasing CDPF. This is used in the soliton shaper.

In $4^{th}$ pair through $9^{th}$ pair, as the HNLF length is fixed at 100 m and SMF is set shorter, the $D_{ave}$ value becomes smaller, which realizes a dispersion-decreasing CDPF. As compared with those shown in table 2, the length of the dispersion-decreasing CDPF becomes twice longer. This is used in the adiabatic soliton compressor.

Figure 6:
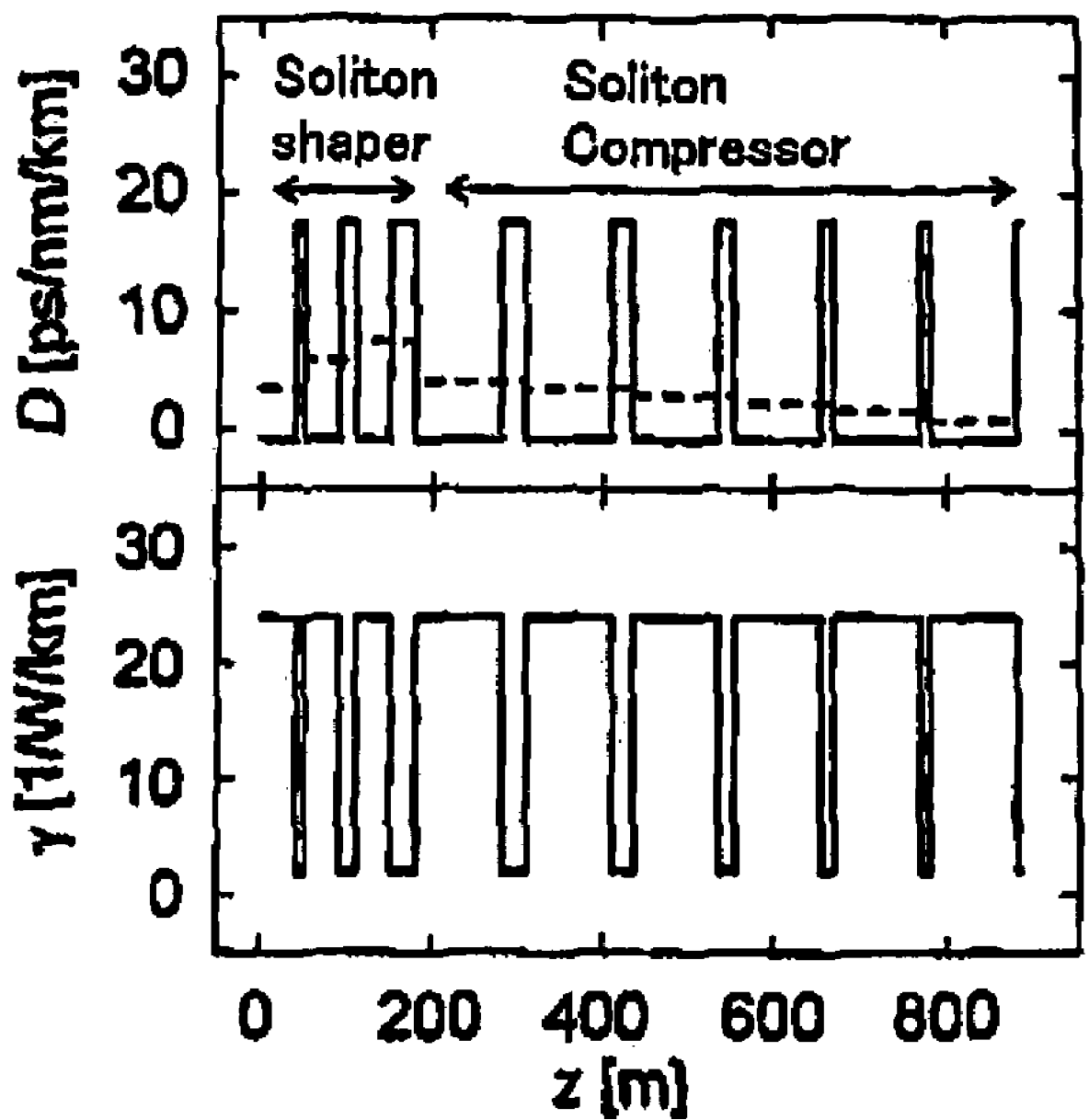
FIG. 6 is a view illustrating a fiber characteristic profile of a soliton shaping SDPF and a soliton compressing CDPF which shows more modest dispersion decreasing than that in FIG. 3.

FIG. 6 shows a CDPF fiber characteristic profile. The upper graph of FIG. 6 shows CDPF dispersion profile shown in Table 3. The vertical axis of the graph indicates a dispersion value D in ps/nm/km and the vertical axis indicates fiber longitudinal distance z in m.

The lower graph of FIG. 6 shows a profile of the CDPF nonlinearity coefficient γ of the CDPF shown in table 3. The vertical axis of the graph shows nonlinearity coefficient γ in l/w/km while the vertical axis indicates the fiber longitudinal distance z in m.

Use of such a CDPF fiber as have the above-described profiles makes it possible to obtain further compressed soliton of ultra high purity.

It is also important to reduce noise at a beat light generating portion. Generally, beat light is obtained by multiplexing CW light outputs from two semiconductor lasers. However, LD output power is usually in the order of tens of milliwatts and is insufficient for next-stage soliton conversion and soliton compression. Hence, it is required to amplify beat light. However, there is a problem of noise of an amplifier.

Figure 7:
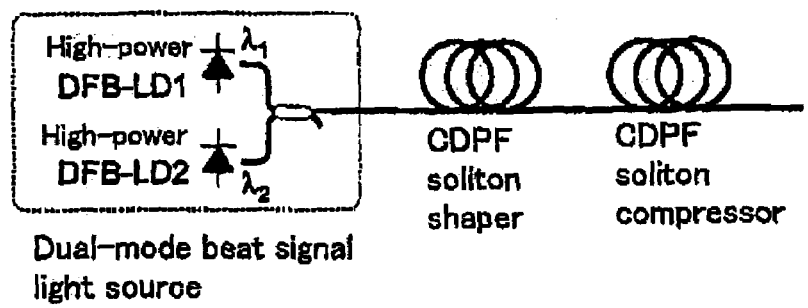
FIG. 7 is a view illustrating a configuration of a beat light generating portion using high-power DFB-LDs.

Among the light source components in FIG. 3, the EDFA causes most noise. In other words, if the EDFA is not used in the system, it is possible to generate a soliton train of high quality. An example of EDFA-free light source based on this idea is shown in FIG. 7. CW light outputs from two high-power LDs ($\geqq$50 mW) are multiplexed to obtain beat light ($\geqq$50 mW). Since this beat light has enough optical power for the next-stage soliton conversion and compression, no optical amplifier is needed. Accordingly, it is possible to generate a soliton train with less noise. In addition, as an LD driving circuit used in the EDFA can be omitted, downsizing of the device itself is one of the merits.

Next, in consideration of application of a light source according to the present invention to an optical transmission system, external synchronization of the light source is one indispensable function. The light source according to the present invention is characterized by easily realizing this function.

Figure 8:
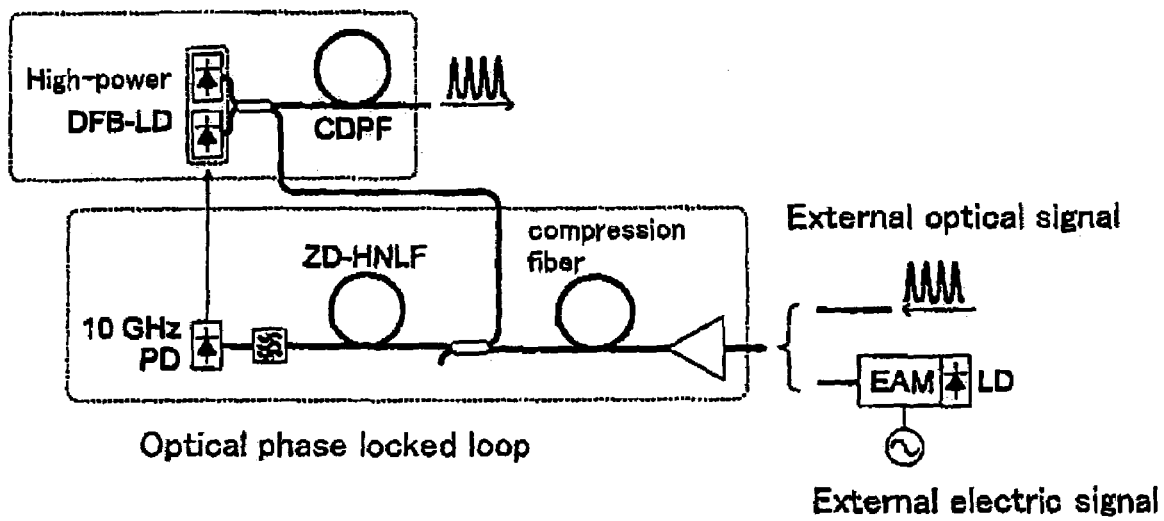
FIG. 8 is a view illustrating a light source which is able to be in synchronization with an external signal.

As an example of this, a configuration of the light source is shown in FIG. 8. This configuration is composed of a combination of a soliton train generator based on the low noise light source and an OPLL (optical phase locked loop). The Operation principle of this OPLL is described in detail below.

When external input light is a reference signal, a repetition frequency of the external input light and a beat frequency of dual-frequency light are compared in an optical area. This comparison utilizes four wave mixing (FWM) phenomenon which is one of optical fiber nonlinearity effects. The external light and the beat light are combined and input to a HNLF to generate FWM light. This FWM light is cut off by an optical filter to monitor its power. The LD wavelength of the beat light generator is tuned so that this FWM optical power can become maximized and thereby the frequencies are synchronized. When synchronization is made with an external electric signal, first, a clock pulse train is generated based on this electric signal. This can be suitably carried out by a simple and high-speed electro-absorption semiconductor modulator (EAM) equipped DFBLD. Further, a HNLF is used to perform pulse compression if necessary. This optical clock pulse train and the repetition frequency of the beat light are compared in the optical area in the same way as mentioned above to realize synchronization.

Figure 9:
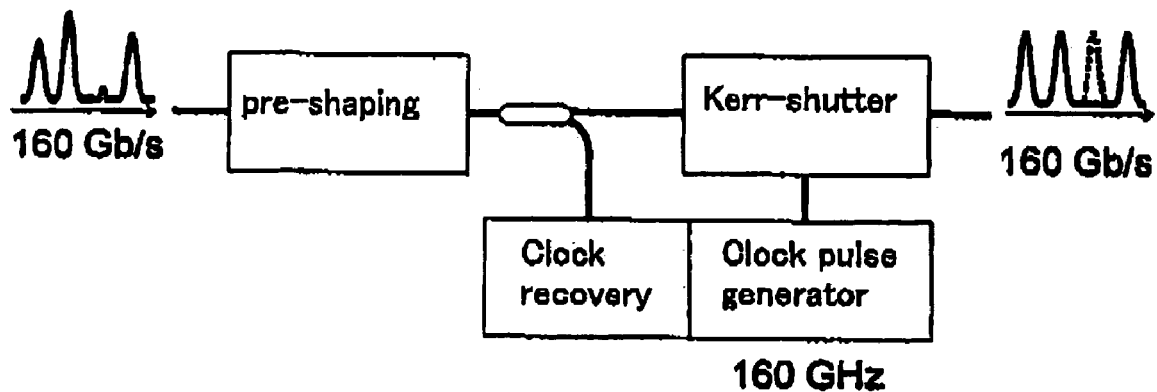
FIG. 9 is a view showing a configuration in which the light source of the present invention is applied to an optical clock pulse light source of an optical regenerating subsystem.

Further, it is an important issue in the terabit long-haul transmission to compensate waveform fluctuations of signal light or a temporal difference of signal light pulses caused in the long-haul transmission at a relay point. In this respect, the above-mentioned light source according to the present invention is applicable to an optical clock pulse light source of the regenerating subsystem, which is shown in FIG. 9.

At the first stage of the regeneration, a waveform of deteriorated signal light can be shaped to some extent by removing noise in the signal light. This is realized by using a device which has input and output profiles with threshold and saturation.

However, this function is not enough to compensate for a temporal difference of the signal light pulse. Used as the function of compensating for a temporal difference of the signal light pulse is retiming, which is described below.

Here, a signal having a timing difference is switched with a clock pulse train of reference repetition frequency to realize the retiming function. The general method of switching in the optical area is a method based on the nonlinearity effect of an optical fiber.

It is effective to use an OPLL equipped soliton train generator shown in FIG. 8 in clock pulse generation required for retiming. An output pulse obtained therefrom is a soliton pulse train which is synchronized with the repetition frequency of input signal light. Since this output pulse is a signal light pulse of high purity, it is extremely appropriate for the terabit OTDM transmission system for which construction of a high-quality transmission path including realization of high-quality transmission path and high-quality transmission pulse is an absolutely must.

Figure 10:
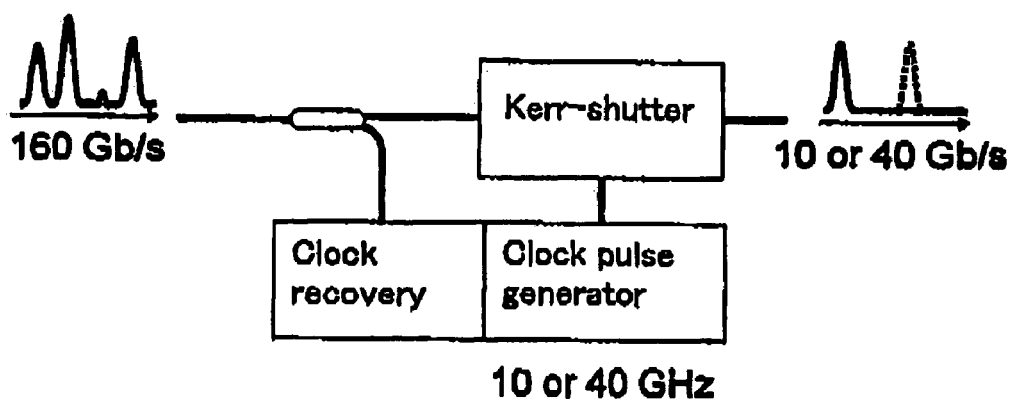
FIG. 10 is a view illustrating a configuration in which the light source of the present invention is applied to an OTDM-DEMUX portion.

Further, a light source according to the present invention is also suitable for use in clock pulse train generation at DEMUX portion required in an OTDM system receiving portion, which example is shown in FIG. 10.

A system shown in FIG. 10 is such that a transmitted light signal is branched out and switched with a clock pulse train which has a divided frequency of the repetition frequency of the signal. This clock pulse train generation and clock extraction utilize the light source shown in FIG. 8. In FIG. 10, the signal is divided by Kerr-shutter, however division may be performed in another method.

Use of a light source of the present invention makes it possible to realize a DEMUX portion of simple configuration. In addition, in the same as the regeneration of FIG. 9, noise is removed before switching to shape a waveform, thereby allowing the performance to be further enhanced.

As described up to this point, a light source of the present invention is applicable to every point in the transmission system including a receiving portion, a relay portion and a receiving portion and the present invention makes a great contribution to realization of the terabit OTDM transmission system.

(Other Embodiments of Optical Pulse Train Generator)

Besides, an optical pulse has interesting characteristics in the temporal, spatial frequency area of which typical examples are temporally and spatially intensive energy and broadened spectrum. There are proposed various applications which utilize these characteristics, and above all, applications to microfabrication, multiphoton absorption fabrication, sampling measure and optical fiber communication are expected.

Mainstream of the optical pulse generating method is a large solid laser device represented by a mode synchronization titanium sapphire laser. However, since it utilizes the spatial optical system, downsizing is difficult and stability is poor. These essential problems make industrial applicability of this light source thrown into doubt. On the other hand, in terms of downsizing and stability, there is nothing that exceeds a system using a semiconductor laser diode (LD), or a dielectric and semiconductor modulator. Particularly, this system facilitates synchronization with an electric signal and essentially has indispensable characteristics for industrial application. However, a time width of an optical pulse obtained by this system is only the order of 1 ps, and therefore, an optical pulse compressor is required for further time width shortening. Further, output power from one LD is a few hundreds of milliwatts at the maximum and an external optical amplifier is required for watt or microsiemens amplifier. The present invention relates particularly to the former technique of pulse compression.

As a simple pulse compression system consistent with LD output pulses, there is a system of using optical fiber nonlinearity effect. In this system, a method that is particularly excellent in low noise is adiabatic soliton compression. When there exists perturbation in propagation along an optical fiber, an optical soliton is changed in its waveform so that a parameter expressed by the following expression, called soliton order, may become constant.

$$N = \sqrt{\frac{\gamma P_0 T_0^2}{\beta_2}} = \sqrt{1.763 \times \gamma \frac{\varepsilon_p T_0}{\beta_2}}$$ Equation (1)

where $\gamma$ and $\beta_2$ are nonlinearity coefficient [1/W/km] and a dispersion value [ps²/km], respectively. $P_0$, $T_0$ and $\varepsilon_p$ are a peak power of the optical soliton [W], $1/e^2$ pulse width [ps] and pulse energy [pJ]. When $\beta_2$ is lowered or $\varepsilon_p$ is increased as perturbation, the optical soliton decreases $T_0$ in order to fix N. This is the principle of adiabatic soliton compression.

The method for realizing adiabatic soliton compression includes three ways: (1) a dispersion-decreasing fiber (DDF) of which the dispersion value is decreased in the fiber longitudinal direction, (2) a fiber imitating a DDF by combining various kinds of fibers and (3) a fiber having a modest gain in the longitudinal direction. These ways are summarized below:

(1) A DPF is an ideal adiabatic soliton compression fiber. However, local dispersion values have to be controlled precisely and its fabrication is not easy. Dispersion fluctuations cause noise amplification and lead to deterioration of compression pulse quality. Further, it is necessary to optimize DDF input end dispersion value and dispersion decreasing rate, and therefore, this can not be said to be a method of high flexibility.

(2) A DDF can be imitated by connecting several kinds of dispersion fixed fibers, which includes a step-like dispersion profiled fiber (SDPF) formed by connecting dispersion-shifter fibers (DSFs) of different dispersion values and a comb-like dispersion profiled fiber formed by alternately two kinds of DSFs of different dispersion values. These allow precise control of a dispersion value, however, as there exists fiber splicing loss, these are inferior to other methods in term of compression performance.

(3) Optical fiber amplifiers are broadly divided into an Erbium doped fiber amplifier (EDFA) and a Raman amplifier. Particularly, amplification of the latter Raman amplifier is such as utilizes stimulated Raman scattering which is nonlinearity optical effect and therefore, unlike the EDFA, it is possible in the Raman amplifier to control gain amplification by changing intensity and wavelength of pump light. Accordingly, adiabatic soliton compression is facilitated by controlling gain amplification so as to compensate for fluctuations of a waveform of input light and DSF dispersion value. However, when an optical pulse compressor is configured to include a Raman amplifier, there presents a problem of upsizing of the optical pulse compressor. This is because Raman amplification is lower in amplification efficiency than the EDFA and needs, for enough amplification, a DSF or the like that has fiber length of several tens of kilometers, which presents difficulty in downsizing of the device.

These compression ways have a common problem of Stimulated Brillouin Scattering (SBS). SBS is a phenomenon such that there occurs back scattering when an optical wave power reaches some threshold value. This phenomenon limits the optical wave power that can be propagated to a compression fiber and makes it difficult to realize effective adiabatic soliton compression.

Among the above-described three compression fibers, the present invention relates to (2) CDPF and (3) Raman amplifier. The present invention can be positioned at extension of these ways, however, it is noted that the present invention presents a completely new concept. Here, it is noted that a waveform shaper used hereinafter means a device for shaping a waveform in the temporal and spectral area of optical wave, including optical pulse compression and spectrum broadening device.

Figure 11:
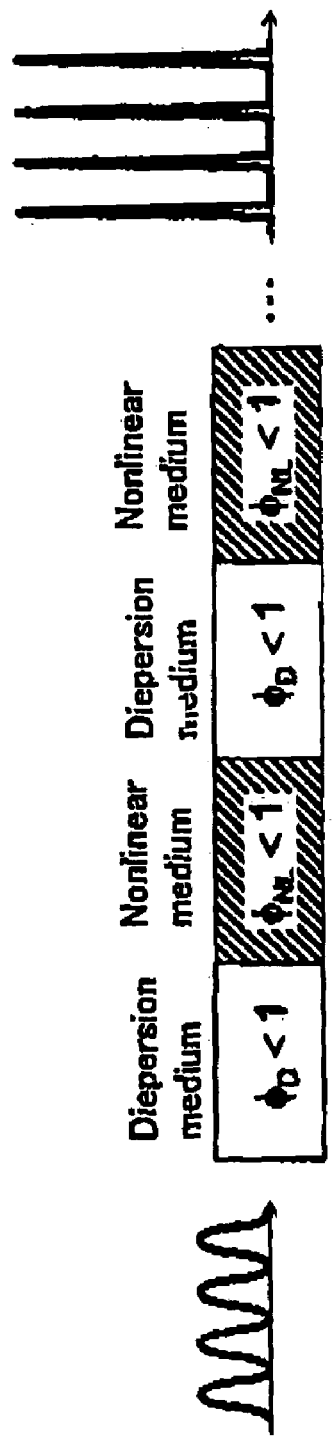
FIG. 11 is a view illustrating a transmission line in which a dispersion medium and a nonlinear medium repeat alternately.

As a typical way of shaping an optical pulse waveform, there is a system for controlling an optical wave through a local dispersion effect and a local nonlinearity effect of a transmission path. This system includes optical soliton and super continuum light. This system is different from the conventional system of tuning a local dispersion effect and a local nonlinearity effect in that the system of the present invention controls optical wave by a transmission path in which a dispersion medium and a nonlinear medium repeat alternately. A conceptual view of the present invention is shown in FIG. 11. Particularly, when phase rotation by dispersion in each dispersion medium and nonlinearity induced phase rotation at each nonlinear medium is at most 1 radian, adjusting dimensions of these media is equal to controlling local dispersion and nonlinearity. The dimensions here include the length of an optical fiber, the length of a medium, the thickness thereof and every dimension that affects nonlinearity and dispersion.

Figure 12:
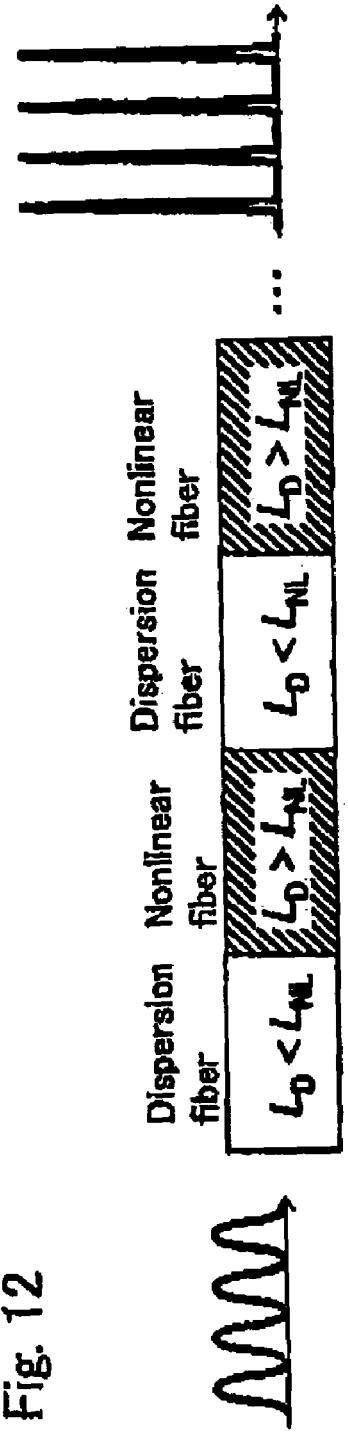
FIG. 12 is a view illustrating an general idea of CPF.

As a method of realizing a transmission path in which a dispersion medium and a nonlinear medium repeat alternately, there is an optical fiber according to the present invention. The transmission path including alternately arranged dispersion media and nonlinear media can be implemented by connecting alternately two kinds of optical fibers of not only different dispersion value but also different nonlinearity coefficient. Such a transmission path is referred to as CPF (Comb-like profiled fiber) here. The conceptual view of this CPF is shown in FIG. 12. In recent years, a highly-nonlinear fiber (HNLF) is realized that has nonlinearity coefficient larger by twice or more than that of the conventional fiber. With this fiber, in addition to the nonlinearity coefficient, dispersion can be controlled like a dispersion-shifter fiber (DSF) so that HNLFs with various dispersion values are implemented. When such a HNLF is used, it is easy to manufacture a CPF. Needless to say, a fiber other tha HNLF, for example a fiber of small nonlinearity coefficient, can be used to fabricate a CPF.

Conditions of an optical fiber used in this CPF are quantitatively shown by dispersion length $L_D$ and nonlinearity length $L_{NL}$. $L_D$ and $L_{NL}$ indicate fiber lengths of which phase rotation by dispersion effect and nonlinearity effect becomes 1 radian, which can be expressed by the following equation.

$$L_D = \frac{T_0^2}{\beta_2}, \quad L_{NL} = \frac{1}{\gamma P_0}$$ Equation (2)

where $L_D$ and $L_{NL}$ indicate fiber lengths of which phase rotation by dispersion effect and nonlinearity effect, respectively, becomes 1 radian. A CPF utilizes a fiber of $L_{NL} < L_D$ as a nonlinear medium and a fiber of $L_{NL}>L_D$ as a dispersion medium.

Next description is made about an effect of this CPF.

One great advantage of the CPF is to be able to control a local dispersion rate precisely. In general, in order to control a local dispersion value of a fiber, high-level fiber manufacturing technique is essential. On the other hand, a local dispersion rate of the CPF which has multiple pairs of a nonlinear medium and a dispersion medium is determined by dimension of its dispersion media, in other words, an average dispersion value of the pairs. For example, when the CPF is composed of a HNLF and an SMF, the local dispersion value of the CPF can be adjusted precisely by the SMF length, and therefore, control of the local dispersion value is extremely easy. This results in allowing accurate control of optical pulses. For example, a fiber of which a dispersion value decreases in the pulse propagating direction and a dispersion-increasing fiber can be easily realized by adjusting the length of the CPS. Further, even a fiber of which a dispersion value in the longitudinal direction is hard to be stabilized can be manufactured to be analogue to the fiber with a constant dispersion value by applying the CPF to the fiber.

In addition, the CPF has a great advantage of SBS suppression effect. Generally, in the case of fibers which have greatly different dispersion values and nonlinearity coefficients, Brillouin gain bands are greatly different. Hence, each fiber used in the CPF has a different Brillouin gain band and this decreases the SBS threshold value of the CPF more than a fiber of the same configuration of the SPF. Since in a CPF with a small SBS threshold, input power is not limited by the SBS phenomenon, an optical wave can be easily controlled. A method that takes advantage of this characteristic is a method of using a CPF as an SBS suppressor. When the CPF is used for broad spectrum, an operation power condition can be set higher.

In addition, an isolator can be inserted to suppress SBS. This is because insertion of an isolator contributes to decrease accumulated SBS stimulated backscattering light. Particularly, in a CPF with many fiber connecting points, it is easy to insert an isolator and the insertion position can be optimized easily. Generally, when SBS is suppressed in waveform shaping, an isolator is inserted before the spectrum is wide spread. The insertion position of the isolator is preferably set to have a distance from the input end less than the soliton period $Z_{soliton}$.

Figure 13:
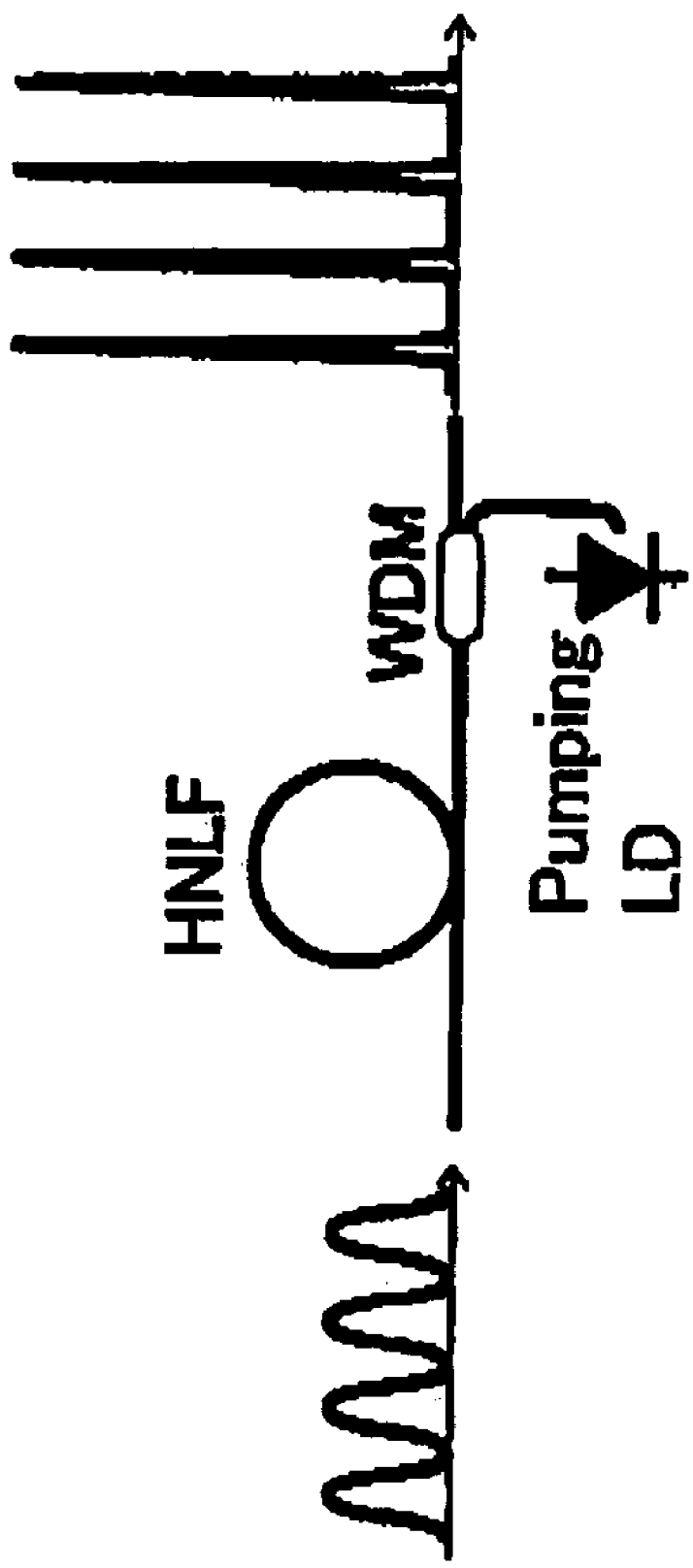
FIG. 13 is a view illustrating a configuration of a waveform shaper using a Raman amplifier in a HNLF.

FIG. 13 shows as another embodiment of the present invention a waveform shaper which utilizes a Raman amplifier using a HNLF. This waveform shaper includes the HNLF, which is a Raman gain medium, a pump LD and a WDM coupler for inputting pump light to the HNLF. This waveforms shaper is characterized by using as a fiber used for Raman gain the HNLF with a nonlinearity coefficient of 5 $W^{-1}km^{-1}$ or more. As the HNLF has a high nonlinearity coefficient γ, input soliton light can be utilized to perform Raman amplification with a short fiber effectively. Since Raman amplification is one nonlinearity optical effect, the larger the nonlinearity coefficient γ is, the more the amplification efficiency per unit fiber length is enhanced. Accordingly, as the required fiber length can be set shorter, the Raman amplification fiber can be set extremely shorter, for example, 2 km in length. This is a significant advantage in terms of downsizing of the waveform shaper and used of a HNLF can realize a downsized waveform shaper. Specifically, the Raman gain fiber can be shortened to be one tenth as long as the conventional waveform shaper.

Figure 14:
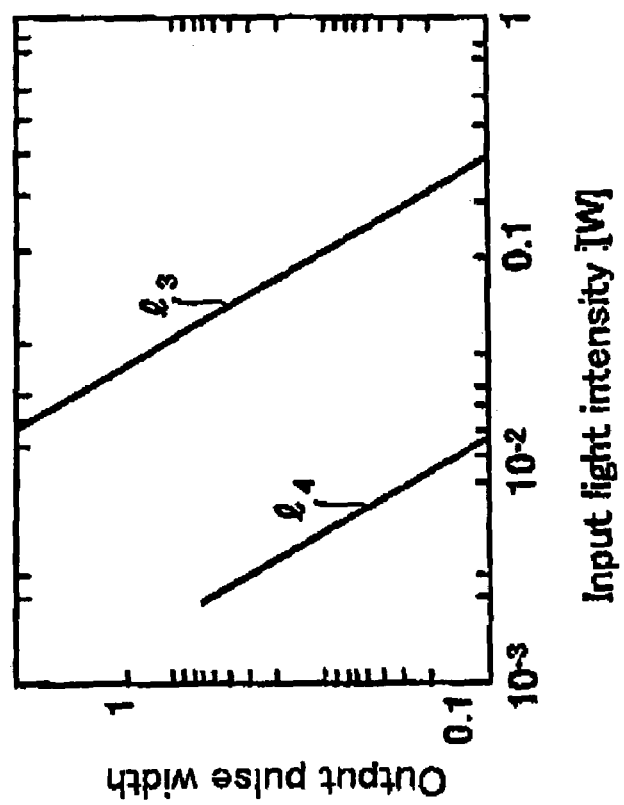
FIG. 14 is a graph showing dependence of intensity of input light required for basic soliton pumping on an absolute value of second-order dispersion value $\beta_2$.

In further, in the waveform shaper according to the present invention, it is possible to, in an absolute value of a predetermined second-order dispersion value $\beta_2$, reduce the intensity of input light more than that of the conventional waveform shaper. FIG. 14 is a graph showing the dependence of the intensity of input light required for basis soliton pumping with respect to the second-order dispersion value $\beta_2$. In FIG. 14 the curve line $l_1$ is of a conventional optical pulse compressor while the curve line $l_2$ is of the present invention. As is clear from FIG. 14, for example, where $|\beta_2|=1$ $ps^2/km$, conventionally, the input light has to be 150 mW in intensity, however, in the present invention, input light of optical intensity of around 20 mW is enough for pulse compression to be performed. When a semiconductor laser device is used as light source, low injection current is sufficient to realize 20 mW output and therefore, an optical pulse generator according to the present invention can do away with an optical amplifier and can be a low-power-consumption optical pulse generator.

In addition, when a HNLF is used in a Raman amplification fiber, as the HNLF has a high nonlinearity coefficient γ, the fiber can have a larger second-order dispersion value $\beta_2$ than a fiber of the conventional optical pulse compressor. As described above, soliton light to be input preferably meets a basic soliton condition, or specifically, N=1 in the equation 1. When the nonlinearity coefficient γ is small, soliton light to be input of high intensity is required to have a larger second-order dispersion value $\beta_2$. Therefore, it is necessary to reduce second-order dispersion value $\beta_2$. As the nonlinearity coefficient γ of the Raman amplification fiber of the present invention is high, if the second-order dispersion value $\beta_2$ is correspondingly set to be high, it is not necessary to increase the intensity of soliton light to be input, thereby allowing highly efficiency pulse compression by input light of low intensity.

Advantages in increasing a second-order dispersion value $\beta_2$ as mentioned above are described below. Compression of pulse width by adiabatic soliton compression is fundamentally in accordance with the aforementioned equation (1). However, compression of pulse width is actually limited by a higher-order dispersion value. Specifically, when a third-order dispersion value $\beta_3$ and a fourth-order dispersion value $\beta_4$ are larger than the second-order dispersion value $\beta_2$ by respective predetermined values, it becomes difficult to perform pulse width compression of the soliton light with efficiency. Since in the present invention a Raman gain fiber with a higher second-order dispersion value $\beta_2$ is used and higher-order dispersion values are decreased, it is possible to eliminate the influence of the higher-order dispersion values relatively. Further, it is possible to set the third-order dispersion value $\beta_3$ of the HNLF lower than the conventional one. For example, the third-order dispersion value $\beta_3$ of the HNLF can be set one-third of the conventional one, that is, only 0.03 $ps^3/km$. This allows the pulse width of output light to be compressed into smaller value.

Figure 15:
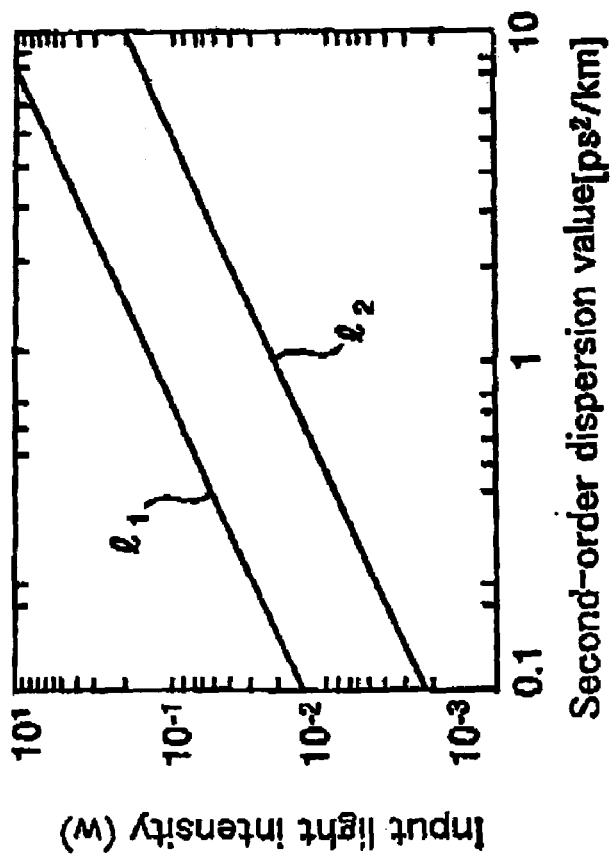
FIG. 15 is a graph showing dependence between a limit of output light pulse width and intensity of input light.

FIG. 15 is a graph showing a relationship between the intensity of light input to the Raman amplifier and the compression pulse width. In FIG. 15, the curve line $l_3$ is a curve line of the present invention and the curve line $l_4$ is of a waveform shaper using a conventional DSF for comparison. As is clear from the comparison between the curve lines $l_3$ and $l_4$, the present invention enables pulse compression into narrower width with the same input light intensity. Specifically, with respect to the intensity of 10 mW, when the conventional DSF is used, compression is difficult in only a few ps, while in the waveform shaper of the present invention, pulse compression is possible into the order of 200 fs.

In addition, when compression is performed into the pulse width of 100 fs, the conventional art requires the input light intensity of the order of 250 mW while the Raman amplification waveform shaper of the present invention requires only 46 mW for the nonlinearity coefficient $\gamma=15$ $W^{-1}km^{-1}$ and third-order dispersion value $\beta_3=0.1$ $ps^3/km$ and 15 mW for the nonlinearity coefficient $\gamma=15$ $W^{-1}km^{-1}$ and third-order dispersion value $\beta_3=0.03$ $ps^3/km$. Further, in the case of $\gamma=15$ $W^{-1}km^{-1}$ and $\beta_3=0.03$ $ps^3/km$, 100 fs pulse width can be obtained even with the intensity of 8.3 mW.

Here, if an HNFL is used in the Raman amplification fiber, higher-order dispersion values can be lower values than those of the conventional DSF. For example, the third-order dispersion value $\beta_3$ is generally the order of 0.1 $ps^2/km$ for the DSF while the third-order dispersion value $\beta_3$ can be reduced into 0.03 $ps^2/km$ for the HNLF. Since the third-order dispersion value and higher-order dispersion values can be reduced, in the HNLF, the second-order dispersion value can be relatively higher with respect to the higher-order dispersion values. For example, when the third-order dispersion value of the Raman amplification fiber is 0.03 $ps^2/km$, the second-order dispersion value required for pulse width compression into 100 fs is 2 $ps^2/km$ for the conventional DSF, however, in the HNLF, only 0.6 $ps^2/km$ is enough for pulse width compression into 100 fs.

Specific examples are described below.

EXAMPLE 1

Figure 16:
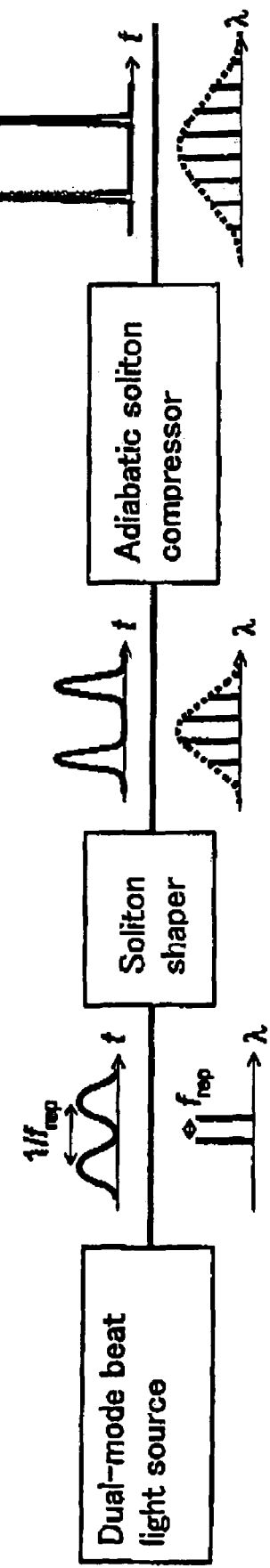
FIG. 16 is a view illustrating a pulse train generator using a waveform shaper which utilizes a Raman amplifier in a HNLF and a CPF.

With use of a waveform shaper using a Raman amplifier in a CPF or a HNLF according to the present invention, it becomes possible to realize high-performance pulse train generator. The embodiment of this device is shown in FIG. 16. The device is composed of combination including a beat light generating portion, soliton converter and adiabatic soliton compressor. The light beat generating portion is a device for generating a sine wave signal. The beat light is then input to the soliton converter and subjected to soliton conversion. After soliton conversion, the light is input to the adiabatic soliton compressor and subjected low-noise pulse compression. Since the soliton converter and the soliton compressor are separately provided, optical transmission designs can be applied to the respective portions. This enables soliton compression of high quality and high efficiency. This soliton converter and the adiabatic soliton compressor may be provided with the aforementioned CPF or Raman amplifier, or with another fiber.

EXAMPLE 2

Figure 17:
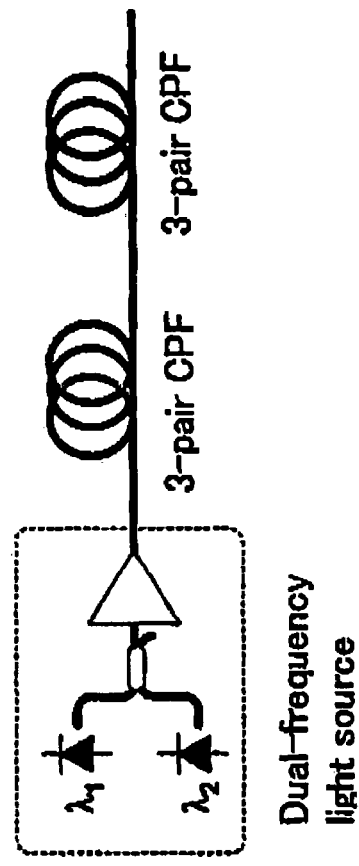
FIG. 17 is a view illustrating a configuration of an optical pulse train generator using a CPF.

An optical pulse train generator using a CPF waveform shaper is shown in FIG. 17. This is an embodiment of the light source shown in FIG. 16, including a beat light generating portion composed of two CW-LDs, a soliton converter and a CPF soliton compressor. CW outputs from the two CW-LDs are combined to obtain beat light with a repetition frequency corresponding to the wavelength difference. In the first CPF, this beat light is converted into a soliton which is an optimal waveform for pulse compression and in the next CPF, the light is compressed. By use of the CPF soliton converter, beat light is not directly compressed but is converted into appropriate soliton before being compressed thereby making it possible to realize an ideal adiabatic soliton compression process.

The CPF includes three pairs of HNLF and SMF for each of soliton conversion and soliton compression. The nonlinearity coefficient of the HNLF is 24 l/W/km and its dispersion value is −0.8 ps/nm/km. Here, it should be note that dispersion of the HNLF is negative normal dispersion. Use of the normal dispersion HNLF allows prevention of modulation instability (MI) gain in the HNLF from occurring. Since interaction between noise and optical pulses is enhanced by the MI gain, suppression of MI gain occurrence is important for generation of low-noise pulse trains.

The CPF dispersion value D profile and CPF nonlinearity coefficient $\gamma$ profile are shown in FIGS. 18(b) and (c). The broken line in FIG. 18(b) is an average dispersion value. First three pairs of the CPF correspond to a soliton converter (shaper) and last three pairs correspond to a soliton compressor. As low-dispersion HNLF and SMF are used in the CPF, both of the dispersion value and the nonlinearity coefficient are like comb, and a transmission line including alternately arranged nonlinear media and dispersion media is realized. It is noted that the dispersion profile is designed in such a manner that average dispersion values of first three pairs increase and those of last three pairs decrease. Since in the CPF the dispersion value of each pair gives an indication of a local dispersion value, this CPF is equivalent to a combination of a dispersion-increasing fiber and a dispersion-decreasing fiber shown in FIG. 18(a). The CPF corresponding to this dispersion-increasing fiber is a soliton converter, where effective conversion from beat light to soliton can be realized. Adiabatic soliton compression process is realized in the CPF corresponding to the dispersion-decreasing fiber. The lengths of CPF fibers and pair dispersion values $D_{ave}$ are listed in Table 4 below.

TABLE 4

|  | $D_{ave}$ [ps/nm/km] | HNLF length [m] | SMF length [m] |
|---|---|---|---|
| 1st pair | 3.5 | 40 | 10 |
| 2nd pair | 5.8 | 40 | 20 |
| 3rd pair | 7.5 | 40 | 30 |
| 4th pair | 3.5 | 100 | 25 |
| 5th pair | 1.6 | 100 | 10 |
| 6th pair | 0.8 | 100 | 5 |

In addition, an isolator is inserted between each of first and second pairs and fourth and fifth pairs. This allows SBS suppression in the CPF. Needless to say, the CPF with no isolator inserted also has an SBS suppression effect, however in order to enhance the SBS suppression effect two isolators are inserted. Depending on purposes, the number of isolators can be increased or decreased.

Figure 19B:
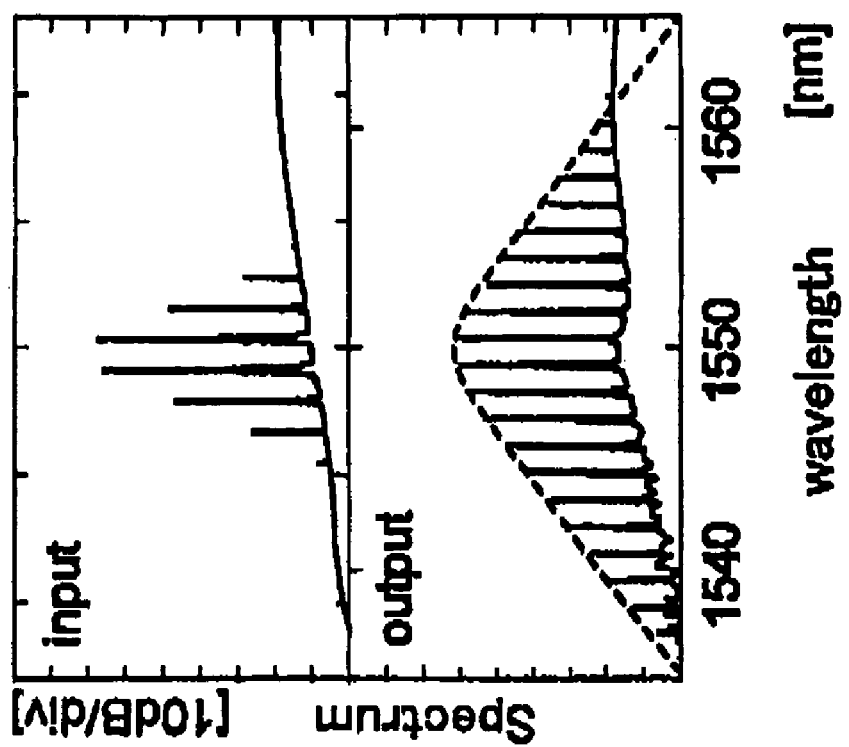
FIG. 19B is a graph showing a spectral profile.
Figure 19A:
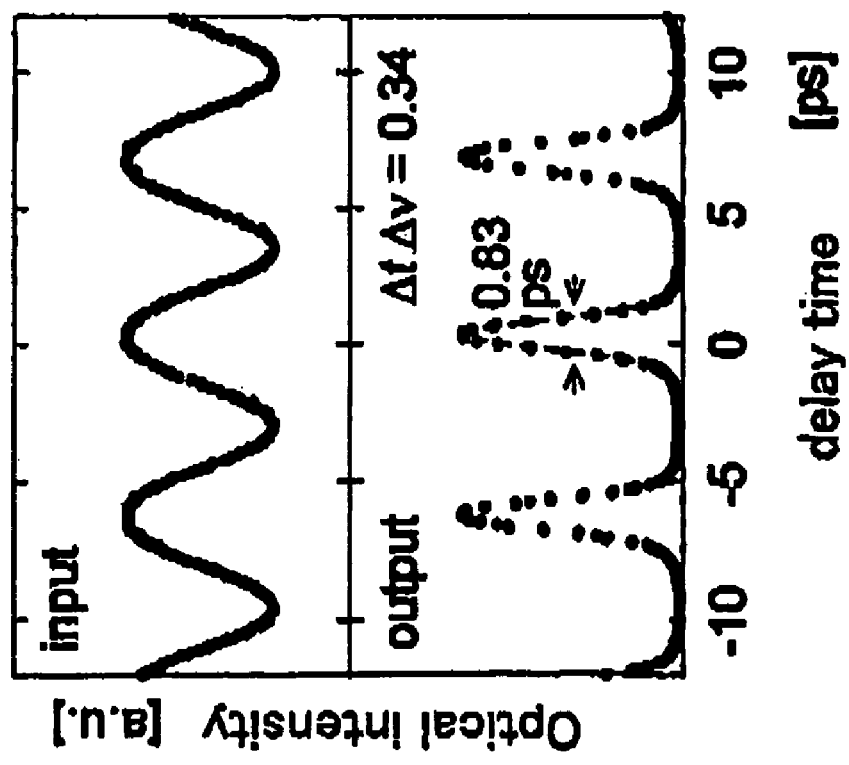
FIG. 19A is a graph showing autocorrelation traces of input/output pulses.

Results of soliton conversion and compression by CPF, that is, the inputting/outputting pulse waveforms indicating the performance of the optical pulse train generator according to the present invention are shown in FIGS. 19A and 19B. FIG. 19A shows autocorrelation traces of the inputting/outputting in which the vertical axis indicates the optical intensity in the unit of a.u. and the horizontal axis indicates delay in the unit of dB/div. FIG. 19B shows an optical spectrum where the vertical axis indicates a spectrum in the unit of dB/div and the horizontal axis indicates a wavelength in the unit of mn. Further, a result of fitting of the pulse waveform into $sech^2$ is shown by a broken line. Here, it is noted that experimental results and the broken line are matched in the both of the autocorrelation traces and optical spectrum. Further, as the spectrum width of the CPF inputting/outputting pulse spectrum is not greatly changed, noise amplification in the soliton compression step is proved to be less. The time width calculated from the autocorrelation fitting is 830 fs. At this time, a product of time and bandwidth $\Delta t \Delta v$ is calculated to be 0.34 which shows that Fourier transform limit pulses are obtained. This result shows that an optical pulse obtained by the optical pulse train generator is soliton of ultra high purity.

EXAMPLE 3

Figure 20:
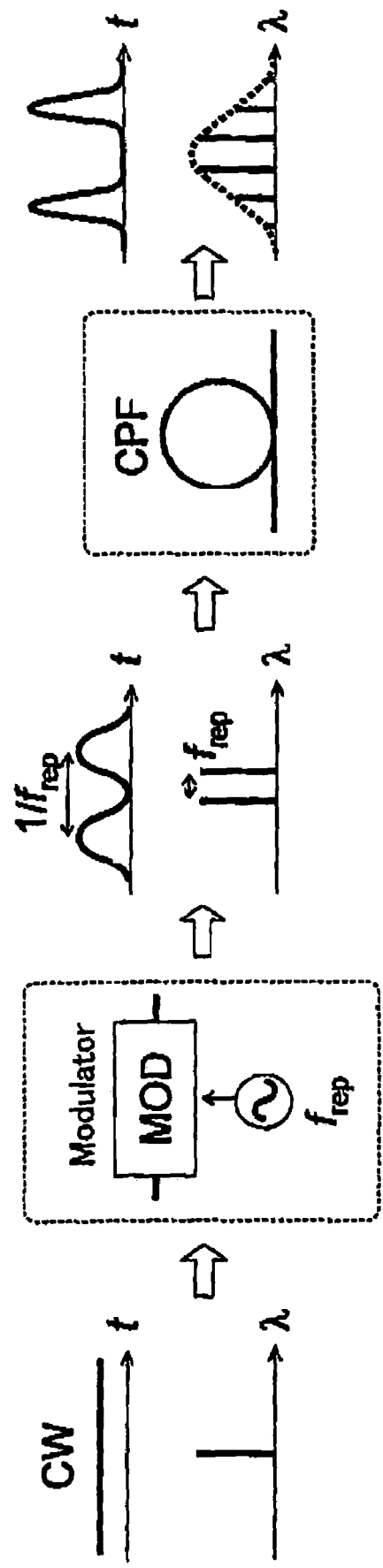
FIG. 20 is a view illustrating an optical pulse train generator including a seed pulse generating portion for generating beat light or seed pulses from CW light by using an optical modulator and a pulse waveform shaper for shortening time width.

Another embodiment of the present invention is a light source with a configuration shown in FIG. 20. This light source is an optical pulse train generator including a seed pulse generating portion for generating beat light or seed pulses from CW light by using an optical modulator; and a pulse waveform shaper for shortening time width.

A seed pulse is generated by a high-speed optical modulator, for example, a $LiNbO_3$ optical modulator (LNM) or an electroabsorption semiconductor optical modulator. The high-speed optical modulator, for example, a $LiNbO_3$ optical modulator (LNM) or an electroabsorption semiconductor optical modulator is driven by an external electric signal to easily generate an optical signal in synchronization with the electric signal. When an electric pulse signal is used as an electric signal, an optical pulse like the electric pulse signal is obtained. Needless to say, pulse repetition frequency or pulse time width are limited by a band of an electronic circuit and presently stay at about 40 GHz, >10 ps.

Figure 21:
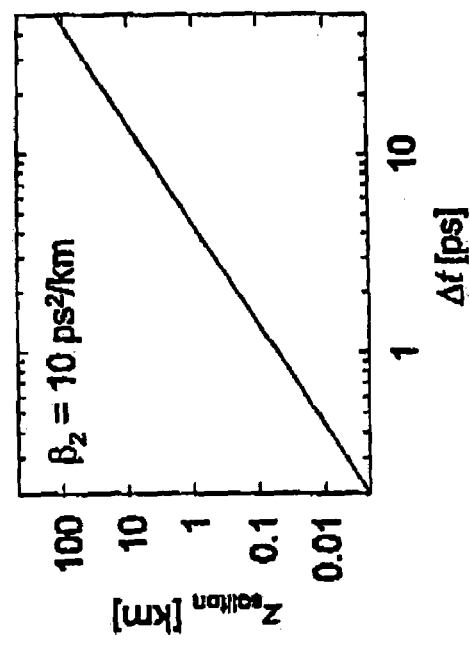
FIG. 21 is a graph showing a relationship between a soliton length and an input pulse width.

In the present light source, the time width of a seed pulse is shortened by the pulse waveform shaper. A problem presented when a seed pulse generated by an optical modulator is subjected to nonlinearity fiber pulse compression is a fiber length. The pulse time width obtained by the optical modulator is only 10 ps. Compression of relatively wide optical pulse needs a compression fiber of tens of kilometers or more. This is because a long fiber is needed in order to have a group dispersion effect on optical pulses of spectral band of 40 GHz. Generally, in the case of a compressor which utilizes basic soliton characteristics, a parameter for determining the fiber length is soliton length $Z_{soliton}$. Relationship between this value and input pulse width $\Delta t$ is shown in FIG. 21. Here, the fiber dispersion value is calculated with 10 $ps^2$/km. When $\Delta t$ increases, $Z_{soliton}$ is increased in proportion to a square of $\Delta t$. For example, $Z_{soliton}$ is 10 km for 20 ps pulse compression. In consideration of the adiabatic soliton compression stage in which the compression rate in a fiber of $Z_{soliton}$ is 2 or 3, a fiber of at least 20 km is required for compression of 20 ps pulse into a few ps. Since loss increases in such a long fiber, it becomes difficult to realize ideal compression.

On the other hand, as shown in the example 1, in a CPF which has improved CDPF performance by optimizing an average dispersion value of the pairs and using a HNLF, both of shortening of compression fiber and quality maintaining of compression pulse are realized. This CPF is a fiber designed for 160 GHz beat. This CPF is not applicable to 40 GHz beat or >10 ps optical pulse as it is, however, optimization to input light is possible. In general, compression fiber length is in inverse proportion to a square of repetition frequency. In the case of CPF, a dispersion fiber, or specifically, a SMF, is only lengthened. Accordingly, for CPF compression, the compression fiber length possibly becomes the order of several kilometers for >10 ps pulse or 40 GHz beat light. Actually, the CDPF fiber length for 40 GHz beat light, that is 12.5 ps, shown in this example is only 1.8 km.

Figure 22A:
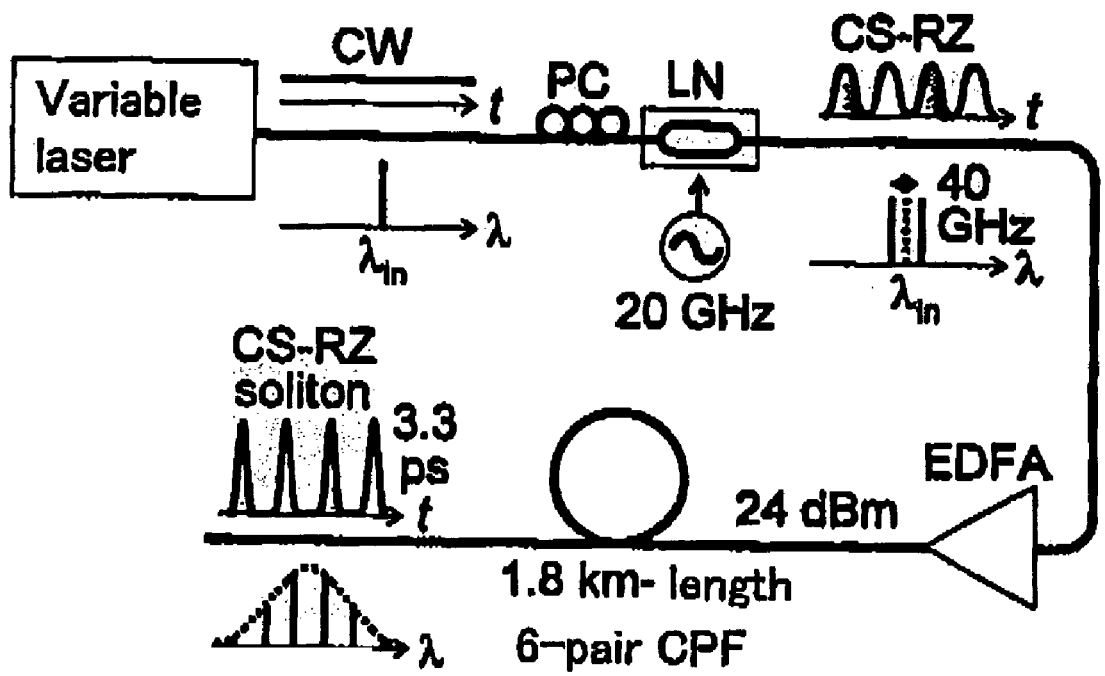
FIG. 22A is a view illustrating a configuration of a light source for generating 40 GHz pulse trains.
Figure 22B:
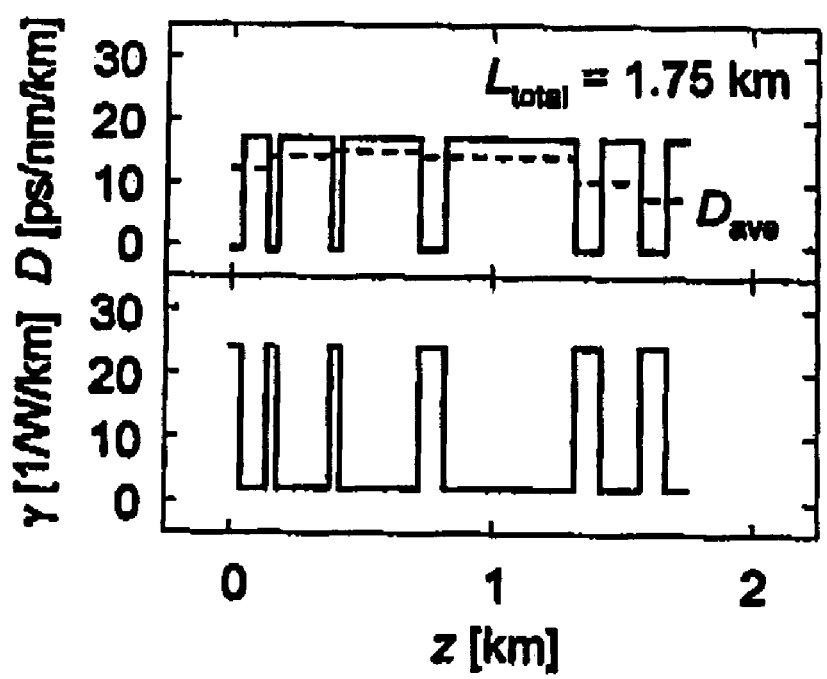
FIG. 22B is a graph showing profiles of CDPF dispersion value and nonlinearity coefficient.
Figure 23A:
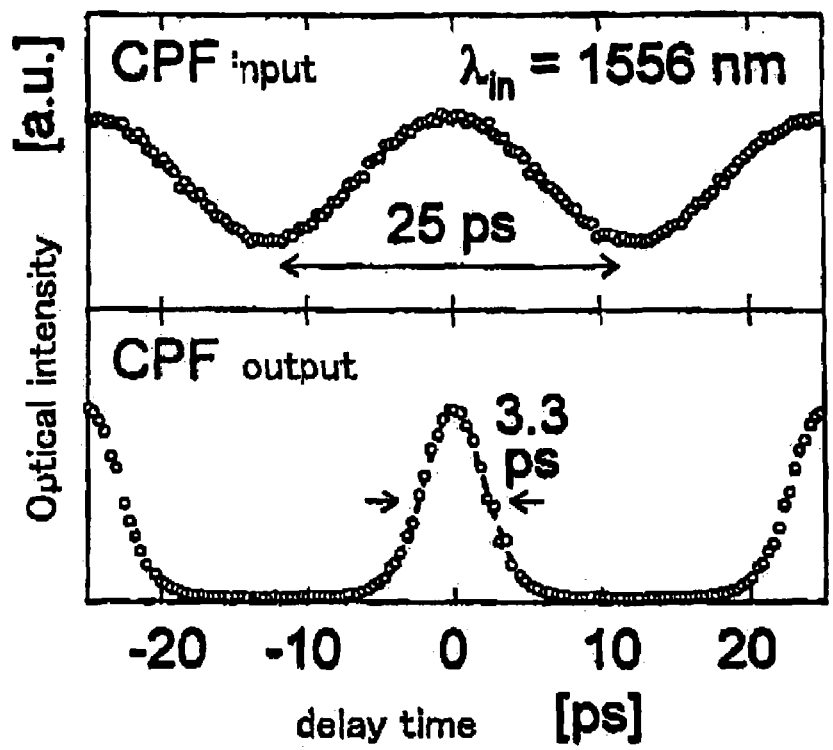
FIG. 23A is a graph showing autocorrelation traces of CPF input/output pulse trains.
Figure 23B:
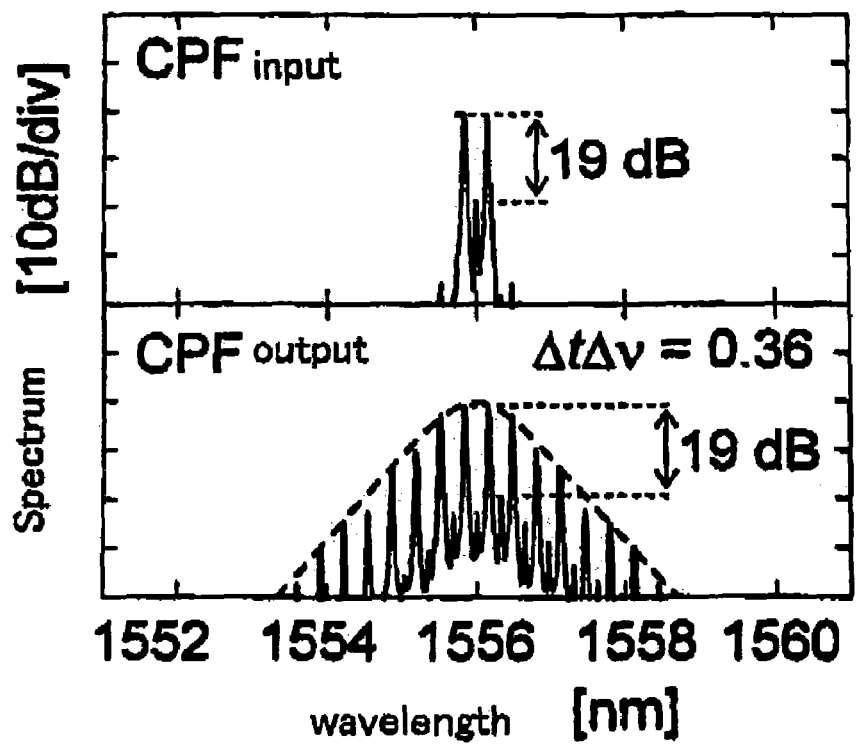
FIG. 23B is a graph showing spectral profiles of CPF input/output pulse trains.

An embodiment of the present invention is shown in FIG. 22A. Tunable laser output CW light (wavelength $\lambda_{in}$) is subjected to carrier suppression modulation by multielectrode LNM, which is driven by 20 GHz RF signal, to obtain beat light of 40 GHz. When an operating point of the LNM is optimized it becomes possible to generate a pulse train with a frequency which is twice larger than that of the driving RF signal. This system is called a carrier suppression modulating system. This 40 GHz beat light is amplified to 24 dBm by an EDFA and input to the CPF. Autocorrelation and optical spectrum of the 40 GHz beat light input to the CPF are shown in FIGS. 23A and 23B. A wavelength resolution of an optical spectrum analyzer is 0.01 nm. The carrier suppression ratio (CSR) of the beat light is the order of 19 dB. The CPF used here is composed of 6 pairs of a HNLF and a SMF. The dispersion value and the nonlinearity coefficient of the HNLF are −0.7 ps/nm/km and 24 1/W/k, respectively. Profiles of CDPF dispersion and nonlinearity coefficient is shown in FIG. 22B. The broken line shows an average dispersion value of the pairs. As is the case of the example 1, the average dispersion values of the first three pairs are increased and average dispersion values of the last three pairs are decreased. It should be note that with such optimization of the dispersion profile, the compression fiber is allowed to be shortened to 1.8 km even in the system based on the adiabatic soliton compression. The length of each fiber of the CPF is listed in Table 5.

TABLE 5

Fiber length of each pair of CPF

|  | length of HNLF | length of SMF |
|---|---|---|
| 1st pair | 50 m | 100 m |
| 2nd pair | 50 m | 200 m |
| 3rd pair | 50 m | 300 m |
| 4th pair | 100 m | 500 m |
| 5th pair | 100 m | 150 m |
| 6th pair | 100 m | 80 m |

Figure 24:
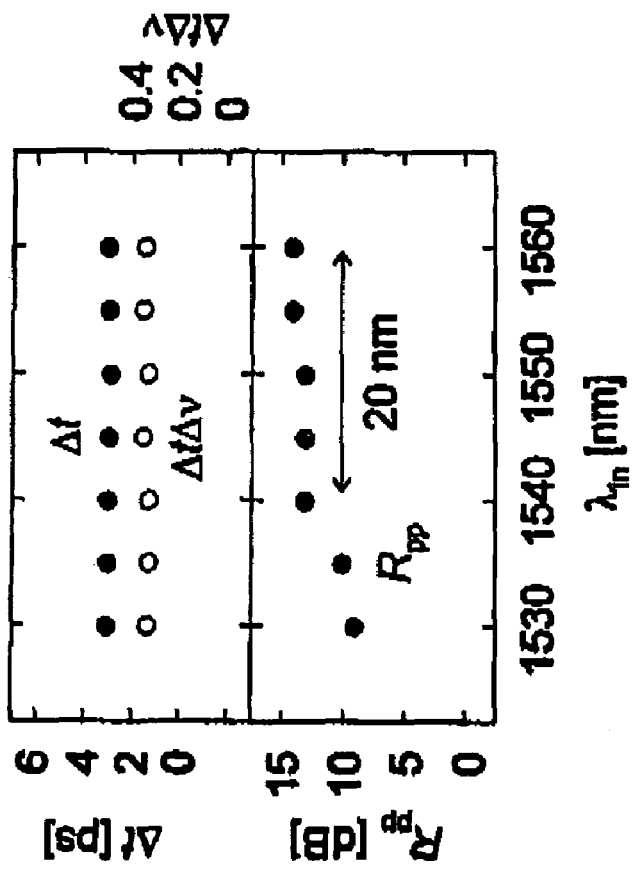
FIG. 24 is a graph showing dependence on input waveform of time width of CPF output pulse and peal pedestal ratio.

FIG. 24 shows $\lambda_{in}$ dependence of $\Delta t$ and $\Delta t \Delta v$ of the CPF output pulse and $R_{pp}$. $\Delta t$ and $\Delta t \Delta v$ are almost constant in the measured range of from 1530 nm to 1560 nm. $R_{pp}$ is kept >13 dB in the range of from 1530 nm to 1560 nm. However, increase in a pedestal amount is shown in the short wavelength range. This is because SMF dispersion is insufficient in the short wavelength range, in other words, SMF has a positive dispersion slope. From the above-described measurement results, this compressor has an operational band of from 1540 to 1560 nm. Here, it is also noted that there is possibility that the compressor can cover >1560 nm band which is out of the measured range.

Figure 25:
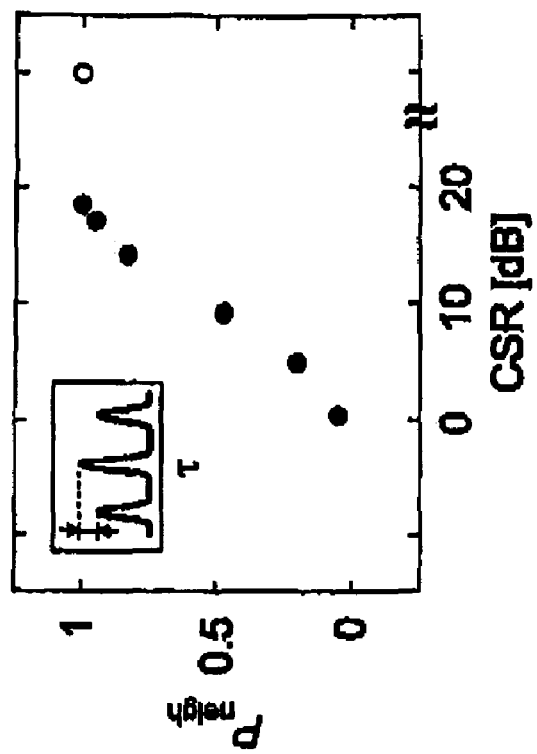
FIG. 25 is a graph showing dependence on CSR of input beat of neighbor pulse peak value on autocorrelation traces.

For tone light of low CSR, a pulse train of 20 GHz can be amplified through pulse compression. In order to clarify an acceptable CSR of this compressor, the CSR dependence of a peak value $P_{neigh}$ of adjacent pulses on the autocorrelation is shown in FIG. 25. For comparison, the experimental result of dual-frequency CW beat light is plotted by white dots. As the CSR decreases, the $P_{neigh}$ decrease and the 20 GHz pulse component is grown. For $P_{neigh}$ >0.9 m the CSR is need to be 17 dB or more. This value is such as easily can be obtained by using the multielectrode LNM.

EXAMPLE 4

Figure 26A:
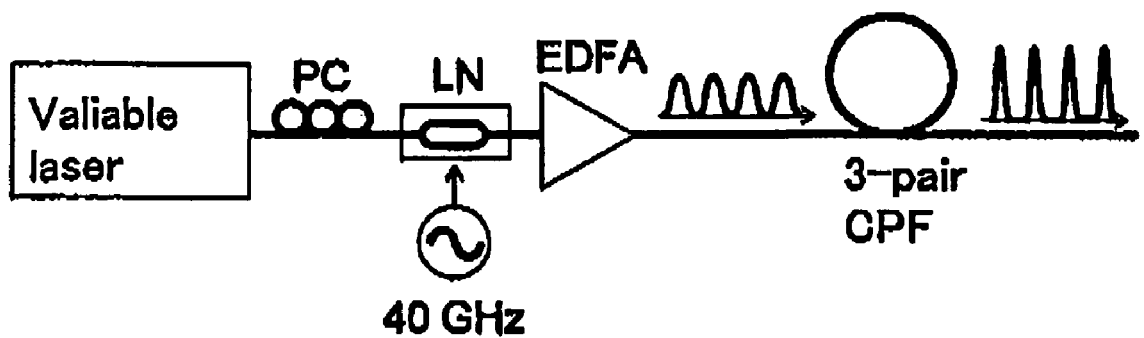
FIG. 26A is a view illustrating a configuration of 40 GHz pulse train light source.

Here is described as another embodiment of the present invention an example of compressing a seed pulse not beat light by a CPF. A configuration view thereof is shown in FIG. 26A. The present invention includes a CW laser, an optical modulator and a CPF. CW light is input to the optical modulator to generate an optical pulse. Here, the high-speed LNM is used and driven by 40 GHz sine wave electric signal. However, due to the LNM nonlinear input and output characteristic an optical output becomes pulses with time width narrower than that of the sine wave. The autocorrelation and optical spectrum are shown in the upper parts of FIGS. 27A and 27B. On the spectrum, there occurs a comb component and pulse time width calculated from the autocorrelation is 8 ps.

Figure 26B:
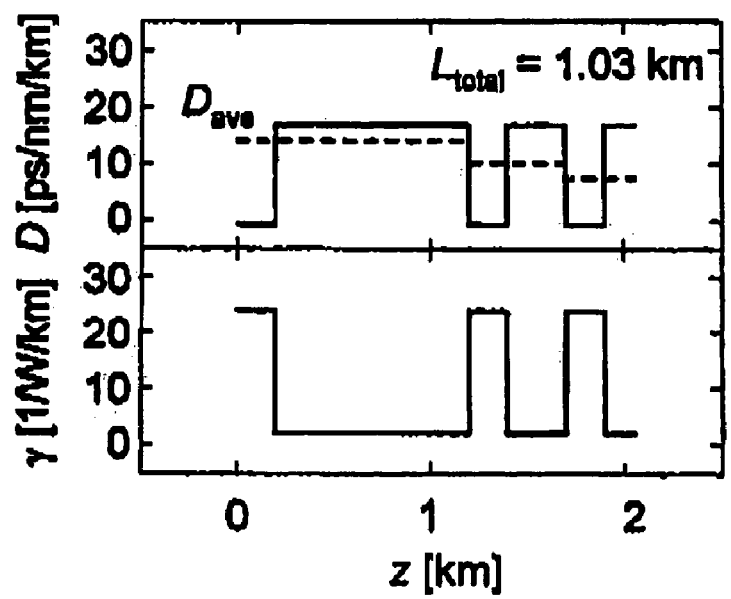
FIG. 26B is a graph showing profiles of CDPF dispersion value and nonlinearity coefficient.

This optical pulse is amplified to 24 dBm by an EDFA and input to the CPF. In this example, last three pairs of CPFs of the example 2 are utilized. First three pairs of CPFs of the example 2 serve to convert beat light into a soliton train. On the other hand, in this configuration, soliton like optical pulses are already obtained from LNM output and therefore, first three pairs of CPFs are not necessary. Profiles o dispersion values D and the nonlinearity coefficients γ are shown in FIG. 26B of the pairs of CFPs. Each of the pairs is summarized in Table 6.

TABLE 6

| | CPF Fiber length | |
| --- | --- | --- |
| | length of HNLF | length of SMF |
| 1st pair | 100 m | 500 m |
| 2nd pair | 100 m | 150 m |
| 3rd pair | 100 m | 80 m |

Figure 27A:
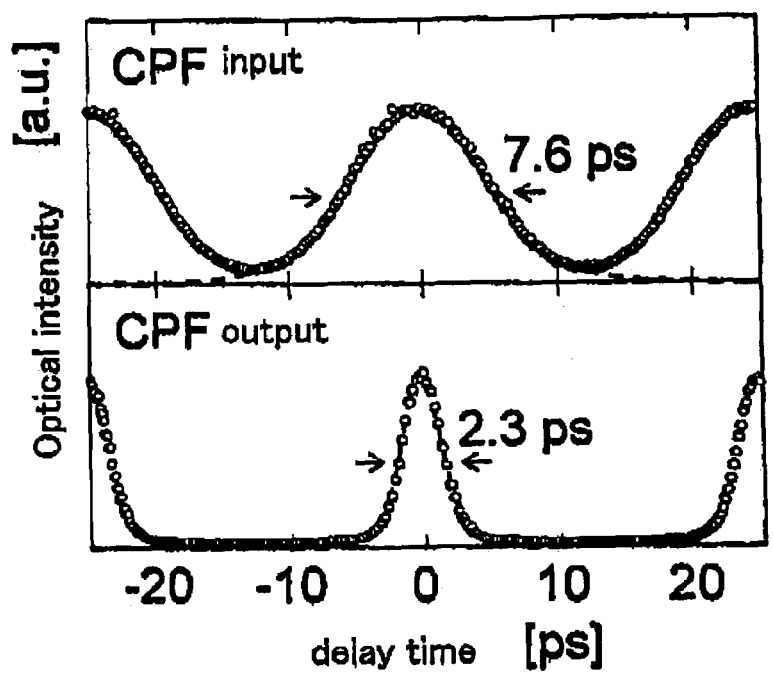
FIG. 27A is a graph showing autocorrelation traces of CPF input/output pulse trains.
Figure 27B:
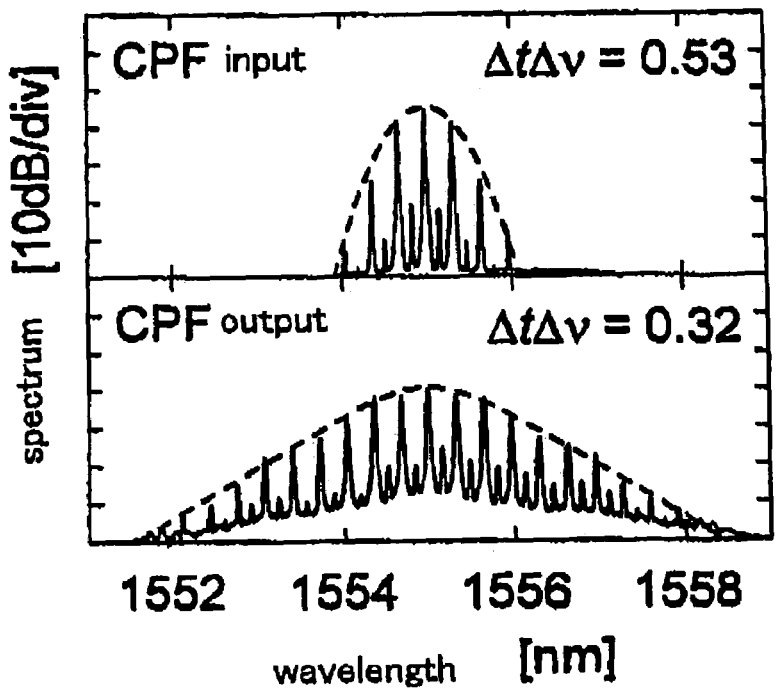
FIG. 27B is a graph showing spectral profiles of CPF input/output pulse trains.

Autocorrelation and an optical spectrum waveform of CDPF output pulses are shown in the lower parts of FIGS. 27A and 27B. They show that autocorrelation and optical spectrum are matched between experimental results and broken lines. The time width calculated from the autocorrelation is 2.3 ps. At the same time, ΔtΔv is 0.32, and Fourier conversion limited pulses.

Figure 28:
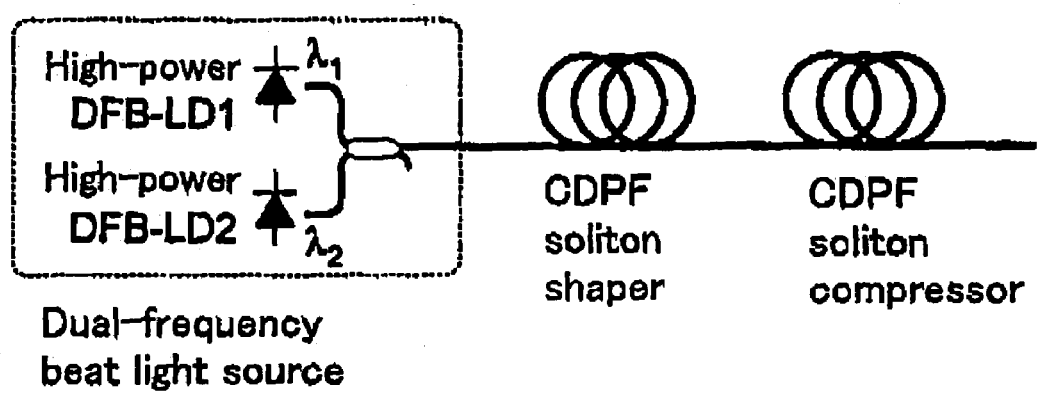
FIG. 28 is a view illustrating an example of an EDFA-free light source.

Among the light source components of FIG. 13, the device that adds most noise is an EDFA. In other words, in a system with no EDFA used, a soliton train of higher quality can be generated. Based on this idea an example of EDFA-free light source is shown in FIG. 28. CW light outputs from two LDs of high power output (>50 mW) are combined to be able to obtain beat light (>50 mW). Since this beat light has enough optical power for next-stage soliton conversion and compression, no optical amplifier is necessary. Accordingly, it is possible to generate noise-less soliton trains. Further, as an LD driving circuit used in tan EDFA can be omitted, the device has the advantage of being downsized.

EXAMPLE 5

Figure 18:
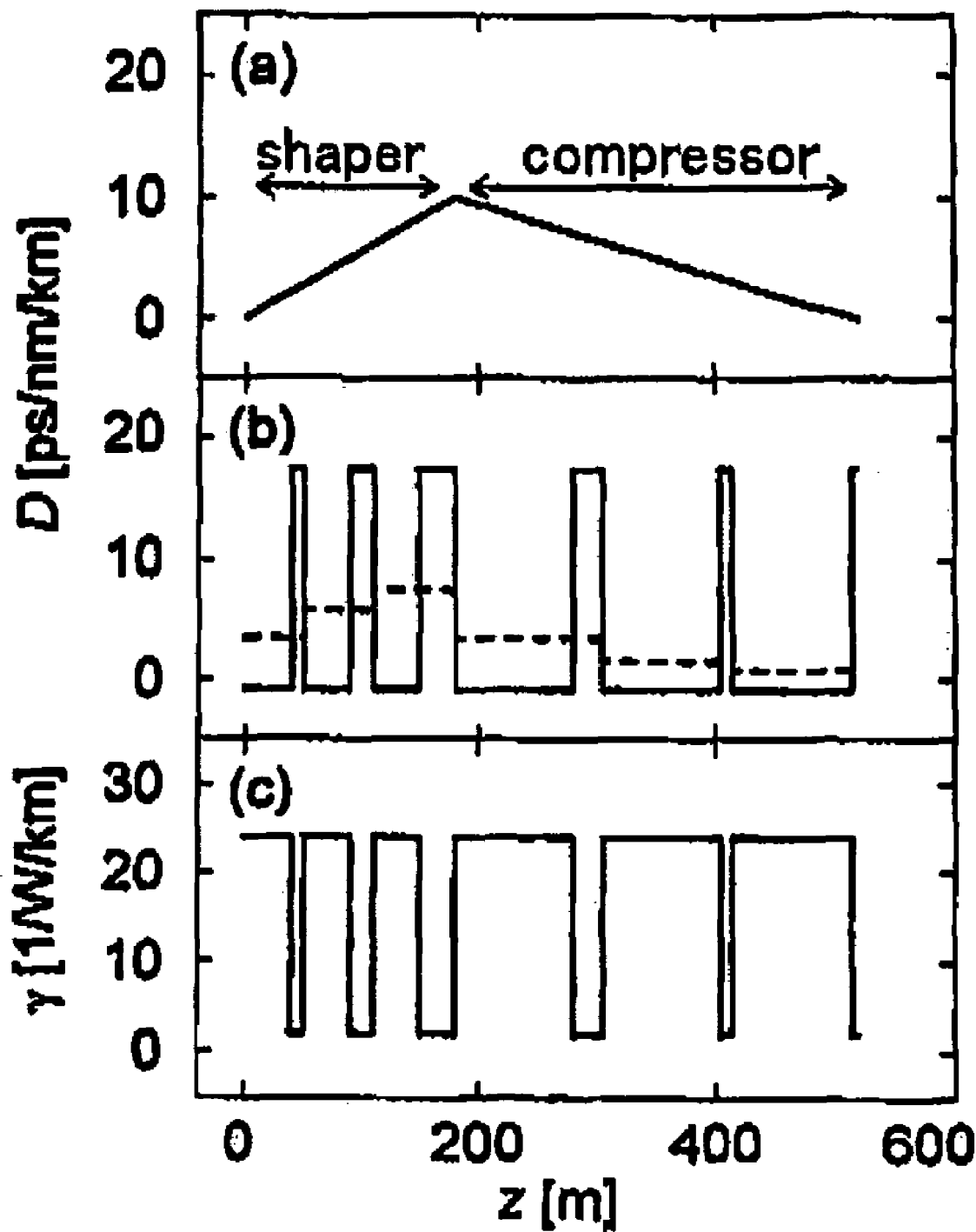
FIG. 18 is a view showing a fiber characteristic profile of shaping CDPF and a dispersion-decreasing soliton compressing CDPF.
Figure 29:
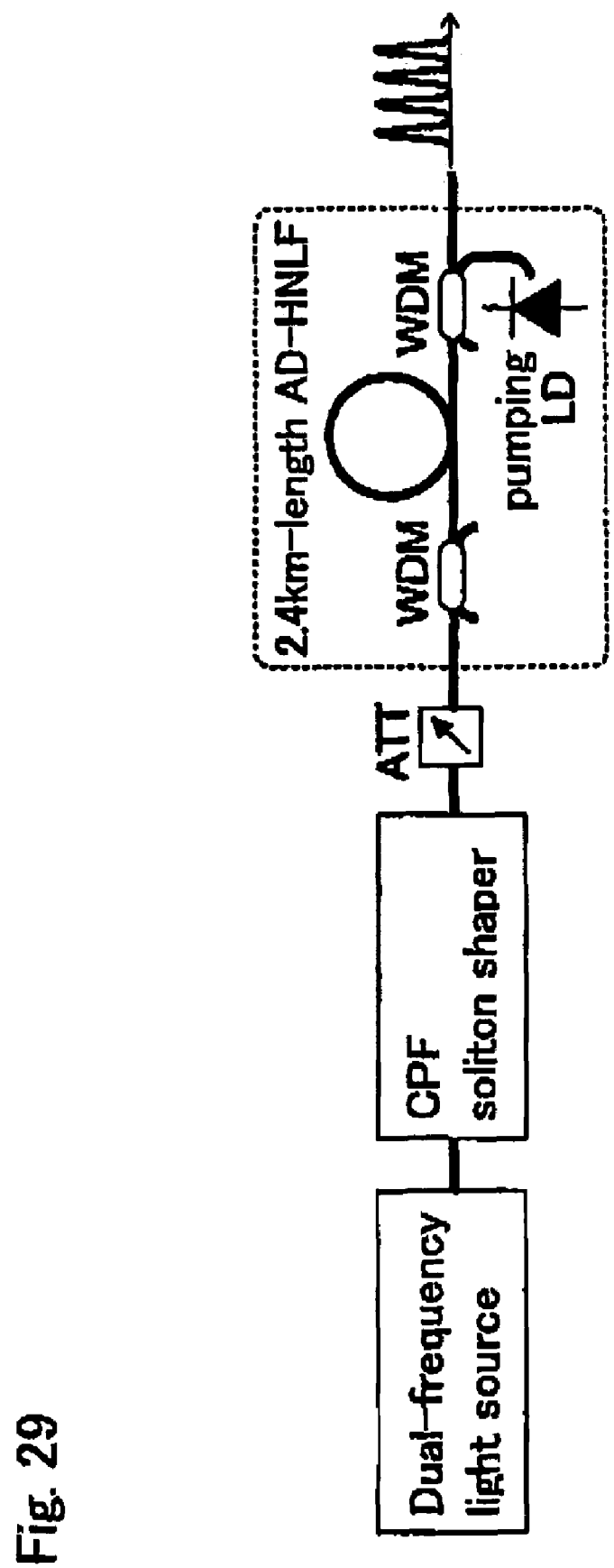
FIG. 29 is a view illustrating a pulse train generator using a waveform shaper which utilizes a Raman amplifier in a HNLF and a CPF.

Here described is an optical pulse train generator which uses a waveform shaper of soliton compression in Raman amplification (SCRA) in CPF and HNLF. The view of this configuration is FIG. 29. CW light outputs from two DFBLDs are combined by a coupler to obtain dual-frequency 100 GHz beat light, which is then input to a compression system of the CPF and SCRA. Here, it should be noted that the SPF is arranged before the SCRA in the SCRA fiber in order to suppress SBS. The CPF is composed of six pairs of HNLF and SMF, of which a dispersion profile is shown in FIG. 18. In addition, in order to enhance the SBS suppression effect, two low-loss optical isolators are inserted.

Figure 30:
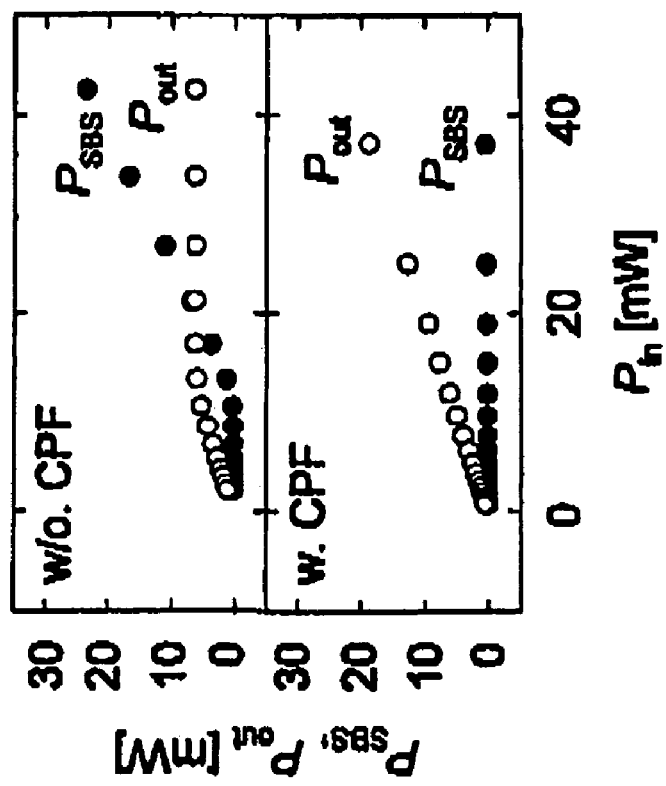
FIG. 30 is a graph showing dependence on SCRA input power of SBS optical power and SCRA output power with or without CPF.

When this CPF is used to perform soliton-conversion into pulses and the pulses are input to the SCRA, the SBS can be suppressed in the SCRA fiber. In order to confirm this effect, SCRA input power $P_{in}$ dependence of SBS optical power $P_{SBS}$, SCRA output power $P_{out}$ in both cases of with use of the CPF and without CPF is shown in FIG. 30. When no CPF is used (upper part of FIG. 30), an SBS threshold value is 15 mW only while, when the SPF is used (lower part of FIG. 30), the SBS threshold value is increased to 40 mW or more.

Then the soliton-converted pulses are compressed by the SCRA. This SCRA is composed of 2.4 km-long low-slope HNLF, counter-pumping LD (output power 0.8 W) and two WDM couplers. The nonlinearity coefficient, the dispersion value and the dispersion slope of the HNLF are 25 1/km/W, 1.0 ps/nm/km and 0.013 ps/nm²/km, respectively. It should be noted that use of the HNLF shortens the SCRA fiber into several kilo meters order. As compared with the conventional art which needs tens of kilo meters order, the length of the fiber is shortened by one tenth.7

Figure 31:
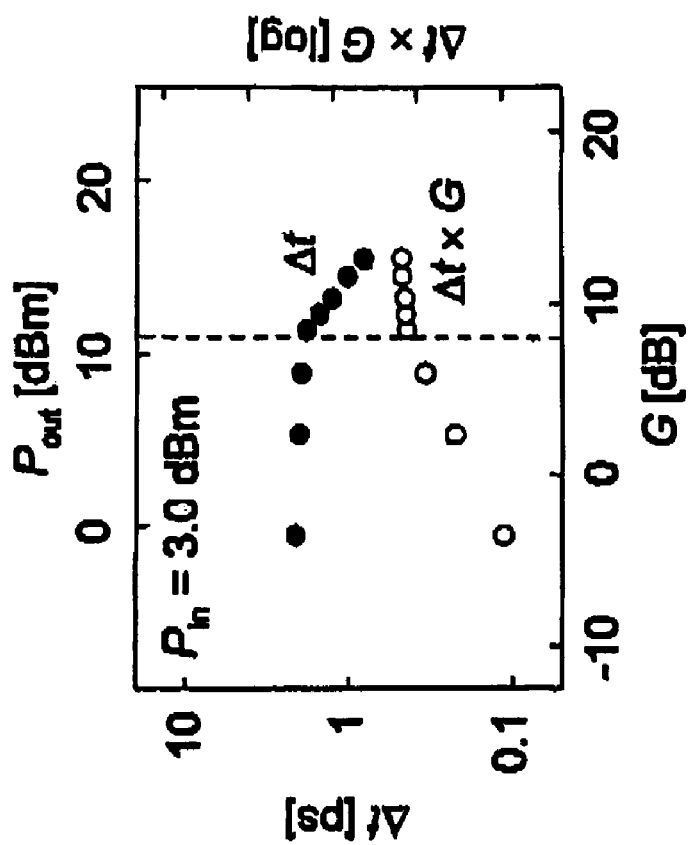
FIG. 31 is a graph showing dependence on Raman gain and output power of SCRA output pulse time width.

A pulse input to the SCRA receives Raman gains while it is propagating along the HNLF and is subjected to adiabatic soliton compression. Raman gain G and output power $P_{out}$ dependence of the SCRA output pulse time width Δt are plotted by black dots in FIG. 31. The broken line shows $P_{out}$ which is basic soliton pumping power. At the right side of the broken line, pulse compression is performed and increase in G causes reduction of Δt 2.1 ps to 840 fs. Further, in order to clarify the mechanism of this compression, Δt×G is plotted by white dots. As in an are where compression is performed, Δt×G becomes constant, it has been proved that the present system is based on adiabatic soliton compression.

Figure 32B:
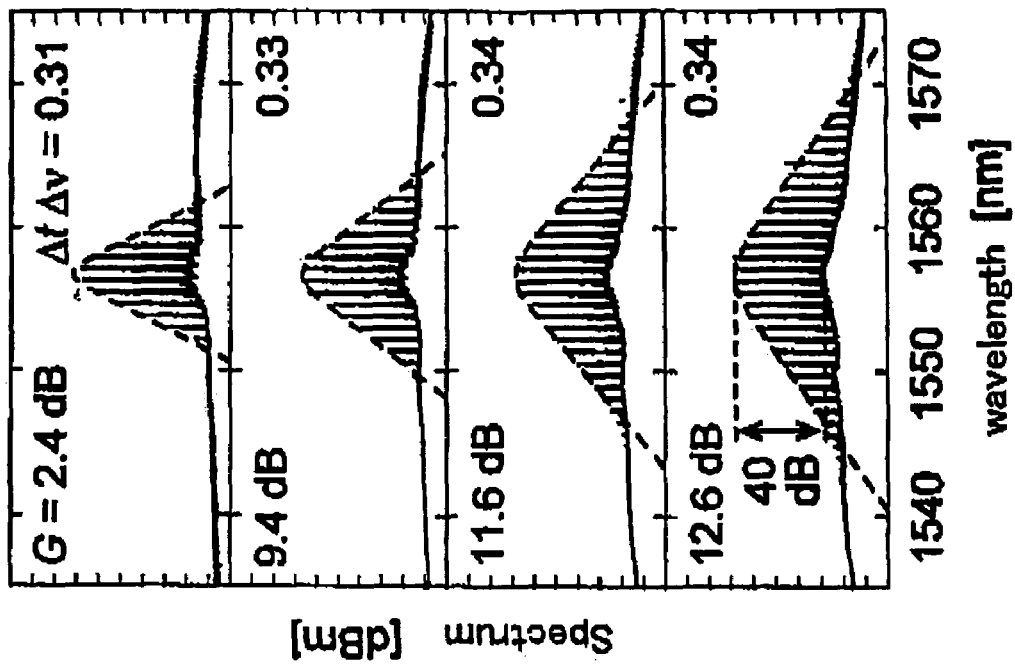
FIGS. 32A and 32B are views illustrating autocorrelation traces and spectral profiles, respectively, of RA output pulse trains with gains of 2.4, 9.4, 11.6 and 12.6 dB.
Figure 32A:
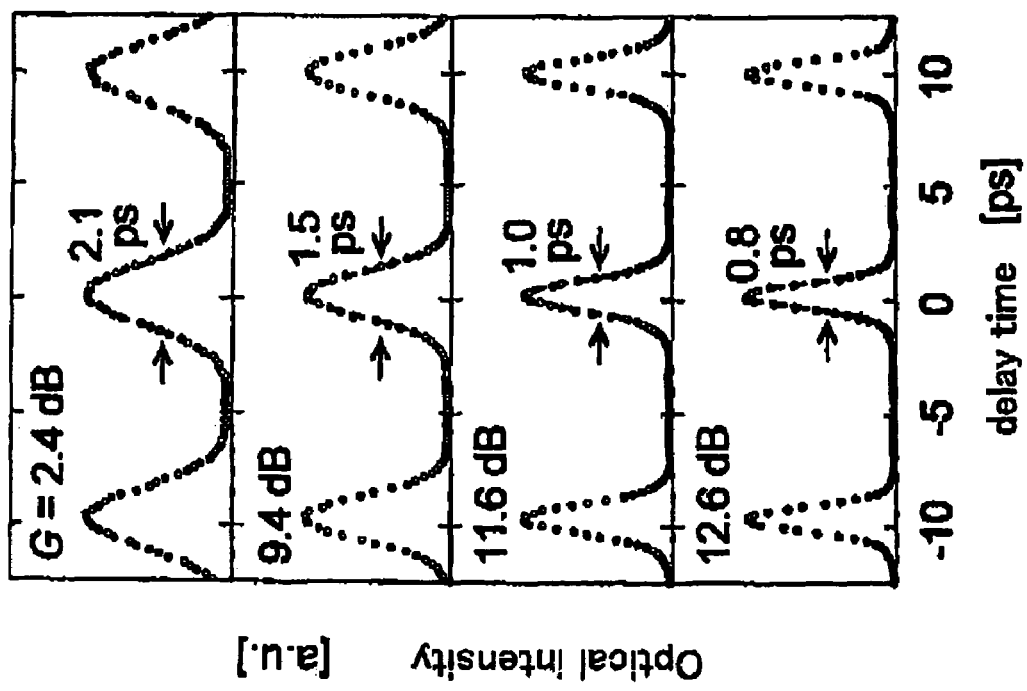

FIGS. 32A and 32B show autocorrelation traces of output pulse train and optical spectrums at gains of 2.4, 9.4, 11.6 and 12.6 dB, respectively. For comparison, sech² waveform is shown by a broken line. Not only the autocorrelation but also the optical spectrum are matched between the experimental results and broken lines, which shows generation of soliton of high purity. It should be also noted that a ratio of an optical pulse signal component adjacent to the center wavelength of the optical spectrum to noise is 40 dB or more. These results have proved that RA output pulse is soliton of low in noise and of high purity.

(Embodiments of Continuous Light Source)

As described above, in the optical transmission system, one factor which limits input light power into an optical fiber is nonlinear phenomenon. The non linear phenomenon has plural types, one of which is Stimulated Brillouin Scattering (SBS). SBS is apt to occur by relatively small input power and a part of the input power is scattered backward to adversely affect the transmission system. The present invention discloses a method for suppressing SBS of continuous light source using nonlinearity of an optical fiber.

SBS suppression is performed mainly by two methods. One is to broaden the spectrum width of a light source, and the other is to lessen peak power of a light source. In the present invention, XPM, SPM and Four-Wave Mixing (FWM) which are nonlinear phenomenon are used to suppress SBS. Specifically speaking, the present invention provides a method and a device for suppressing SBS by broadening the spectrum width of a multimode continuous light source or by reducing peak power with use of nonlinear phenomenon of an optical fiber.

Figure 33:
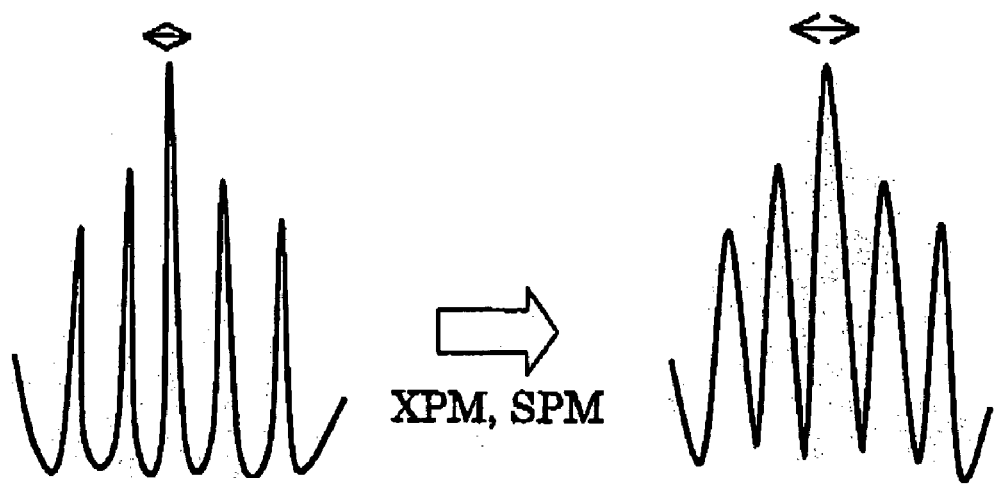
FIG. 33 is a schematic diagram showing an SBS suppression effect by XPM or SPM.

XPM and SPM have an effect of broadening the spectrum width of a light source, which makes it possible to suppress SBS. This is because as the spectrum width is broadened to reduce a Brillouin gain which results in increasing an SBS threshold value. Its mechanism is illustrated in FIG. 33.

In general, in case of continuous light, refractive index is hard to vary by Kerr effect in an optical fiber and these nonlinear phenomena nearly happen. However, if multimode continuous light is used in the light source, beat light generated between modes can be utilized to easily cause the nonlinear phenomena. On the other hand, conventional SBS suppression, pulse light is mainly utilized. However, in the present invention, multimode continuous light is applied to a light source, and accordingly, the nonlinear phenomenon is allowed to occur thereby suppressing SBS.

Figure 34:
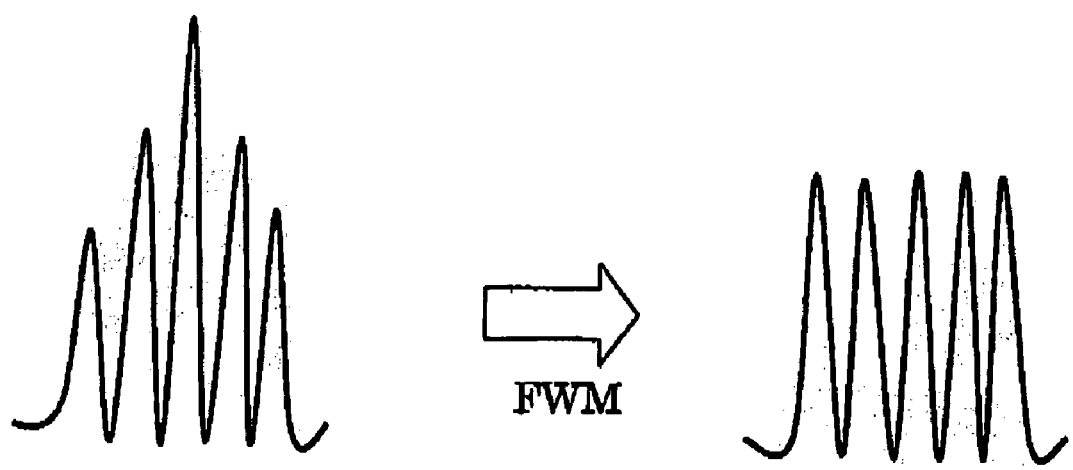
FIG. 34 is a schematic diagram showing an SBS suppression effect by FWM.

FIG. 34 is a diagram illustrating SBS suppressing mechanism by use of FWM. In FIG. 34, the power of multimode power of a light source is changed to reduce power per mode.

As a result of this, a Brillouin gain of each longitudinal mode can be reduced to suppress SBS.

EXAMPLE 6

A continuous light source for suppressing SBS includes a semiconductor laser for multimode oscillation and a highly nonlinear fiber (HNLF) with zero dispersion wavelength of 1461 nm. Here, the HNLF used here has a nonlinearity coefficient $\gamma=24.5$ /W/km and optical fiber length of 500 m. The longer an optical fiber is and the larger the nonlinearity coefficient is, the more the nonlinear phenomenon is apt to happen thereby suppressing SBS. However, this is apt to cause SBS in the HNLF. In addition, the longer the HNLF is, the larger the insertion loss is. In consideration of these points, HNLF length and the nonlinearity coefficient are determined. Further, in order to suppress reflection light anterior to or posterior to the HNLF, an isolator may be arranged according to need. The isolator is arranged either of the transmission path anterior to the HNLF and the transmission path after the HNLF or both of them.

Figure 35:
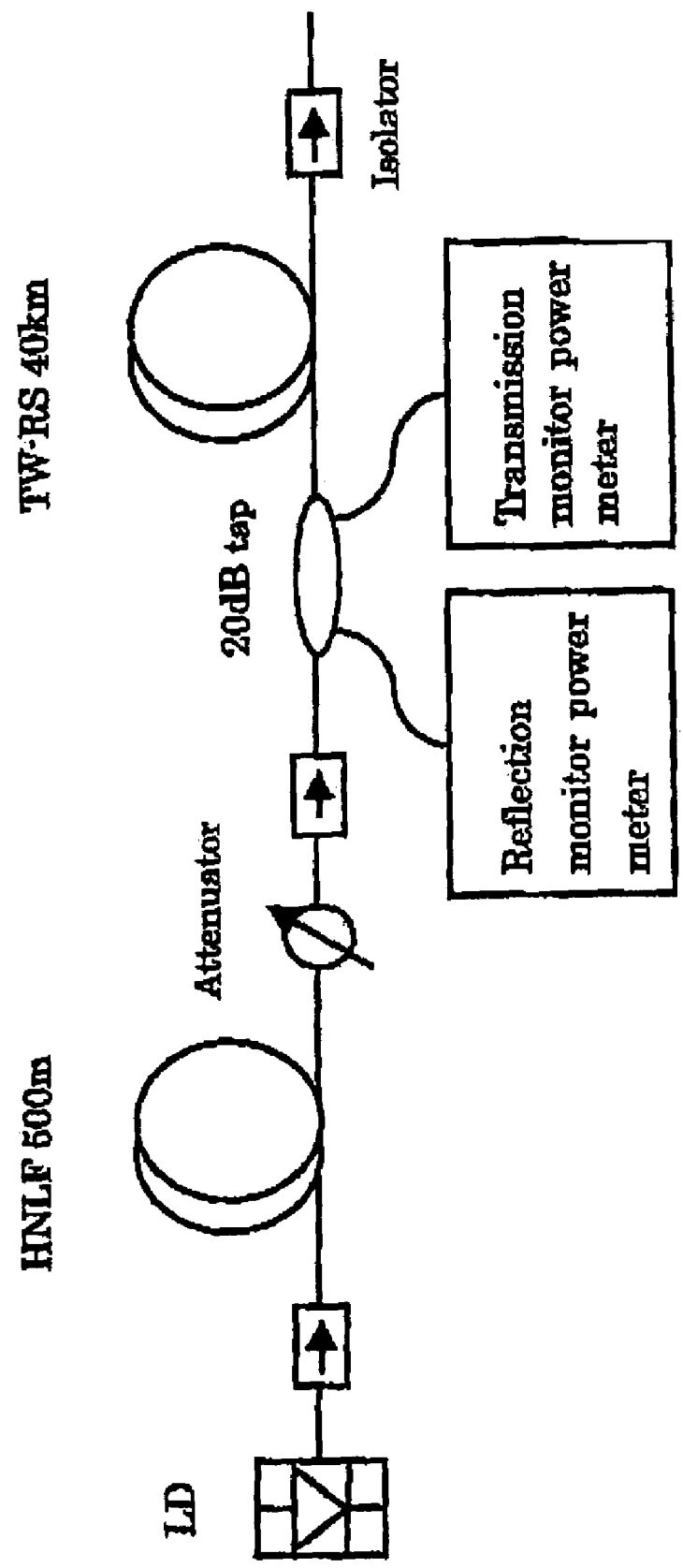
FIG. 35 illustrates an experimental system for examining an SBS suppression effect at a measured transmission path of a light source which is subjected to SBS suppression with use of a HNLF.

FIG. 35 shows a configuration for SBS measurement. At the outputting side of the HNLF, a 20 dB tap and True Wave RS fiber (nonzero dispersion shifted fiber) care arranged in this order. The TW-RS is 40 km enough to cause SBS. The 20 dB tap is for optically connecting a reflection monitor power meter for measuring power of reflection light from the TW-RS and a throughput monitor power for measuring power of input light with an SBS measuring transmission path. An SBS value is evaluated by (return loss; SBS value) [dB]=(reflection power) [dBm]−(throughput power) [dBm].

Figure 36:
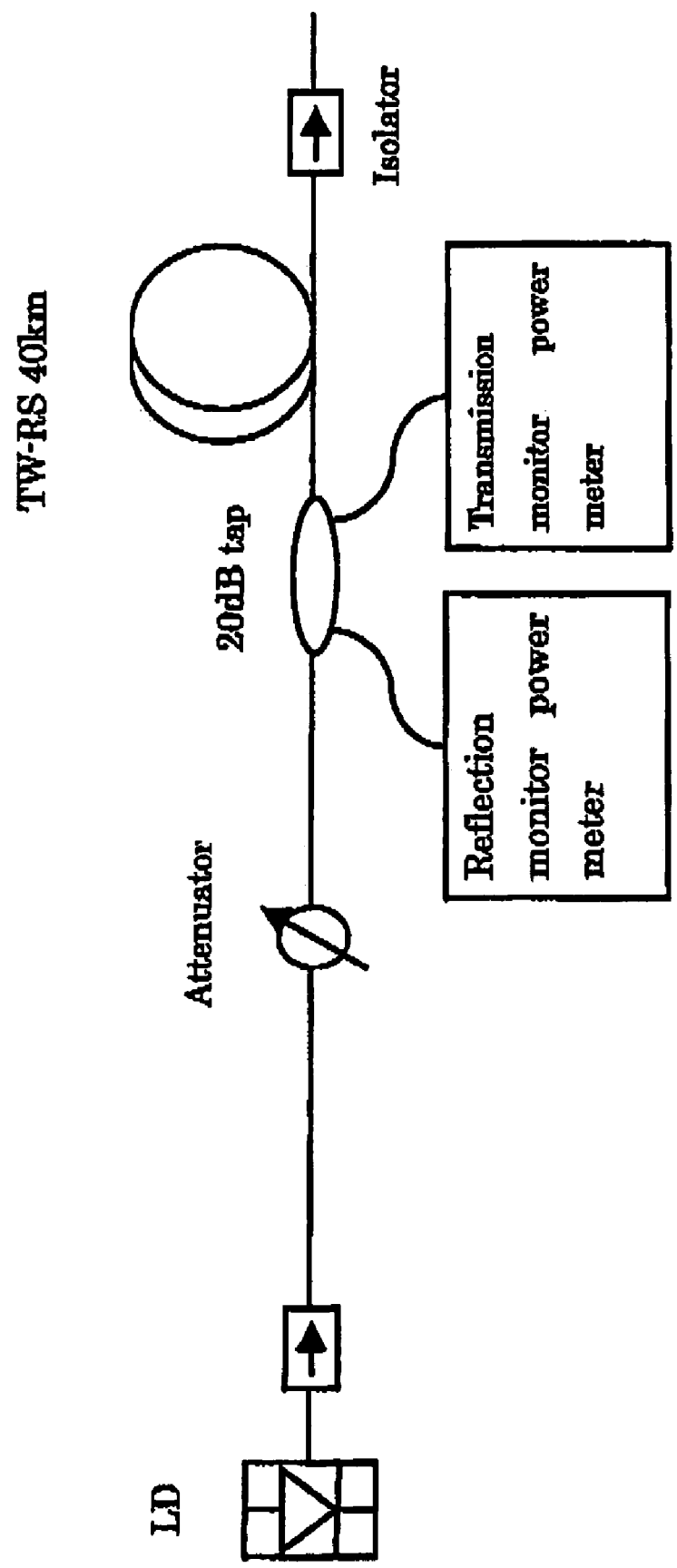
FIG. 36 illustrates an experimental system for examining an SBS suppression effect at a measured transmission path of a light source which is not subjected to SBS suppression with use of a HNLF.

However, in order to clarify an effect for SBS suppression, when multimode oscillated continuous light from a semiconductor laser is made to pass through the HNLF, an SBS value in the measuring transmission path (this example) and an SBS value in the measuring transmission path without HNLF shown in the experimental system on FIG. 36 (comparison example) are measured. Although an attenuator is provided in the experimental systems in FIGS. 35 and 36, this is because outputs can be changed to measure SBS threshold of a semiconductor laser on the same driving condition.

Description below is made about experimental results of using the SBS measuring transmission path on FIGS. 35 and 36.

Figure 37:
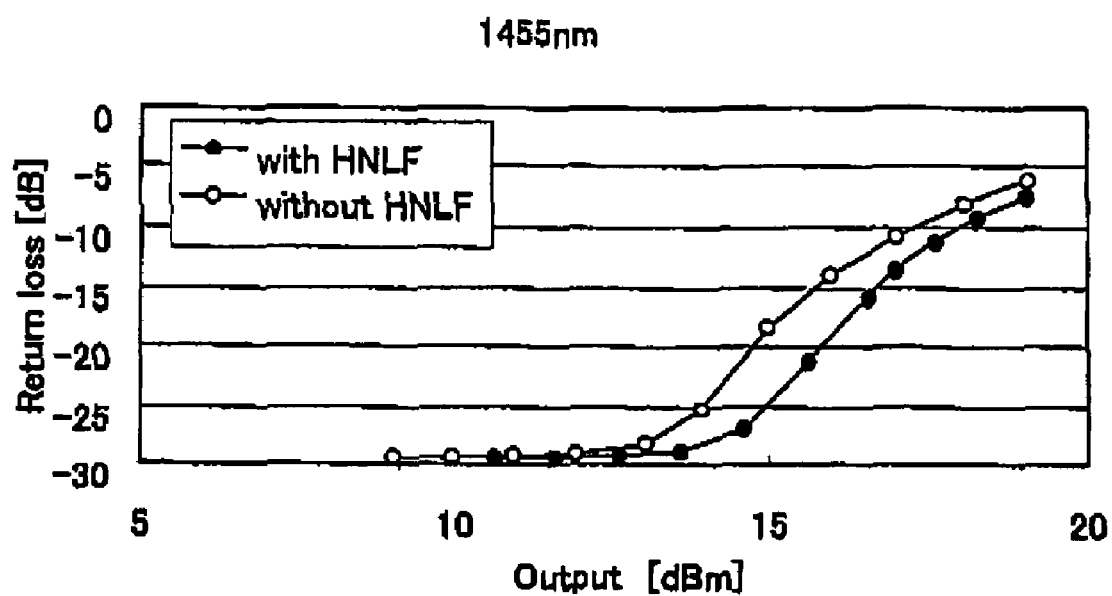
FIG. 37 is a graph showing an SBS measurement result of a 1455 nm semiconductor laser.
Figure 38:
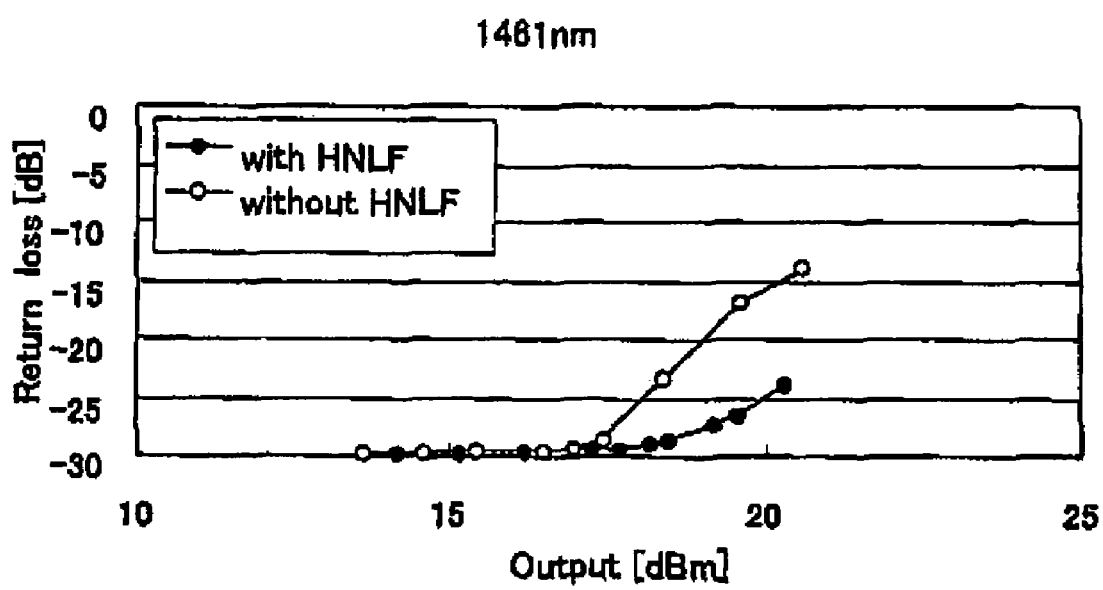
FIG. 38 is a graph showing an SBS measurement result of a 1461 nm semiconductor laser.
Figure 39:
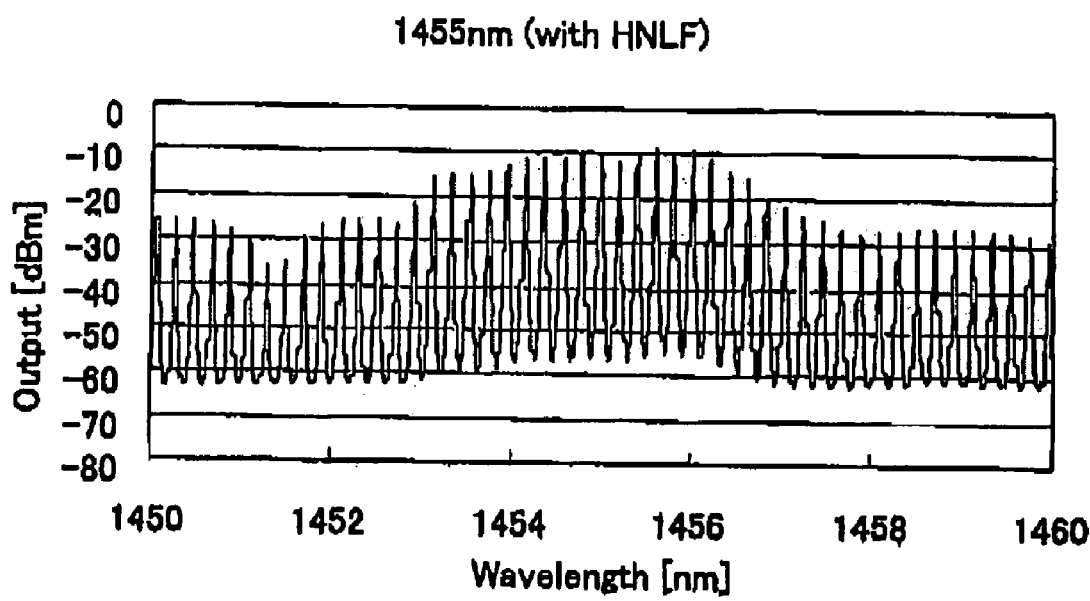
FIG. 39 is a graph showing a spectrum of light from a 1455 nm semiconductor laser which is made to pass through a HNLF.
Figure 40:
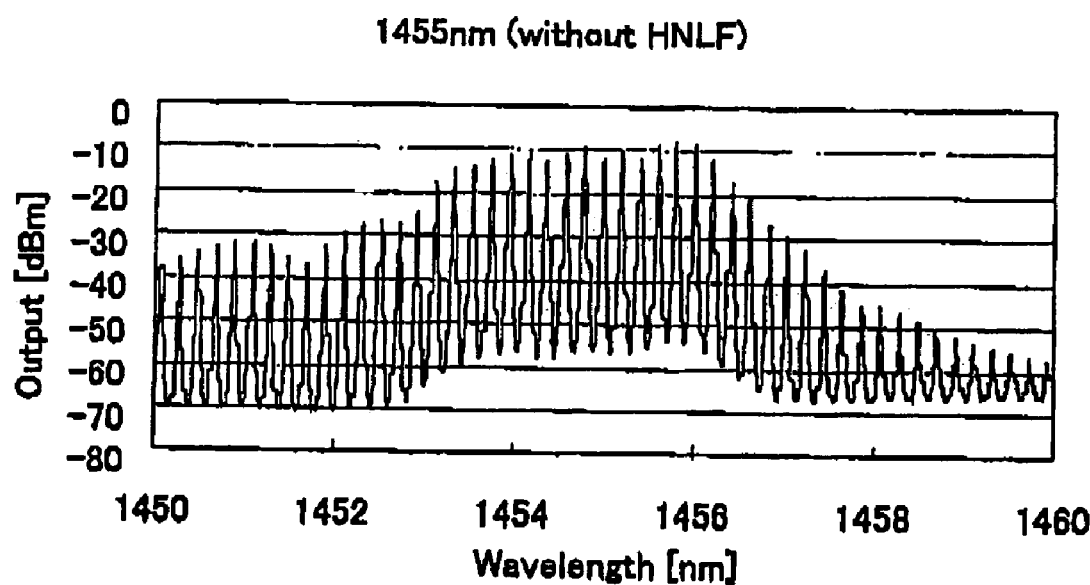
FIG. 40 is a graph showing a spectrum of light from a 1455 nm semiconductor laser which is not made to pass through a HNLF.
Figure 41:
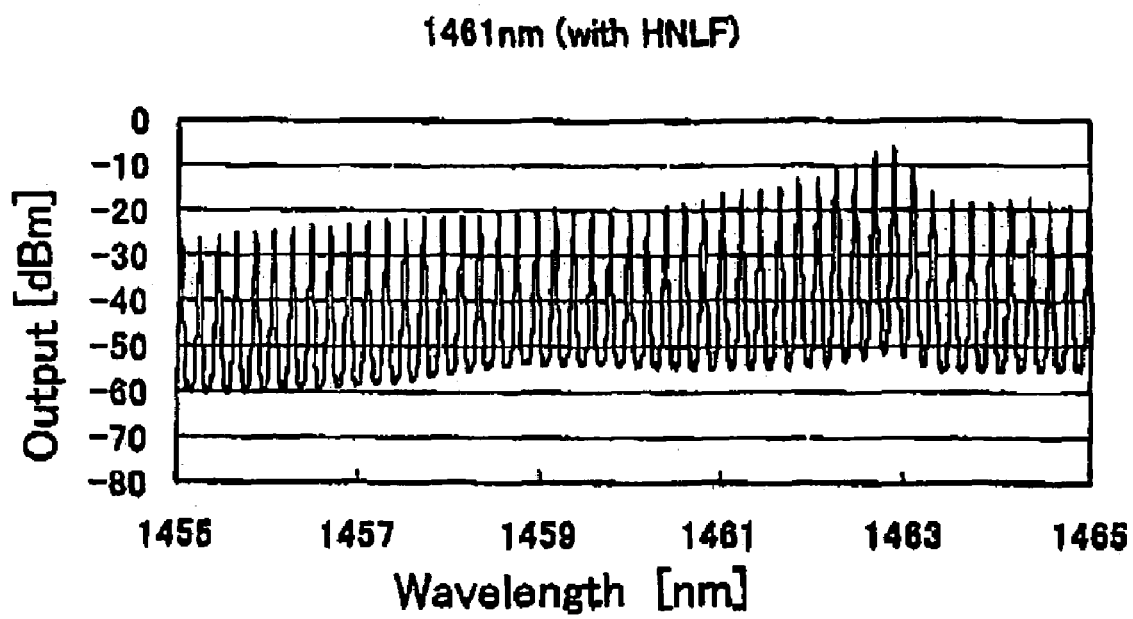
FIG. 41 is a graph showing a spectrum of light from a 1461 nm semiconductor laser which is made to pass through a HNLF.
Figure 42:
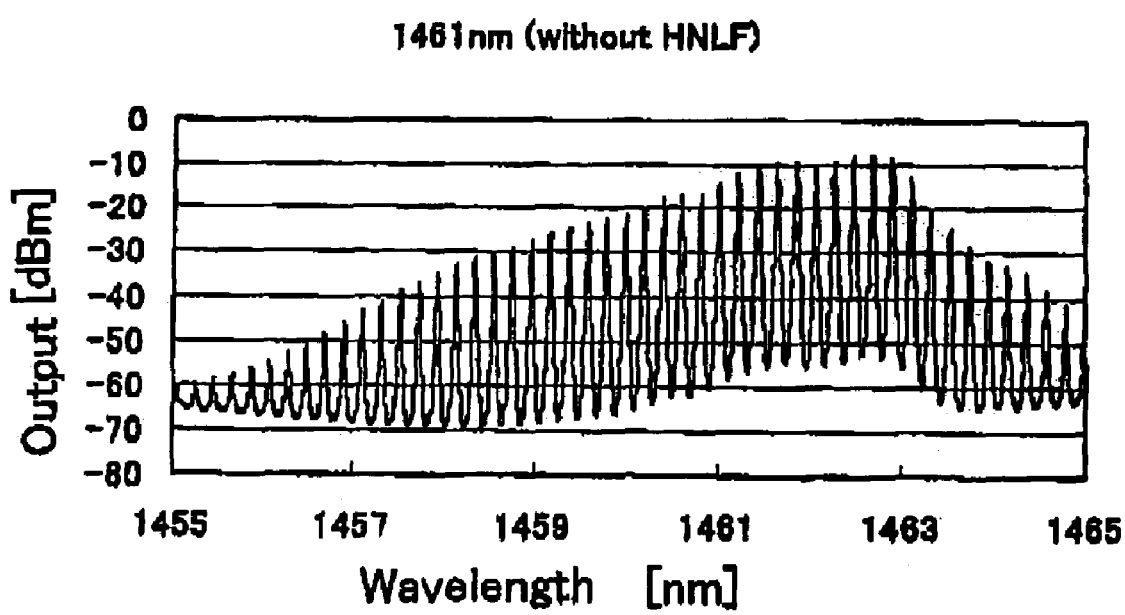
FIG. 42 is a graph showing a spectrum of light from a 1461 nm semiconductor laser which is not made to pass through a HNLF.

FIGS. 37 and 38 are graphs showing measuring results of SBS values by using a semiconductor laser of 1455 nm and a semiconductor laser of 1461 nm, respectively. It is confirmed that as the HNLF is used, the SBS threshold becomes large. Specifically, the SBS suppression effect is remarkable in the 1461 nm semiconductor laser of which the zero dispersion wavelength 1461 nm and the center wavelength of the semiconductor laser. Generally, the closer to the zero dispersion wavelength of the optical fiber the wavelength of the light source is, FWM is more apt to occur. Accordingly, the wavelength of the semiconductor laser is preferably tuned to the zero dispersion wavelength.

FIGS. 39 through 42 show spectrums both of when continuous light from the 1455 nm and 1461 nm semiconductor lasers is propagated along the HNLF and when the continuous light is not propagated. At this time, light output marking is a value standardized to be the total power. From comparison between the spectrum of a semiconductor laser of 1455 nm with HNLF in FIG. 39 and the spectrum of a semiconductor laser of 1455 nm without HNLF in FIG. 40 and from comparison between the spectrum of a semiconductor laser of 1461 nm with HNLF in FIG. 41 and the spectrum of a semiconductor laser of 1461 nm without HNLF in FIG. 42, the spectrum with HNLF is broadened by FWM. This is particularly well observed at the 1461 nm semiconductor laser for zero-dispersion effect of 1461 nm. The wavelength range of which this spectrum is broadened is matched with the SBS suppressed wavelength range. In other words, a main factor for SBS suppression effect is such that the spectrum is broadened by FWM.

Figure 43:
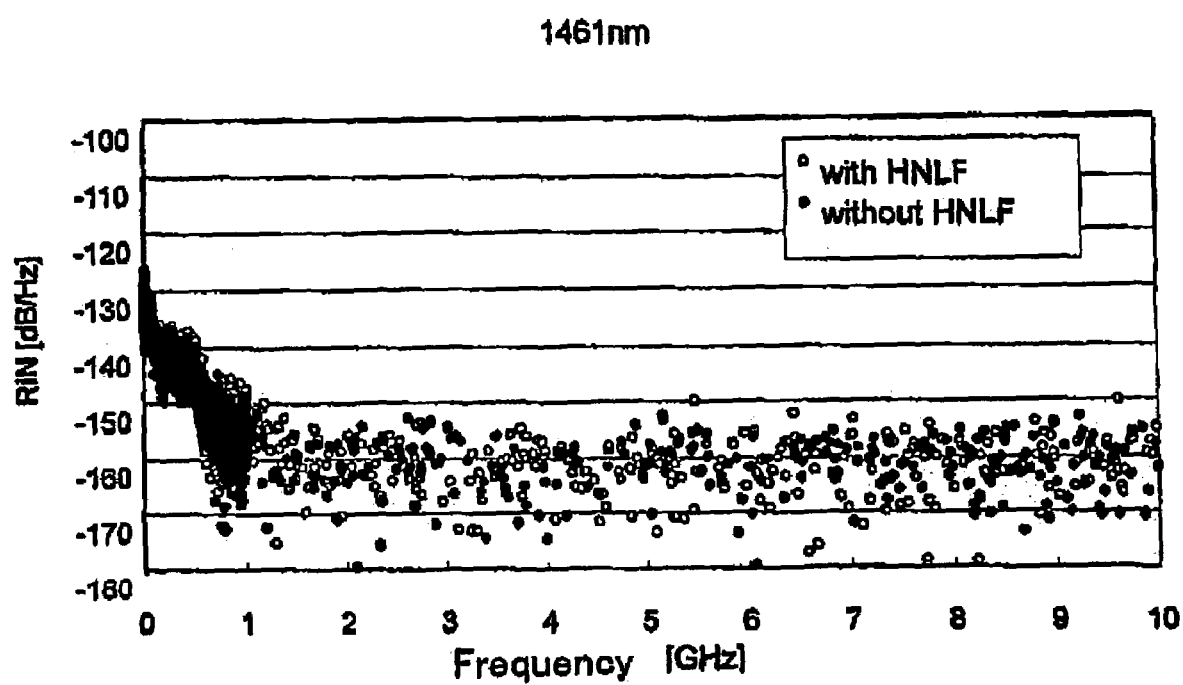
FIG. 43 is a graph showing a RIN measurement result of the case where light from a 1461 nm semiconductor laser is made to pass through an HNL and the case where the light is not made to pass through the HNL.

FIG. 43 show measuring results of RIN characteristics of both cases where semiconductor laser light of waveband which is spectrum broaden by FWM, that is 1461 nm, is propagated along the HNLF and where the light is not propagated. As is clear from FIG. 43, the measurement results of the RIN characteristics confirm that RIN is not affected by FWM. The SBS suppressing technique by electric control tends to cause deterioration of RIN in modulated or dithered frequency while the SBS suppressing technique by FWM is advantageous in that almost no RIN deterioration occurs.

As is seen from the above-described experimental results, when multimode continuous light output from a semiconductor laser module is made to pass through the HNLF the SBS is suppressed. Besides, when the SBS is suppressed, there occurs almost no RIN deterioration. Chief factor of SBS suppression is FWM, and therefore the SBS can be suppressed efficiently by controlling the nonlinearity coefficient of the optical fiber and the optical fiber length in such a manner that a peak value of each longitudinal mode is reduced by FWM.

Next description is made about a Raman amplifier using a device and a method for SBS suppression of a continuous light source as described above.

Figure 44:
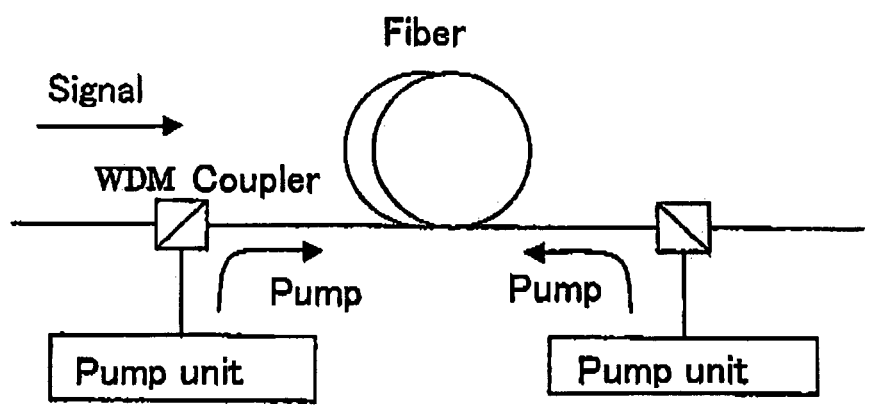
FIG. 44 is a view illustrating a configuration of a Raman amplifier.

FIG. 44 shows a configuration of the Raman amplifier. The Raman amplifier is divided into a co-pumping type, a counter-pumping type and a bidirectional type. The co-pumping type Raman amplifier requires extremely excellent RIN characteristics because in the co-pumping, pumping light and signal light propagate along the optical fiber together and the RIN characteristic in the pumping light adversely affects on the signal light. In other words, the ill RIN characteristic in the pumping light may cause deterioration in the RIN characteristic in the signal light.

Accordingly, there has been developed a semiconductor laser with excellent RIN characteristic as co-pumping light source of the Raman amplifier. A pumping light source generally used for Raman amplification has Fiber Bragg Grating (FBG) for wavelength fixation. However, FGB tends to deteriorate RIN. Then, in order to improve RIN, a semiconductor laser with grating inside a semiconductor laser chip is developed so as to fix a wavelength without FBG. However, grating provided inside the chip makes the longitudinal-mode spectrum width narrow, which is apt to cause SBS. Consequently, if the present invention such that RIN characteristic is not deteriorated even when SBS is suppressed is applied to a semiconductor laser with grating provided inside, this will be extremely effective means as forward pumping light source of the Raman amplifier. Further, the Raman amplifier is allowed to solve both of RIN problem and SBS problem. Although it is more effective for solving the both problems of RIN and SBS to apply the SBS suppressing means of the present invention to the semiconductor laser with grating inside, the SBS suppressing means of the present invention may be applied to a semiconductor laser without grating.

EXAMPLE 7

Figure 45:
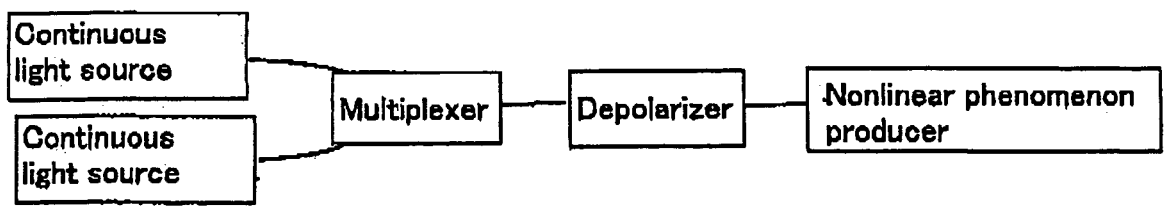
FIG. 45 is a schematic diagram illustrating an SBS suppression light source using two continuous light sources.

With reference to FIG. 45, description is made about a device and a method for suppressing SBS of a continuous light source utilizing a nonlinear phenomenon of an optical fiber which has a more effective SBS suppression effect than that of example 6.

The SBS-suppressed continuous light source includes two continuous light sources, a multiplexer for multiplexing light outputs from the two light sources, a depolarizer for depolarizing polarization of each of the continuous light sources after passing through the multiplexer and a nonlinear phenomenon producer for causing nonlinear phenomenon. Here, the depolarizer is not necessarily required. However, when the nonlinear phenomenon producer has polarization dependence, the depolarizer is used to cause a nonlinear phenomenon more effectively.

Here, at least one of the two continuous light sources is a light source for multimode oscillation. The other light source is either a multimode light source of which mode frequencies when the two light sources are added is not equally spaced or a single mode light source. For example, the light sources may be a combination of multimode light sources of different mode spacing. Or, when two multimode light sources of the same mode spacing are used, the mode frequency of light obtained by addition of the light sources is not set to be equally spaced.

The multiplexer may be a polarization multiplexer. When polarization multiplexing is performed, an optical fiber used for outputs from the light sources and the polarization multiplexer may be preferably a polarization maintaining fiber for effective multiplexing.

The depolarizer may be preferably a crystal type depolarizer or a fiber type depolarizer. For effective multiplexing an optical fiber used for the polarization multiplexer may be preferably a polarization maintaining fiber.

As a parameter indicating the susceptibility to nonlinear phenomenon in an optical fiber, nonlinear phase shift:

$$\Phi = c \int_0^\infty P_s(z) dz$$

is generally used. As is expressed by this equation, the larger the nonlinearity coefficient c is or the longer the optical fiber is, the larger the nonlinear phenomenon becomes. An optical fiber for causing nonlinear phenomenon is such that when the zero dispersion wavelength of the optical fiber is near to the wavelengths of the two light sources, FWM, one of nonlinear phenomena, is apt to occur thereby allowing effective SBS suppression. Further, the longer the fiber is and the larger the nonlinearity coefficient is, the more the nonlinear phenomenon is apt to occur, thereby allowing effective SBS suppression.

Figure 46:
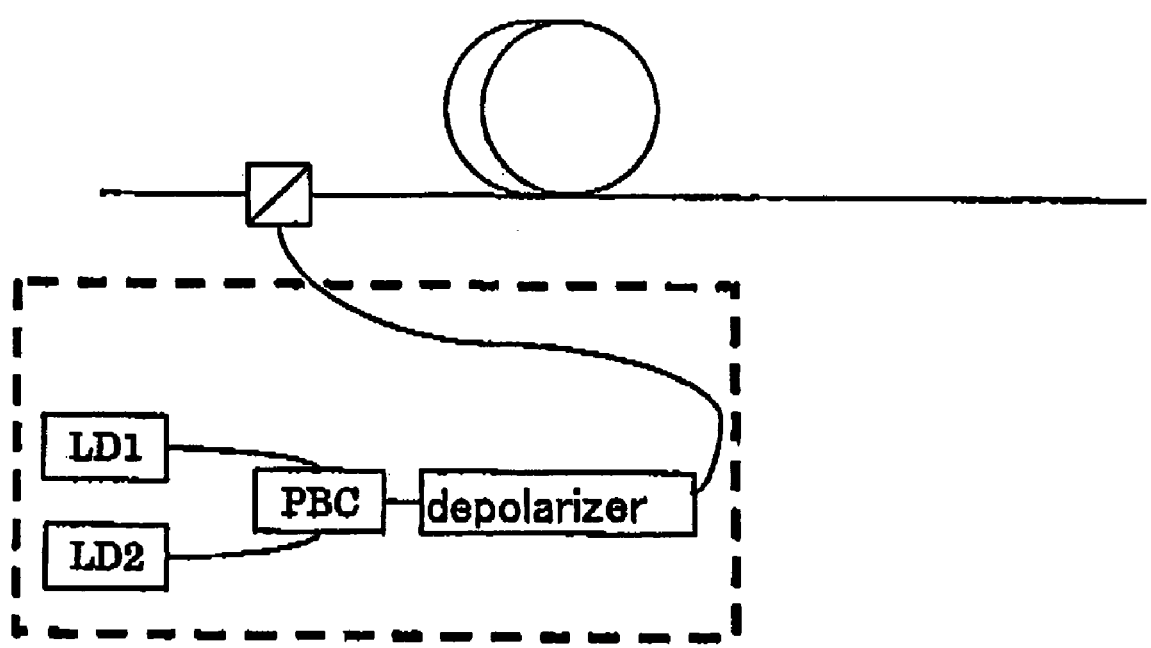
FIG. 46 shows an experimental system for checking an effect of the SBS suppression light source using two continuous light sources.

With use of FIG. 46, a specific embodiment of a device and a method for suppressing SBS of a continuous light source utilizing a nonlinear phenomenon is described. At this time, an optical fiber for transmission as it is, is used as a nonlinear phenomenon producer. In order to suppress SBS of a continuous light source in the transmission path, a nonlinear phenomenon that occurs in the transmission path is used. TrueWave RS which is a nonzero-dispersion shifted fiber is used as a transmission path. TrueWave RS used here is of 1439.4 nm in zero dispersion wavelength, nonlinear coefficient: $\gamma=2$, of 20 km in optical fiber length. Used as a continuous light source are two semiconductor lasers which oscillate in a multimode in the vicinity of 1442 nm. The oscillating wavelength of the continuous light source is matched with the zero dispersion wavelength of the optical fiber so as to easily generate FWM which is one nonlinear phenomenon. Used as a polarization multiplexer is a polarization maintaining type multiplexer. Used as a depolarizer is a fiber type depolarizer.

Figure 47:
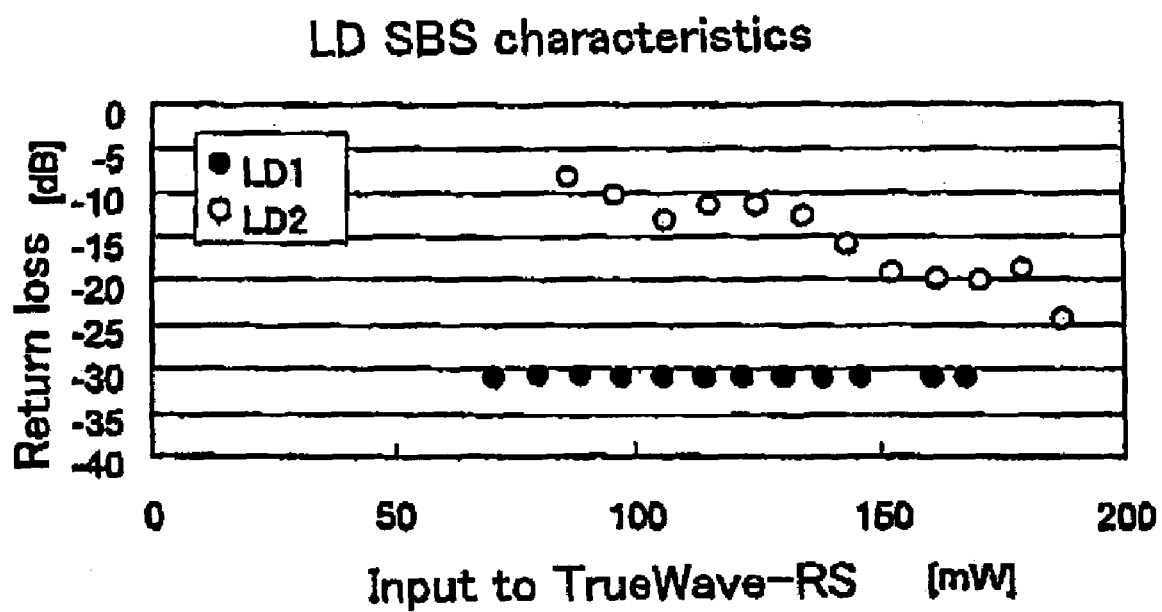
FIG. 47 is a graph showing an SBS measurement result of each light source used in the experimental system for checking an effect of the SBS suppression light source using two continuous light sources.

FIG. 47 shows SBS measuring result where LD1 and LD2 are driven separately. SBS is measured from an input power and a reflected light power at an inputting portion of TW-RS. For the LD1, return loss is about −31 dB between approximately 70 and 170 mW, and the reflected power by SBS is less than the Rayleigh scattering level. On the other hand, for the LD2, the reflected light power by SBS is more than Rayleigh scattering level between about 90 and 190 mW. However, when LD1 and LD2 are variously combined to be driven so that the sum of power of the LD1 and LD2 becomes 250 mW, the return loss is about −31 dB and the reflection light power by SBS is less than Rayleigh scattering level. That is, both of the LD1 and LD2 are driven to be able to suppress SBS.

Figure 48A:
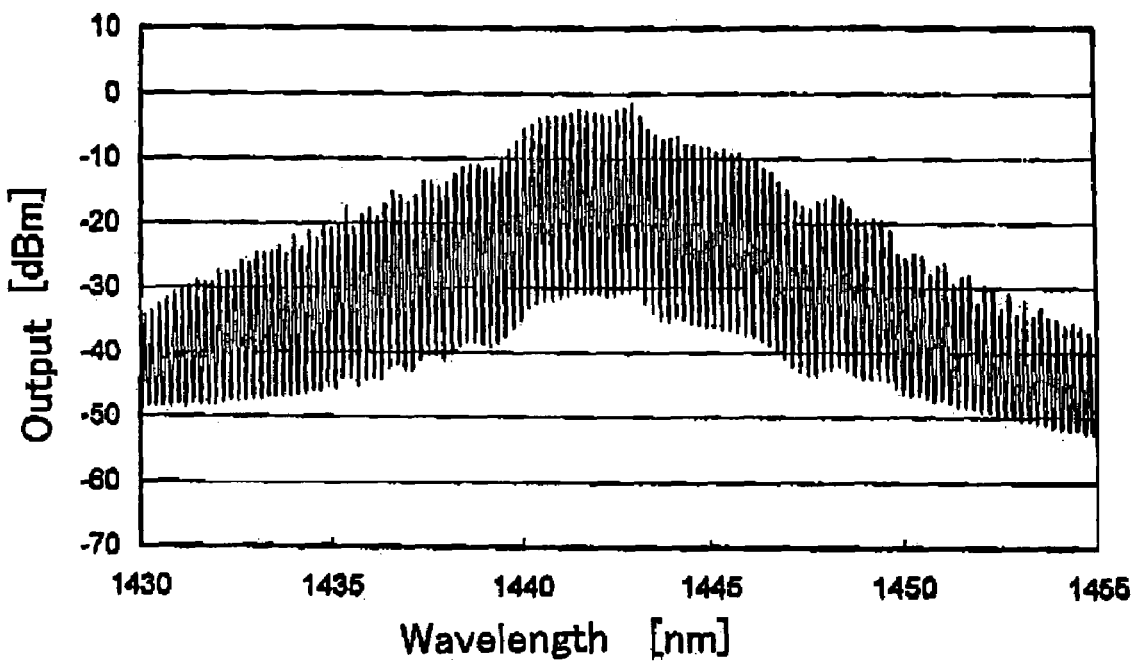
FIG. 48A is a graph showing a spectral profile of light which was output from an SBS suppression light source using two continuous light sources and propagated along a TW-RS fiber.
Figure 48B:
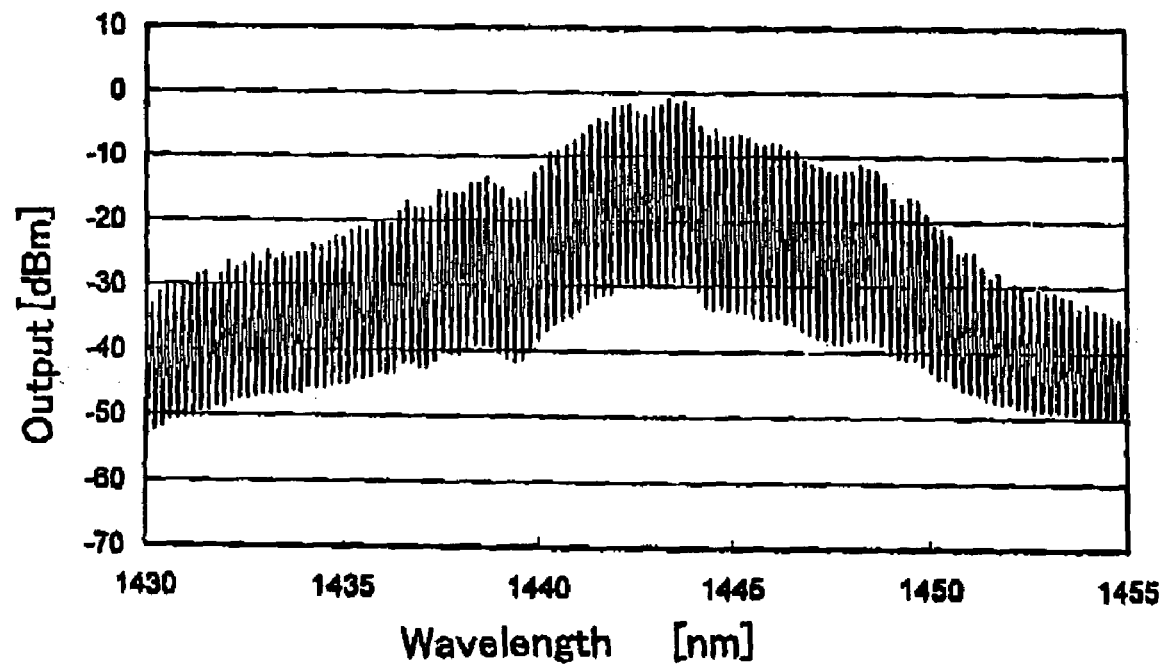
FIG. 48B is a graph showing a spectral profile of light which was output from an SBS suppression light source using two continuous light sources and propagated along a TW-RS fiber.
Figure 48C:
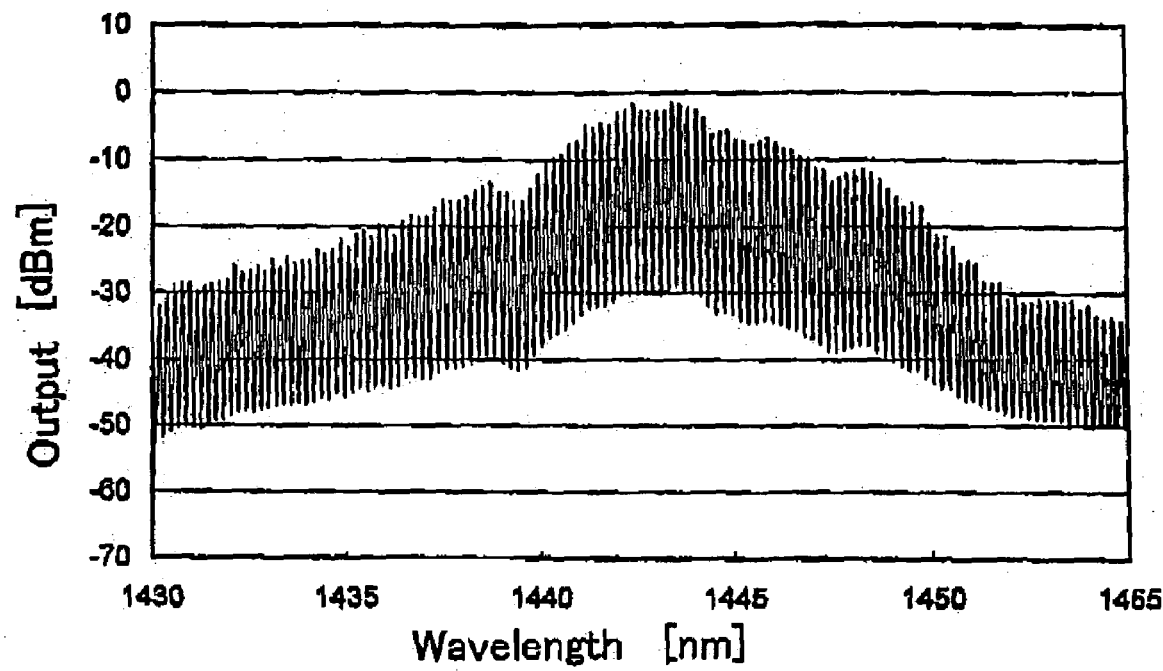
FIG. 48C is a graph showing a spectral profile of light which was output from an SBS suppression light source using two continuous light sources and propagated along a TW-RS fiber.
Figure 48D:
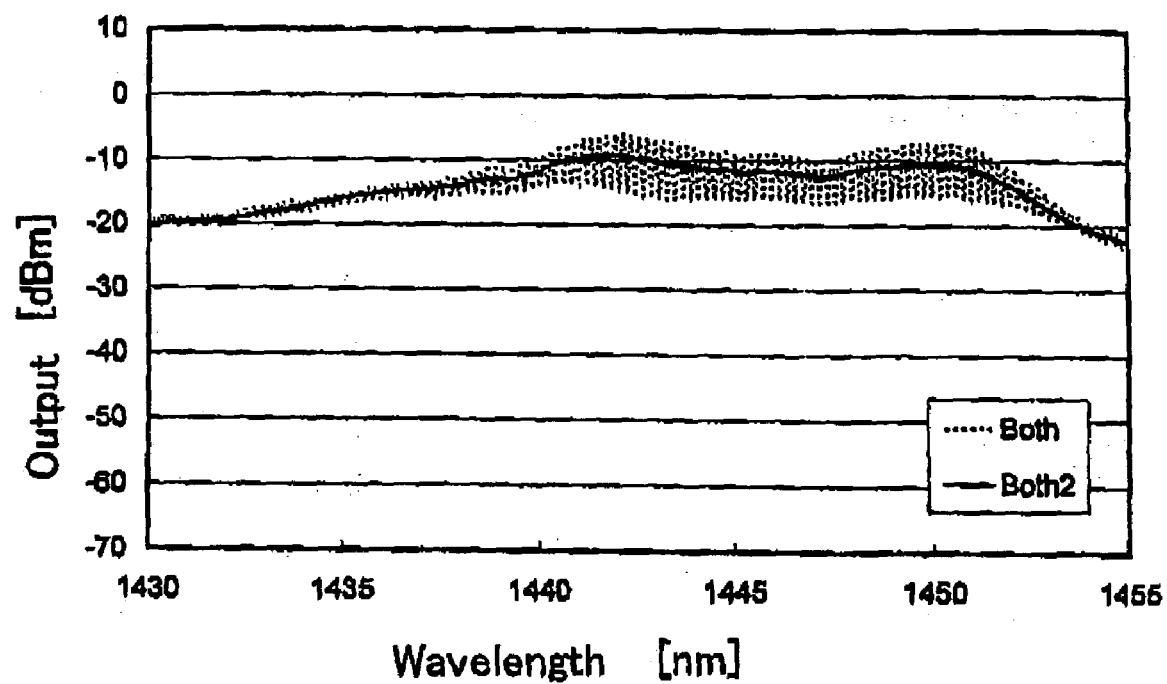
FIG. 48D is a graph showing a spectral profile of light which was output from an SBS suppression light source using two continuous light sources and propagated along a TW-RS fiber.
Figure 49A:
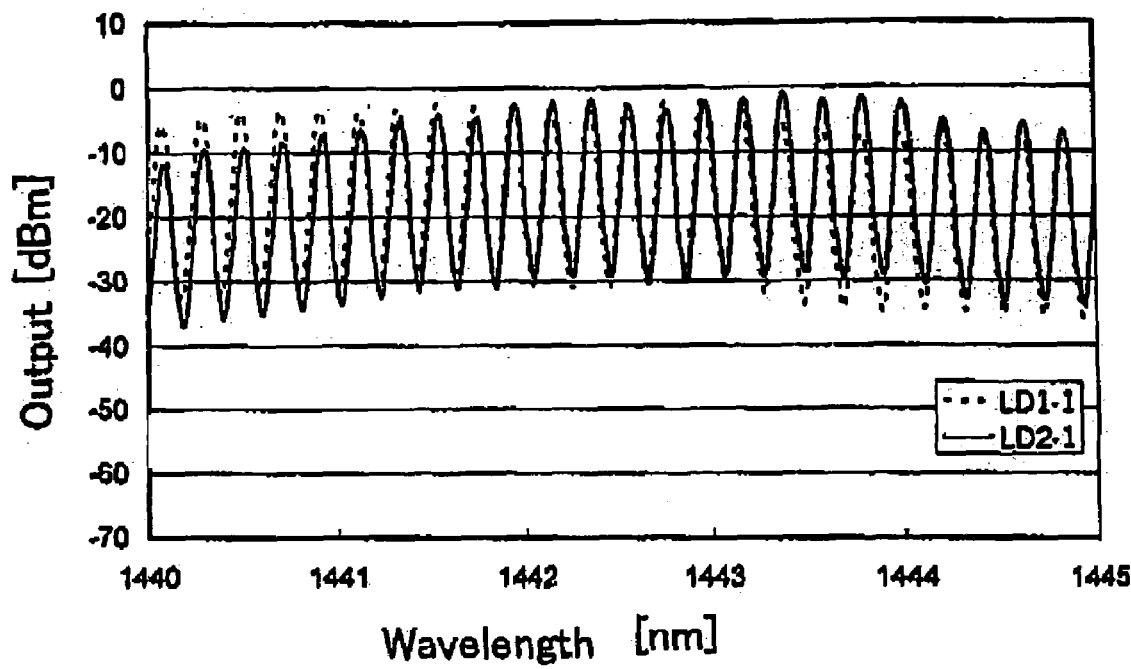
FIG. 49A is a partially enlarged graph of FIGS. 48A and 48B.
Figure 49B:
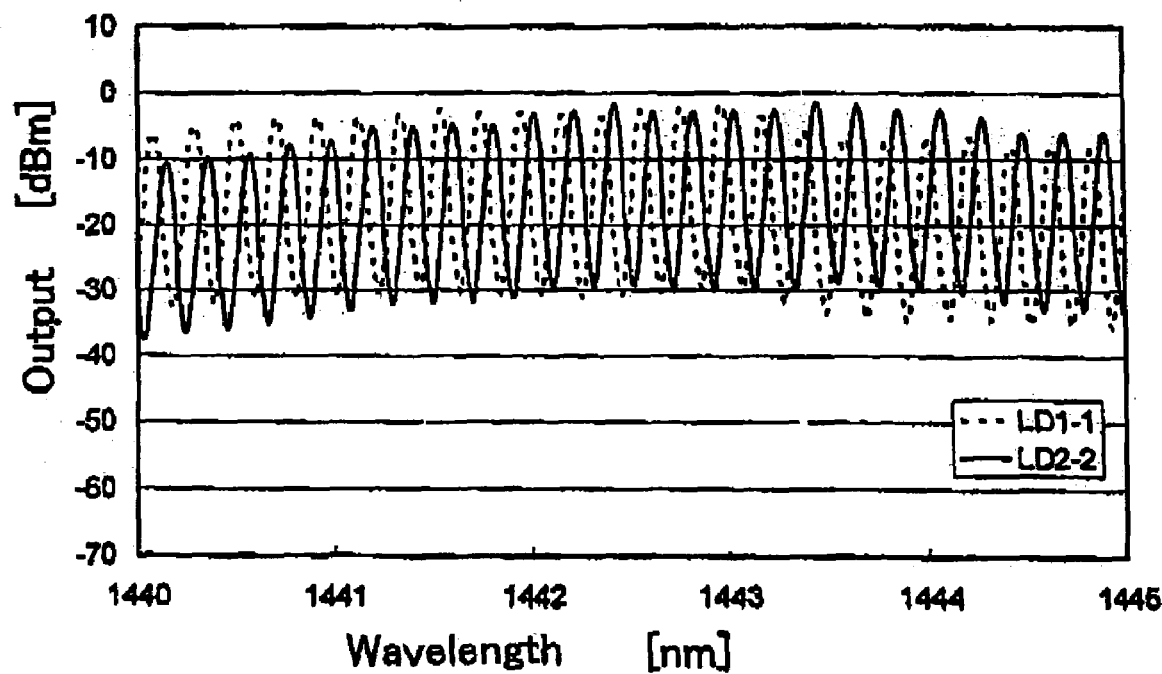
FIG. 49B is a partially enlarged graph of FIGS. 48A and 48C.
Figure 49C:
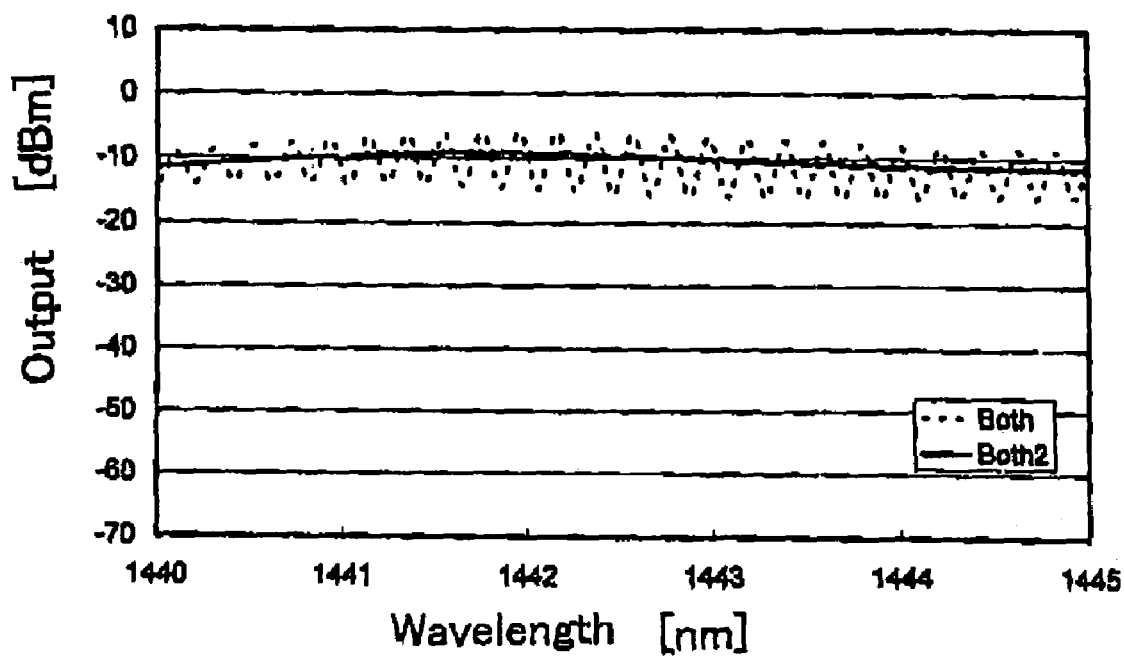
FIG. 49C is a partially enlarged graph of FIG. 48D.
Figure 50:
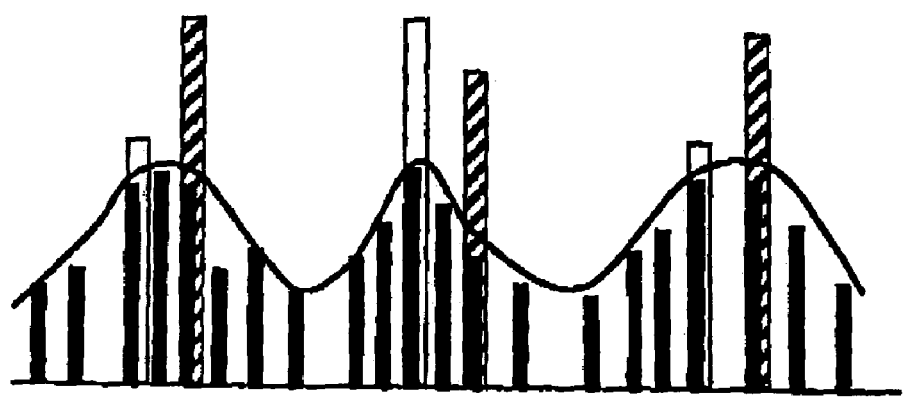
FIG. 50 is a schematic diagram illustrating an SBS suppression effect of an SBS suppression light source using two continuous light sources.

FIGS. 48A through 48D show spectrums after TW-RS transmission. FIG. 48A shows a spectrum when the LD1 is only used to input light into TW-RS at 125 mW (condition 1-1). FIG. 48B shows a spectrum when the LD2 is only used to input light into TW-RS at 125 mW and the position of a longitudinal mode of the LD2 is adjusted to be little shifted from that of the LD1 (condition 2-1). FIG. 49A show enlarged views of FIGS. 48A and 48B. FIG. 48C shows a spectrum when the LD2 is only used to input light into TW-RS at 125 mW and the position of a longitudinal mode of the LD2 is adjusted to be little shifted from the center of longitudinal mode of the LD1 (condition 2-2). FIG. 49B shows enlarged views of FIGS. 48A and 48C. FIG. 48D shows a spectrum when the LD1 and the LD2 are used at the conditions 1-1 and 2-1, respectively, to input light into TW-RS (condition both-1) and a spectrum when the LD1 and the LD2 are used at the conditions 1-1 and 2-2, respectively, to input light into TW-RS (condition both-2). FIG. 49C is an enlarged view of FIG. 48D. When FIGS. 48A through 48C of the solely driven LD case are compared with FIG. 48D of the case of two LDs driven simultaneously, the spectrum envelope line is apparently broadened. When the enlarged view of FIGS. 49A and 49B are compared with the enlarged view of FIG. 49C, it is seen that the peak power of the longitudinal mode become smaller by the two LD driven simultaneously. Particularly, in the condition both-2, the longitudinal mode becomes almost flat. Since the envelop is broadened and peak power of the longitudinal mode become smaller, there is an effect of SBS suppression. The envelop is broadened because two LDs are driven to increase the number of longitudinal modes which tends to cause FWM. The peak power of the longitudinal modes becomes smaller because there occurs a new wavelength between longitudinal modes of each LD by FWM and further FWM is caused between the longitudinal modes of each LD and the new wavelength thereby distributing the power.

Here, the transmission path itself is used as a nonlinear phenomenon producer. However, the nonlinear phenomenon producer may be regarded as a part of a continuous light source. If a fiber with a large nonlinearity coefficient is used as a nonlinear phenomenon producer, the same effect can be achieved even if the fiber length is shortened.

EXAMPLE 8

Figure 51:
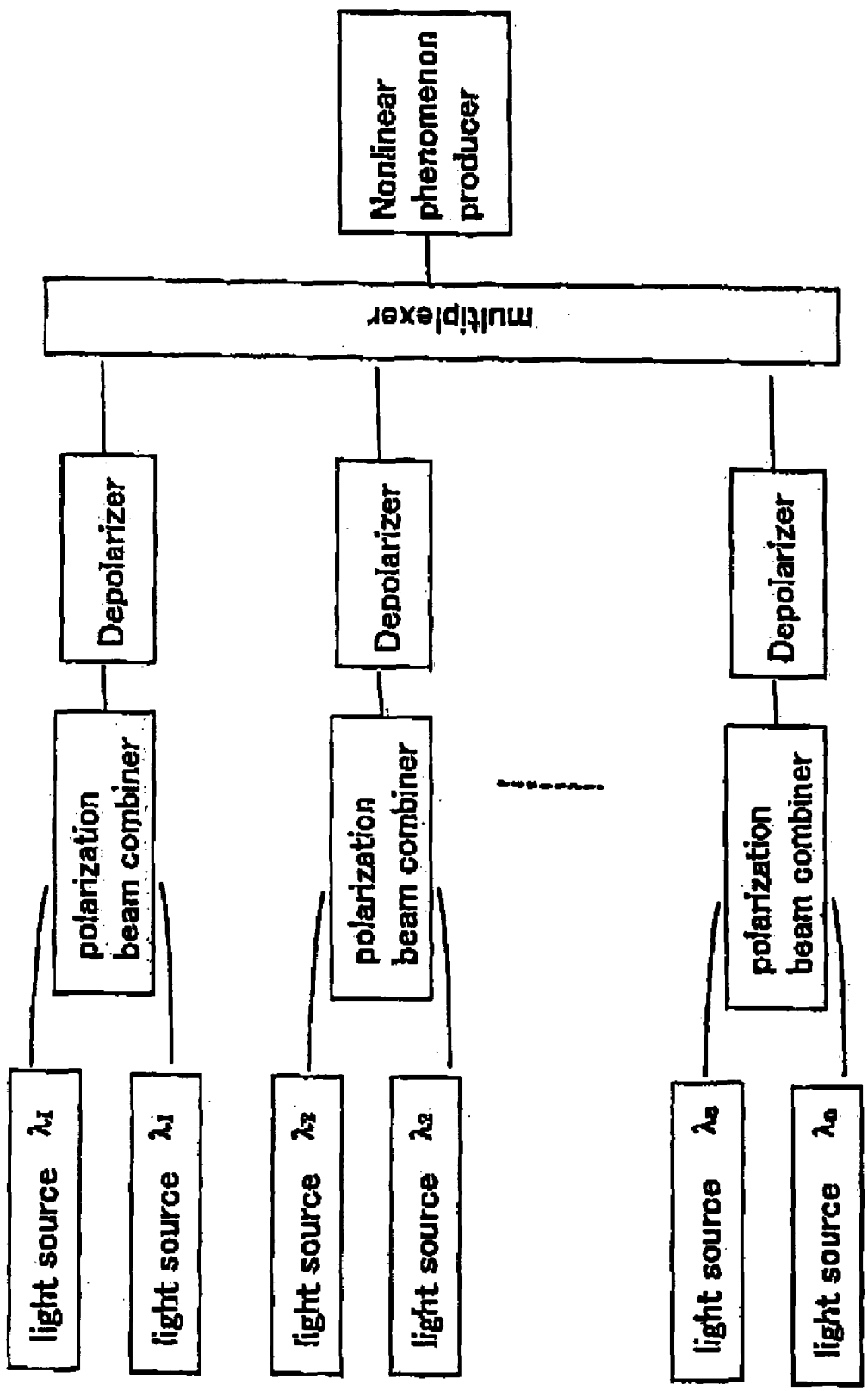
FIG. 51 is a schematic diagram illustrating an SBS suppression light source when SBS suppression is performed on plural light sources with wavelengths all together.
Figure 52:
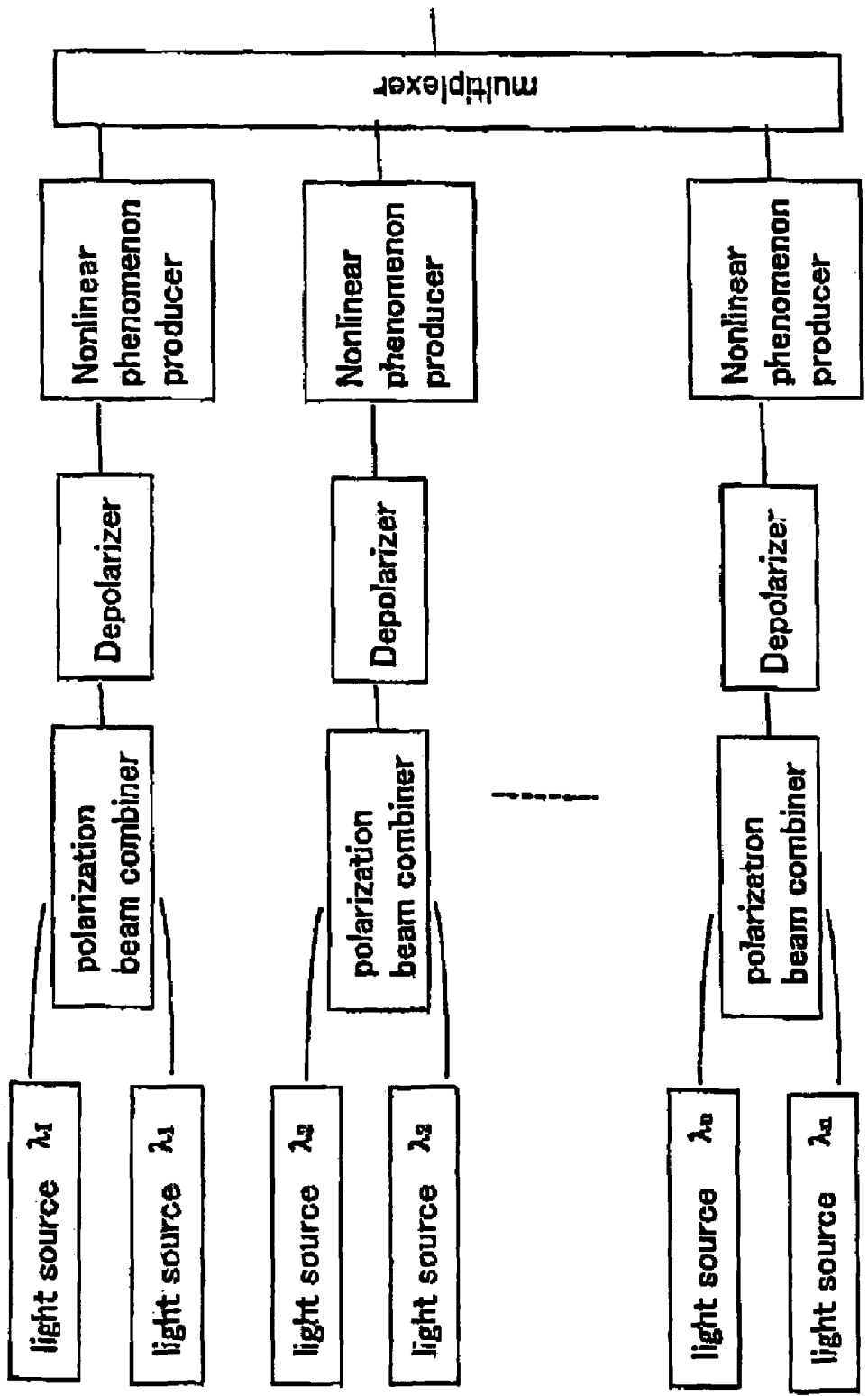
FIG. 52 is a schematic diagram illustrating an SBS suppression light source when SBS suppression is performed on plural light sources with wavelengths independently.

In order to obtain an SBS suppressed continuous light source of a plurality of wavelengths, SBS suppression can be performed at each wavelength as shown in FIG. 51, while SBS suppression can be performed after multiplexing wavelengths as shown in FIG. 52. In multiplexing wavelengths, a WDM may be used or Mach-Zehnder multiplexer may be used.

EXAMPLE 9

Figure 53:
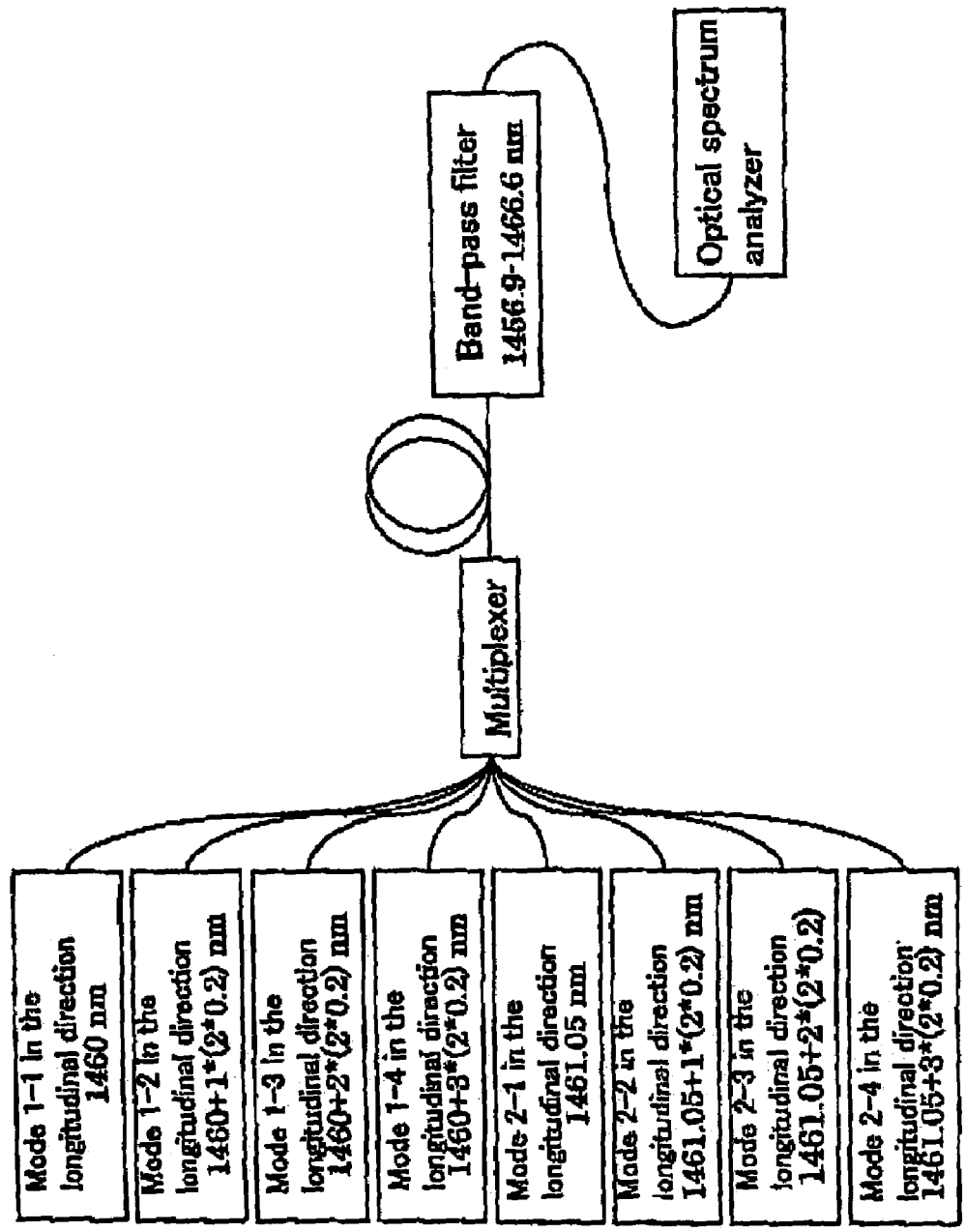
FIG. 53 is a block diagram illustrating simulation for checking power variation by FWM.

In an SBS suppression light source on FIG. 45, in order to obtain fiber requirements for SBS suppression, FWM is studied by simulations. It is assumed that each continuous light source has eight longitudinal modes and longitudinal mode spacing of about 0.2 nm (35 GHz). Here, since adjacent longitudinal modes of each continuous light source are orthogonal to each other by a depolarizer, it is assumed that there occurs no FMW in the adjacent longitudinal modes. In other words, simulation is performed on the condition that each continuous light source has four longitudinal modes and longitudinal mode spacing is 0.4 nm (70 GHz). A configuration of the simulation is shown in FIG. 53.

Figure 54A:
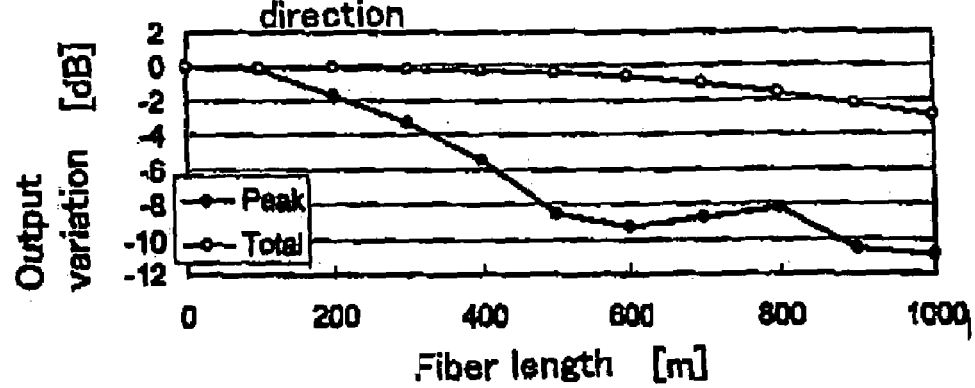
FIG. 54A shows graphs of simulated relationship of total power and peak power with fiber length when a fiber of 0/ps/nm/km in dispersion value at 1460 nm is used.
Figure 54A:
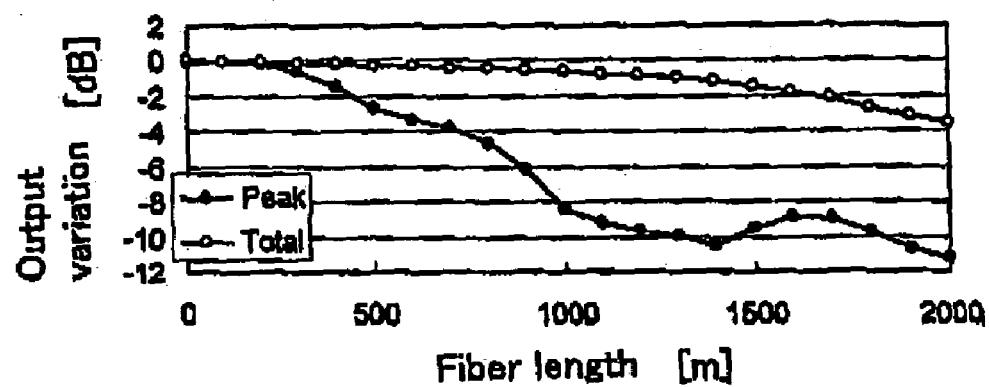
Figure 54A:
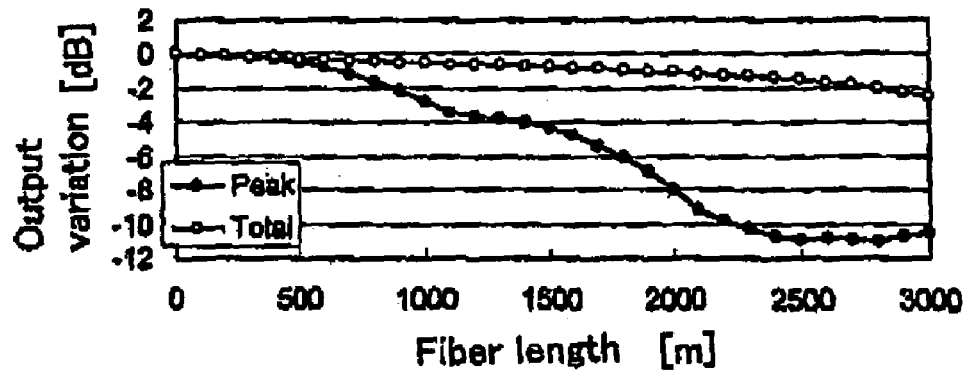
Figure 54B:
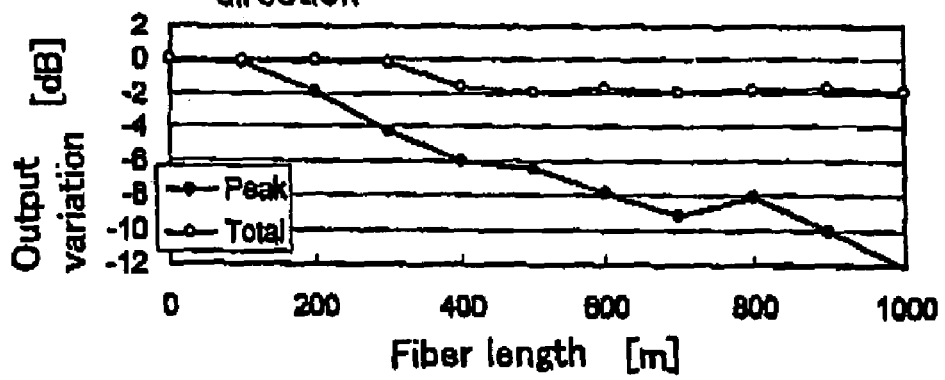
FIG. 54B shows graphs of simulated relationship of total power and peak power with fiber length when a fiber of 1/ps/nm/km in dispersion value at 1460 nm is used.
Figure 54B:
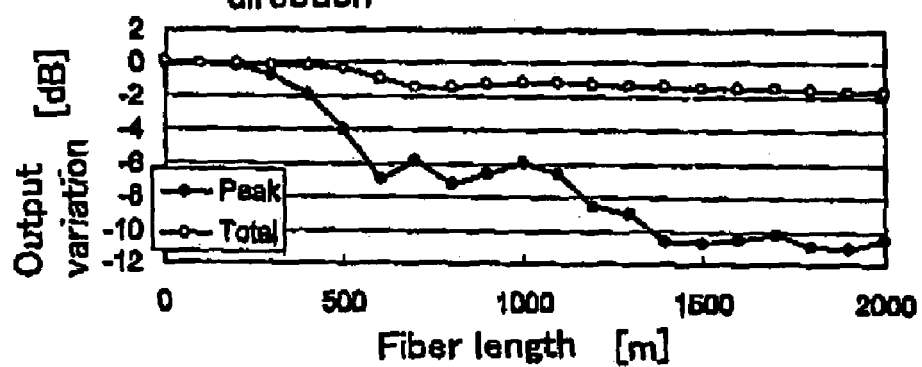
Figure 54B:
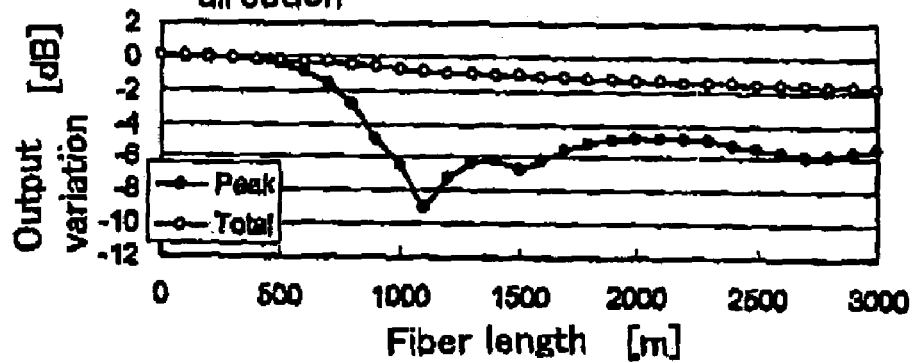
Figure 54C:
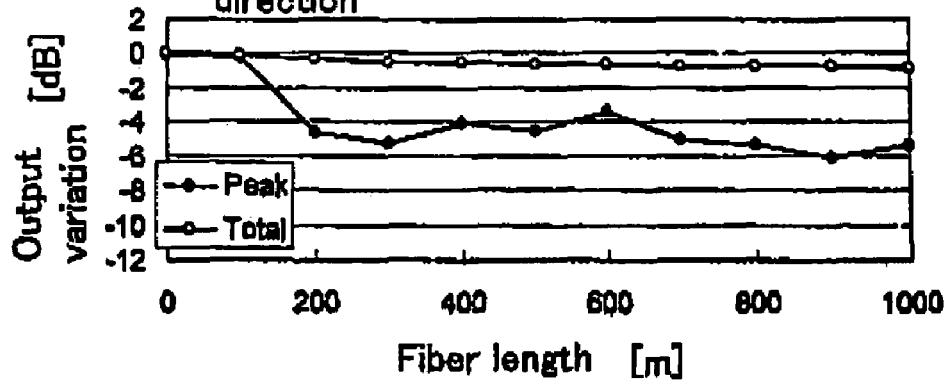
FIG. 54C shows graphs of simulated relationship of total power and peak power with fiber length when a fiber of 5/ps/nm/km in dispersion value at 1460 nm is used.
Figure 54C:
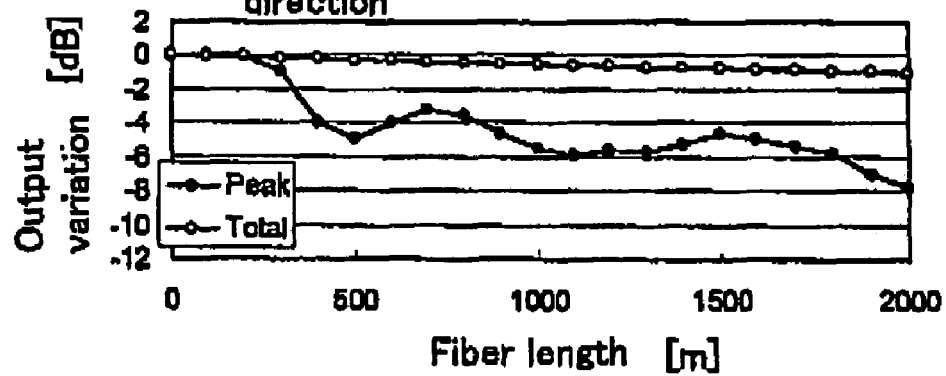
Figure 54C:
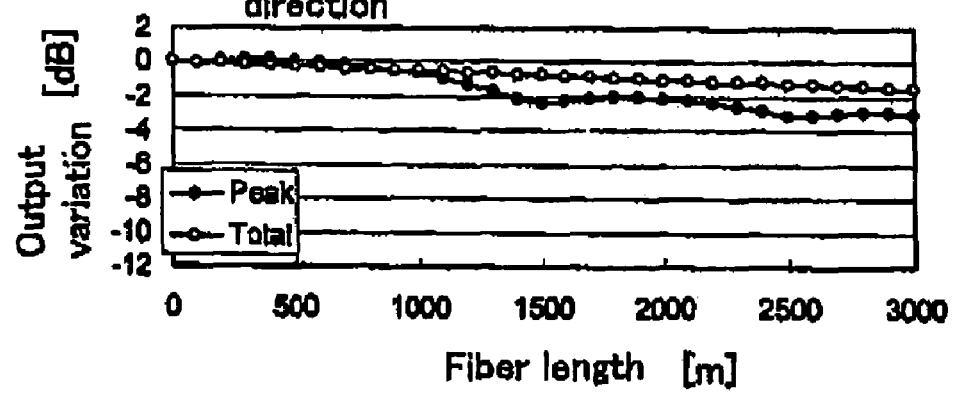

FIGS. 54A through 54C show simulation results obtained when dispersion at 1460 nm is 0, 1, 5 ps/nm/km. Variation of power at the vertical axis indicates power variation between before and after inputting into HNLF. Total power and peak power are both shown here. As an SBS suppression light source, it is effective to reduce peak power while keeping the total power. As is seen from figures, the larger the nonlinearity coefficient is and the longer the fiber is, the more the peak power is apt to be reduced. Besides, as the dispersion is increased, the peak power is apt to be not reduced much.

Figure 55:
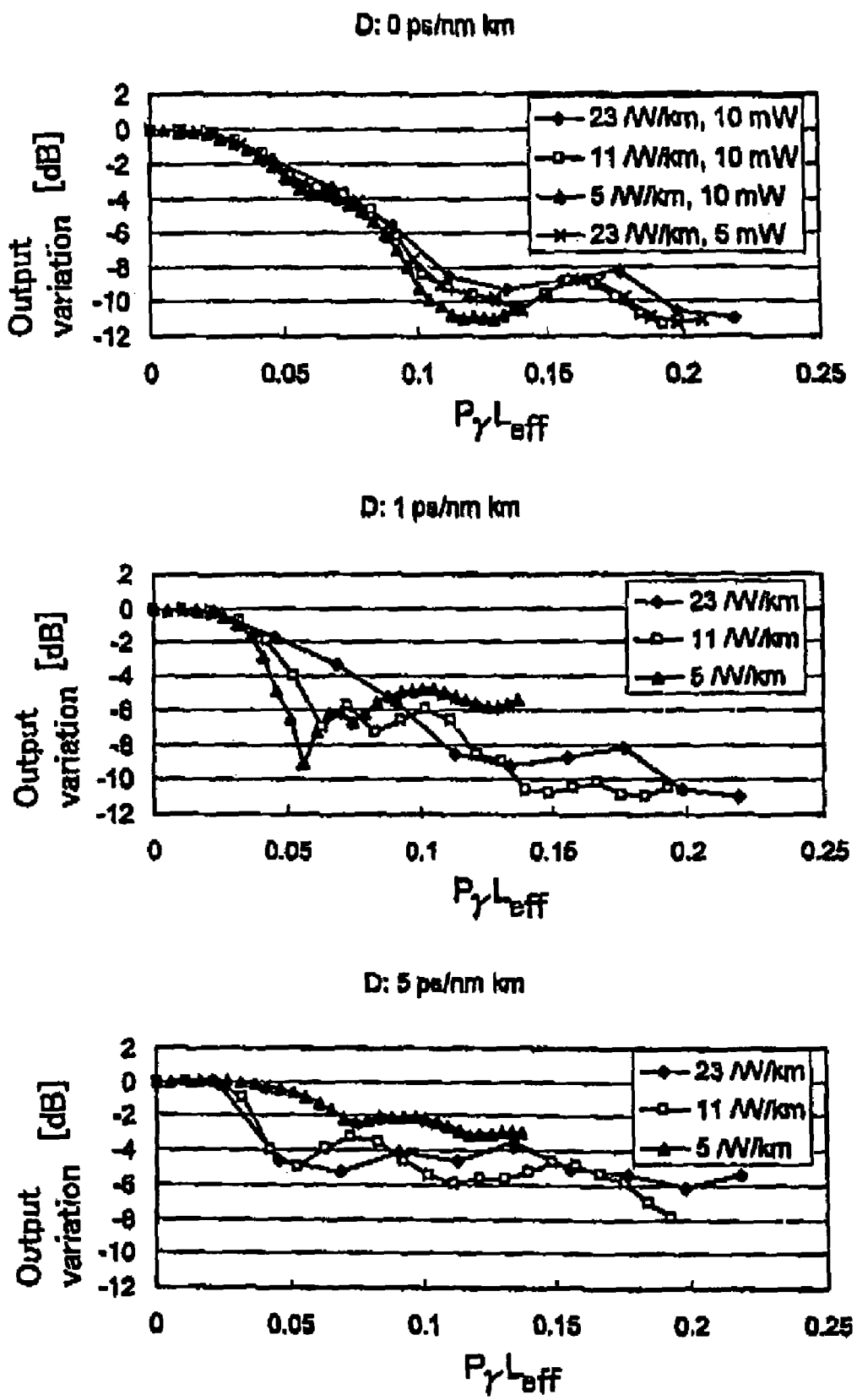
FIG. 55 shows graphs of relationship between $PL_{\it eff}$ and peak power.

In order to estimate an influence of nonlinearity coefficient, power and fiber length on variation of power, graphs with a product $P\gamma L_{eff}$ of nonlinearity coefficient, power and an effective fiber length ($L_{eff}$) as horizontal axis are shown in FIG. 55. Here, $L_{eff}=(1-\exp(-\alpha_p L))/\alpha_p$ and $\alpha_p$ denotes fiber loss. As shown in FIG. 55, when dispersion is in the vicinity of 0 ps/nm/km, the same behavior can be obtained in different nonlinearity coefficients, different fiber lengths and different longitudinal power. For example, when the longitudinal mode power is reduced by 3 dB, an optical fiber of the nonlinearity generator can be designed to be 0.05 in $P\gamma L_{eff}$ or more. When $P\gamma L_{eff}$ is in the range of between 0 and about 0.13, the peak power is apt to be reduced, and therefore, the optical fiber is preferably designed to have 0.13 or less $P\gamma L_{eff}$.

Figure 56:
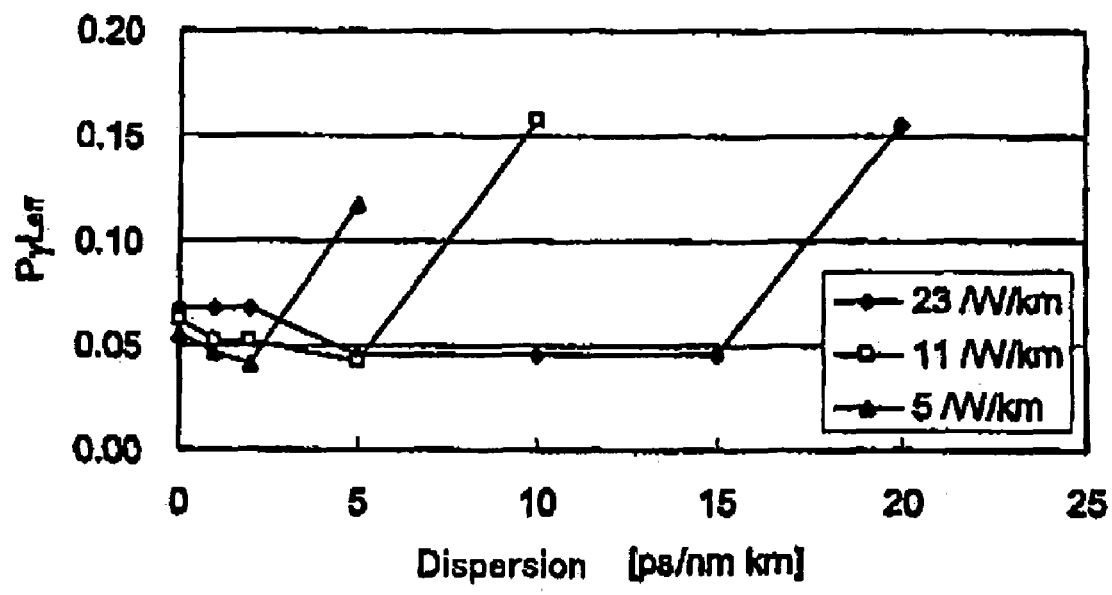
FIG. 56 is a plot of relationship between $PL_{\it eff}$ and dispersion when peak power falls by 3 dB.

In order to estimate an influence of dispersion on variation of power, $P\gamma L_{eff}$ when the peak power is reduced by 3 dB is plotted along the horizontal axis with dispersion as the vertical axis (see FIG. 56). Reduction of peak power by 3 dB means that power to be input to an optical fiber in an area where no SBS occurs becomes doubled. As is seen from FIG. 56, in an optical fiber of a certain nonlinearity coefficient, when dispersion excesses some value, the peak power is not reduced if the $P\gamma L_{eff}$ is increased rapidly. Accordingly, an optical fiber used as a nonlinearity generator is preferably a fiber with a dispersion value less than that corresponding to the rapidly increasing $P\gamma L_{eff}$. Although simulation is not performed for negative dispersion, an absolute value of dispersion is important and therefore the same tendency as positive dispersion is seen. For example, when the nonlinearity coefficient is 23 /W/km, dispersion is set to meet –15<dispersion<15, when the nonlinearity coefficient is 11 /W/km, dispersion is set to meet –5<dispersion<5 and when the nonlinearity coefficient is 5 /W/km, dispersion is set to meet –2<dispersion<2.

EXAMPLE 10

Figure 57:
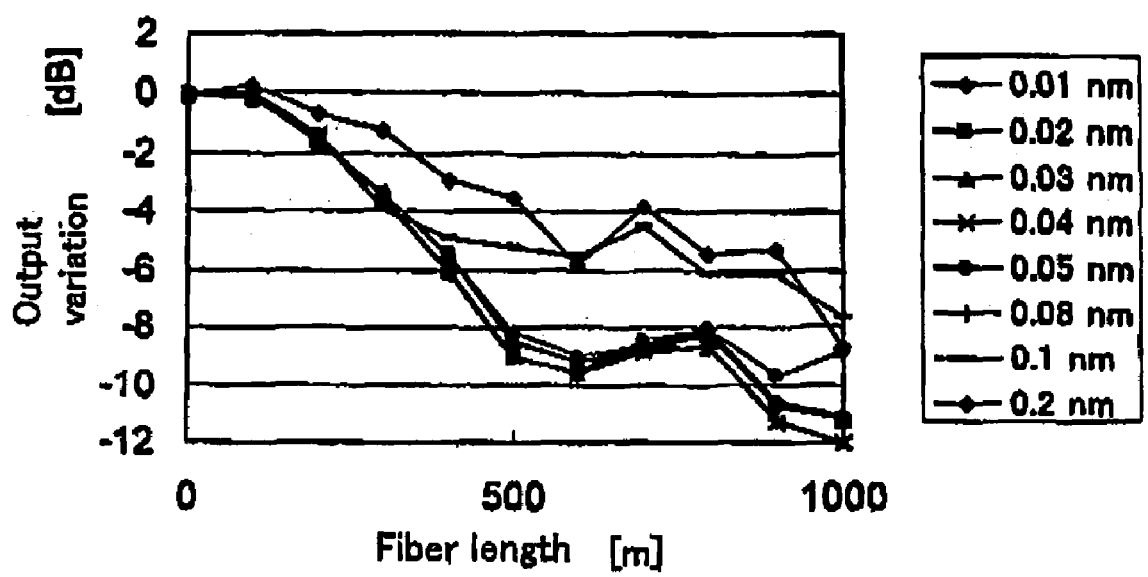
FIG. 57 is a graph showing a relationship between peak power variation and fiber length when wavelength spacing is changed.

In order to obtain an interval between two LDs for suppressing SBS in an SBS suppressing light source on FIG. 55, FWM is studied by simulations. The simulation condition is the same as that in example 4 and a fiber used here has at dispersion of 1460 nm a dispersion value of 0 ps/nm/km and nonlinearity coefficient of 23 /W/km. FIG. 57 shows peak power variation with longitudinal mode 1-m and longitudinal mode 2-m used as parameters. As shown in FIG. 57, when wavelength spacing between two LDs is 0.2 nm (35 GHz) that is one second of longitudinal mode spacing 0.4 nm (70 GHz) or 0.10 nm (17.5 GHz) that is one fourth of longitudinal mode spacing 0.4 nm (70 GHz), the peal power does not vary much. However, when the wavelength spacing is 0.05 nm (8.75 GHz) that is one eighth of longitudinal mode spacing 0.4 nm (70 GHz), the peak power can be reduced into the same value as obtained when the wavelength spacing between LDs 0.4 nm (70 GHz) is not divided by an integer number. (When in the case of 0.2 nm, 0.4 nm and 0.8 nm, the wavelength spacing 0.4 nm is divided by an integer number but a frequency can be completely divided by an integer number) if the wavelength spacing is expressed by dividing the longitudinal mode spacing 0.4 nm (70 GHz) by an integer number, the longitudinal modes after multiplexing are arranged on equally spaced grids and consequently there occurs no new FWM other than the grid. Hence, in order to suppress the peak power, longitudinal modes after multiplexing are not arranged on equally spaced grids.

(Embodiments of Optical Shaper and Optical Regenerating System)

Next description is made about embodiments of a waveform shaper and an optical regenerating system. In the figures, the same or like portions are given the same or like symbols. In addition, the figures are schematic views and it should be noted that the figures are different from actual products. Further, in the figures, there include dimensions or ratios between the figures.

This waveform shaper is used for both of waveforms shaping and compression. That is, if two waveform shapers connected, both of waveform shaping and compression can be performed.

EXAMPLE 11

Figure 58A:
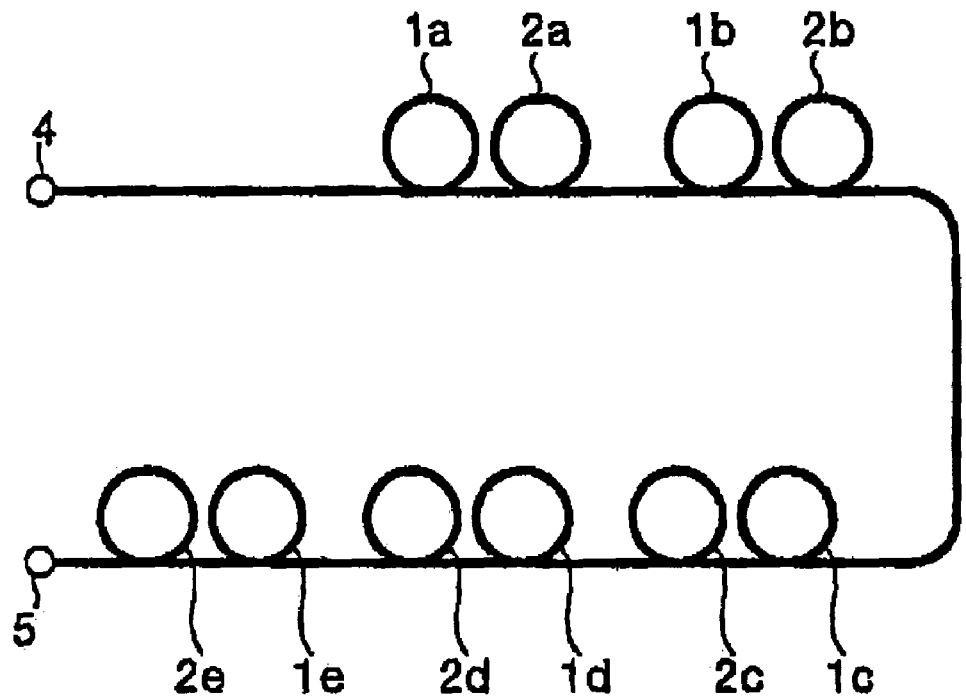
FIG. 58A is a schematic illustrating a configuration of a waveform shaper according to the example 11.

First description is made about a waveform shaper according to the example 11. This waveform shaper is provided for converting input light into soliton light. FIG. 58A illustrates a configuration of the waveform shaper and FIG. 58 is a graph showing an example of distribution of group velocity dispersion D of the waveform shaper of the example 11.

The waveform shaper of the example 11 is configured by highly nonlinear optical transmission lines 1a, 1b, 1c, 1d and 1e, for example composed of a highly nonlinear fiber, of which the nonlinearity coefficient is for example 3 km–1 W–1 or more, or preferably 5.0 km–1 W–1, and low nonlinear optical transmission lines 2a, 2b, 2c, 2d and 2e, for example composed of a single mode fiber, of which the nonlinearity coefficient is for example, 3 km–1 W–1 or less, or preferably 1 km–1 W–1 or less, the highly nonlinear optical transmission lines and the low nonlinear optical transmission lines being connected alternately as shown in FIG. 58A. Here, the number of the highly nonlinear optical transmission lines and the number of the low nonlinear optical transmission lines maybe not necessarily five or may be six or more or four or less.

Figure 58B:
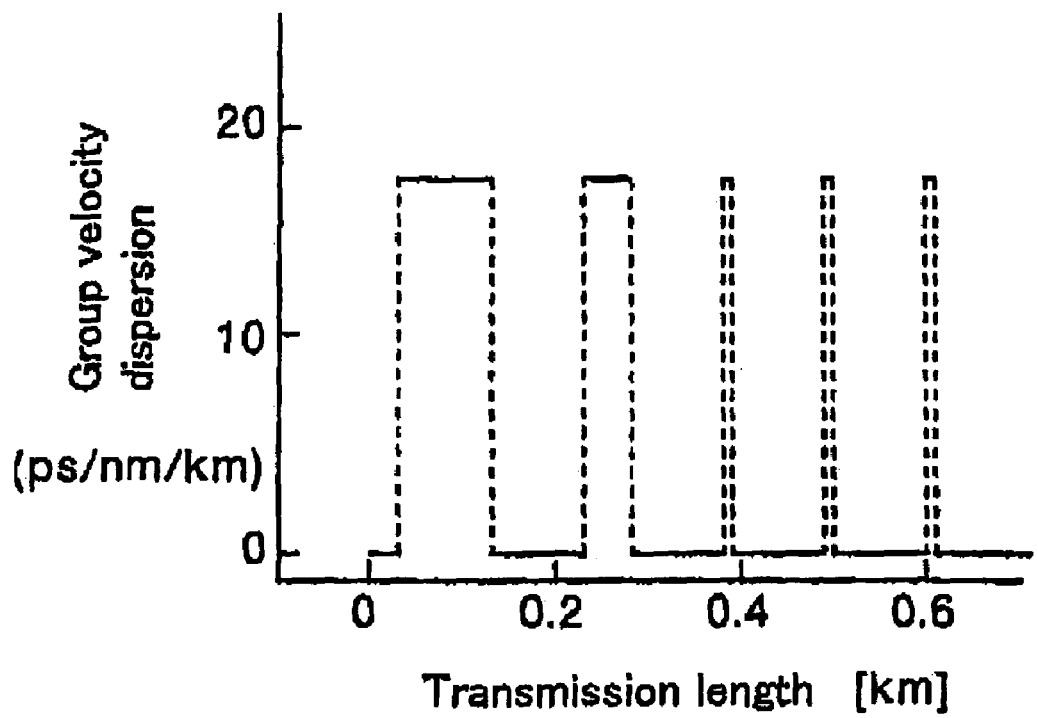
FIG. 58B is a graph showing an example of distribution of group velocity dispersion of a waveform shaper according to the example 11.

As shown in FIG. 58B, the highly nonlinear optical transmission lines 1a through 1e have second-order dispersion values β2 of which absolute values are equivalent values of 4.0 or more. The highly nonlinear optical transmission lines 1a through 1e are configured such that respective transmission path lengths 1a through Le satisfy La>Lb>Lc>Ld. For example, La=100 m, Lb=50 m, Lc=25 m, the transmission path lengths are decreased in the longitudinal direction.

The waveform shaper of the example 11 realize a equally dispersion-decreasing fiber by reducing the transmission path lengths of the highly nonlinear optical transmission lines $1a$ through $1e$ in the longitudinal direction. Specifically, when assuming that the highly nonlinear optical transmission line $1a$ and the low nonlinear optical transmission line $2a$ become a pair and the highly nonlinear optical transmission line $1b$ and the low nonlinear optical transmission line $2b$ become a pair, an average of a group velocity dispersion D ($-2\pi c/\lambda 2$) $\beta 2$) is considered, absolute values of the second-order dispersion value of pairs of the highly nonlinear optical transmission lines and the low nonlinear optical transmission lines are thought to be reduced. Accordingly, when light is input to the waveform shaper of the example 1, the light propagates in the waveform shaper and is subjected to soliton adiabatic compression so that the output light becomes soliton light.

Since the highly nonlinear optical transmission lines $1a$ through $1e$ are composed of optical transmission lines of which the nonlinearity coefficient is for example 3 km−1 W−1 or more, or preferably 5 km−1 W−1, dispersion values can be set higher. Generally, in order to perform adiabatic soliton compression, it is necessary to make the nonlinearity proportional to the dispersion in the optical transmission lines. Accordingly, when the waveform shaper is composed of the low nonlinear optical transmission lines only like in the conventional art, it is necessary to reduce the second-order dispersion value, however, in the waveform shaper of the example 11, as the nonlinearity coefficient is increased, the dispersion, or specifically, the second-order dispersion value can be increased correspondingly.

For this reason, with the waveform shaper of the present example 11, it becomes possible to increase the absolute values of the second-order dispersion values. As the highly nonlinear optical transmission lines $1a$ through $1e$ with higher absolute values of the second-order dispersion values are used, the transmission path lengths can be shortened. The soliton period which is a minimum transmission path length that is required for theoretically shaping the input light into soliton light is determined corresponding to the absolute values of the second-order, and as an absolute vale of the second-order dispersion value becomes increased, the soliton period becomes smaller. Since the waveform shaper of the example 11 uses highly nonlinear optical transmission lines $1a$ through $1e$, an absolute value of second-order dispersion value can be set larger, which results in that it is possible to realize a downsized waveform shaper with the transmission path length shorter all aver the waveform shaper.

Specifically, an example of a structure of the waveform shaper into which pulses of 3 ps with 100 mW peak power is input is described below. Used as the highly nonlinear optical transmission lines $1a$ through $1e$ is an highly nonlinear fiber of which the nonlinearity coefficient is 15 km−1 W−1 and used as the low nonlinear optical transmission lines $2a$ through $2e$ is a single mode fiber. These fibers are used to perform optimization and then, the following characteristics of the waveform shaper can be obtained. That is, the nonlinear length is 0.67 km, the dispersion distance is 0.14 km, an average of absolute values of second-order dispersion values is 4.3 ps2/km, and the soliton period is 0.25 km. Accordingly, the transmission path length of the whole waveform shaper becomes in the range of between 0.25 km and 0.67 km, which shows that the waveform shaper of this example can be dramatically shortened as compared with the conventional waveform shaper of 8 km through 20 km, thereby realizing a downsized waveform shaper.

Figure 59:
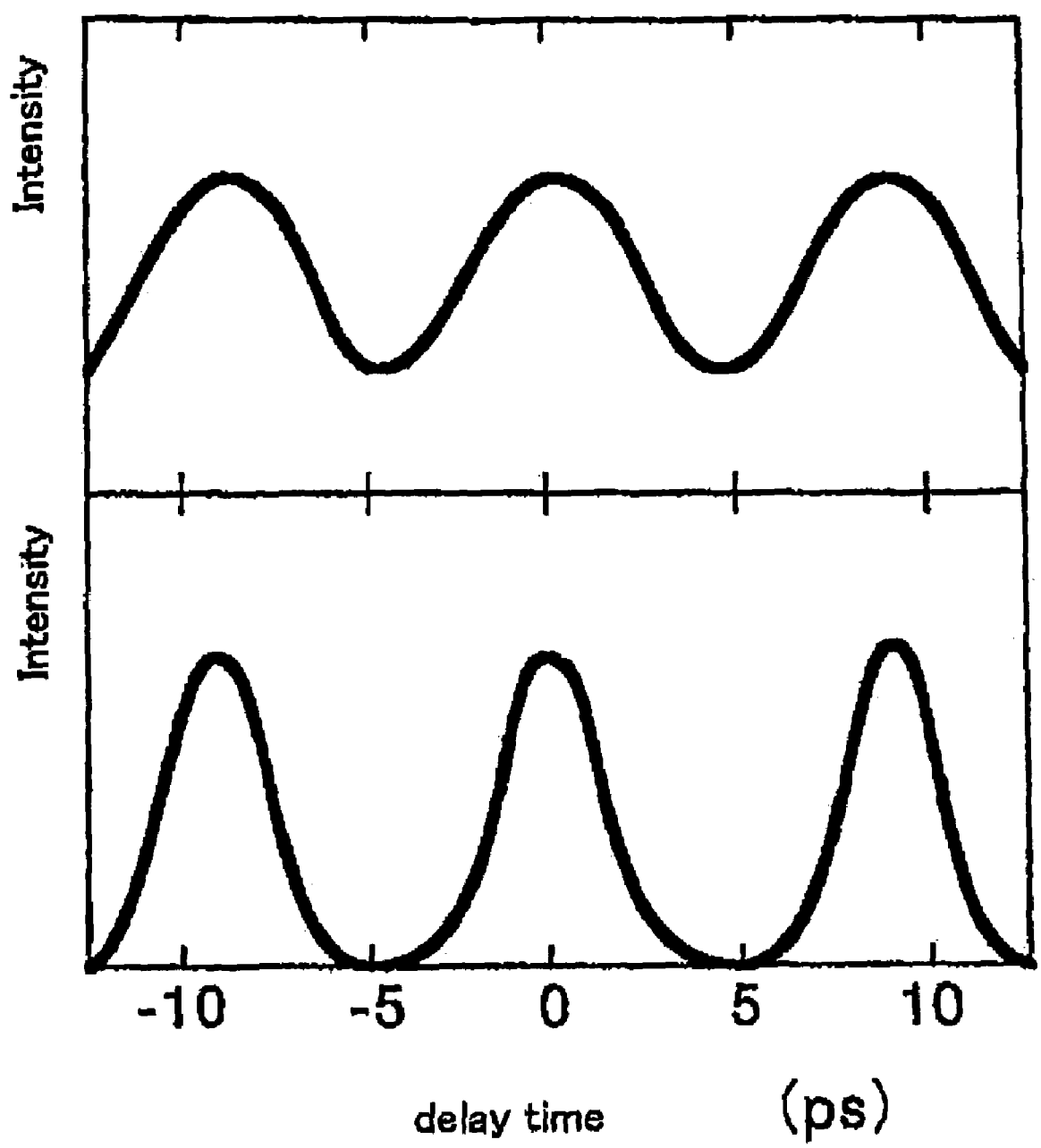
FIG. 59 is a graph for explaining autocorrelation variation of input light and output light when soliton conversion is performed by a waveform shaper according to the example 11.

FIG. 59 is a graph showing correlation change when the waveform shaper with such a structure. The upper graph of FIG. 59 shows autocorrelation of input light into the waveform shaper and the lower graph of FIG. 59 shows autocorrelation of output light from the waveform shaper. As is shown in the lower graph of FIG. 59, although the transmission path length is short, the waveform shaper with such a structure as mentioned above is able to obtain enough soliton light.

Next description is made about advantages of the waveform shaper of the present example. The waveform shaper of the example 11 has an advantage such that the waveform shaper can be downsized as a whole by shortening the entire transmission path length. The waveform shaper has another advantage that the intensity is prevented from decreasing due to an optical loss by shortening the entire transmission path length. Although an optical fiber usually used as an optical transmission line is an optical fiber with low loss, when light is propagated along the transmission path of several kilometers, an optical loss in the optical fiber becomes not negligible.

However, in the waveform shaper of the example 11, as the propagating distance of input light can be reduced into 0.25 km through 0.67 km, the optical loss can be suppressed into a practically negligible value.

In addition, since the propagating distance of input light is reduced, it becomes possible to suppress another nonlinear effect such as SBS occurrence more than that in the conventional art. As the SBS occurrence is suppressed, saturation of the intensity of soliton light to be output can be prevented thereby outputting soliton light of high intensity.

Furthermore, since the waveform shaper of the example 11 has a configuration of combination of the highly nonlinear optical transmission lines and the low nonlinear optical transmission lines, it has a side advantage. With a highly nonlinear fiber generally used in the highly nonlinear optical transmission lines, conventionally it is not easy to perform dispersion control precisely and difficult to configure a dispersion-decreasing transmission path by itself. However, in the waveform shaper of this example 11 the transmission path length of the entire nonlinear optical transmission lines is controlled to realize equivalently dispersion-decreasing transmission paths, and thereby precise dispersion control can be expected although the nonlinear fiber is used. That is, even if desired dispersion characteristic is obtained, the transmission path length can be adjusted thereby to realize equivalent dispersion control.

MODIFICATION OF EXAMPLE 11

Next description is made about a modification of a waveform shaper according to the example 11. The waveform shaper of this example includes plural highly nonlinear transmission lines having a nonlinearity coefficient that is for example 3 km−1 W−1 or more, or preferably 5 km−1 W−1, and different absolute values of the second-order dispersion values.

Figure 60:
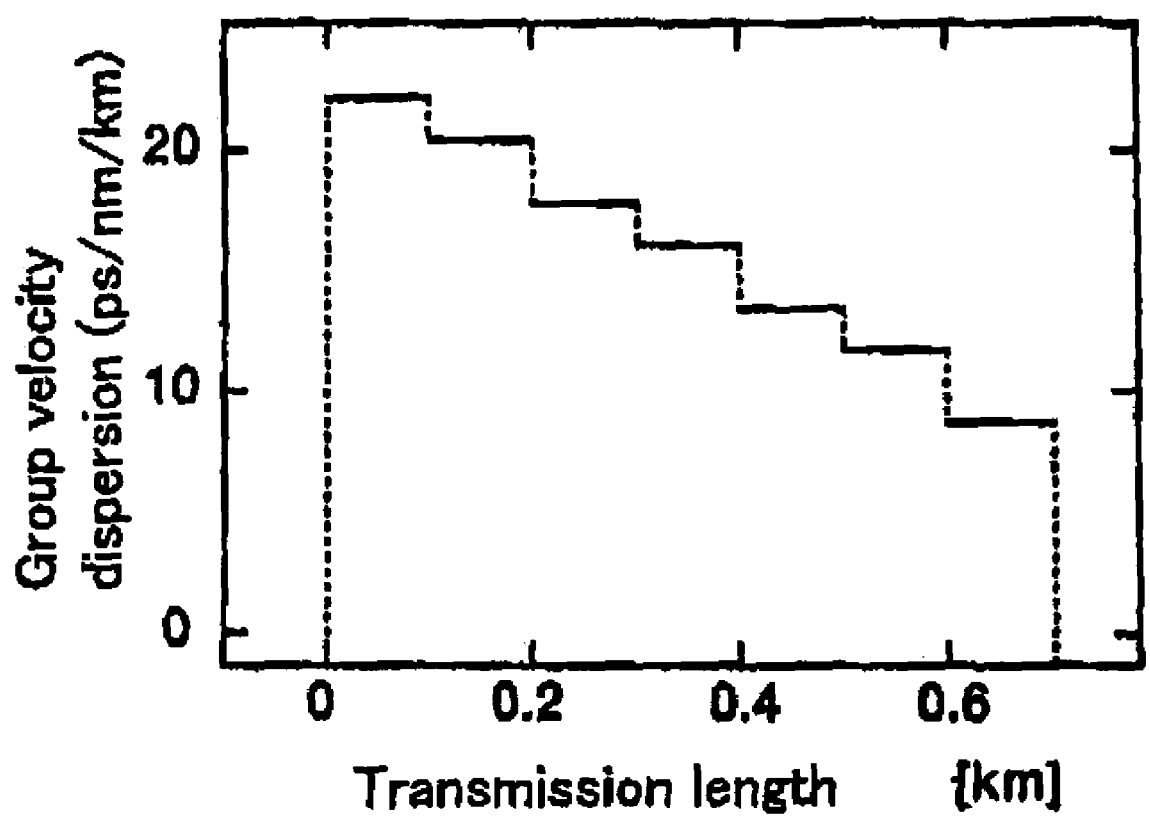
FIG. 60 is a graph showing an example of distribution of group velocity dispersion of a waveform shaper according to a modification of the example 11.

FIG. 60 is a graph showing an example of distribution of dispersion D of the waveform shaper of this modification. As shown in FIG. 60, the waveform shaper of this modification is configured to have highly nonlinear optical transmission lines which are sequentially coupled in such a manner that absolutes of the second-order dispersion values are decreased along the longitudinal direction. With the waveform shaper with such a configuration, it is possible to realize an equivalently dispersion-decreasing transmission path. In addition, since the highly nonlinear optical transmission lines are used, the transmission path length can be shortened like in the waveform shaper with a structure shown in FIG. 58A.

EXAMPLE 12

Figure 61:
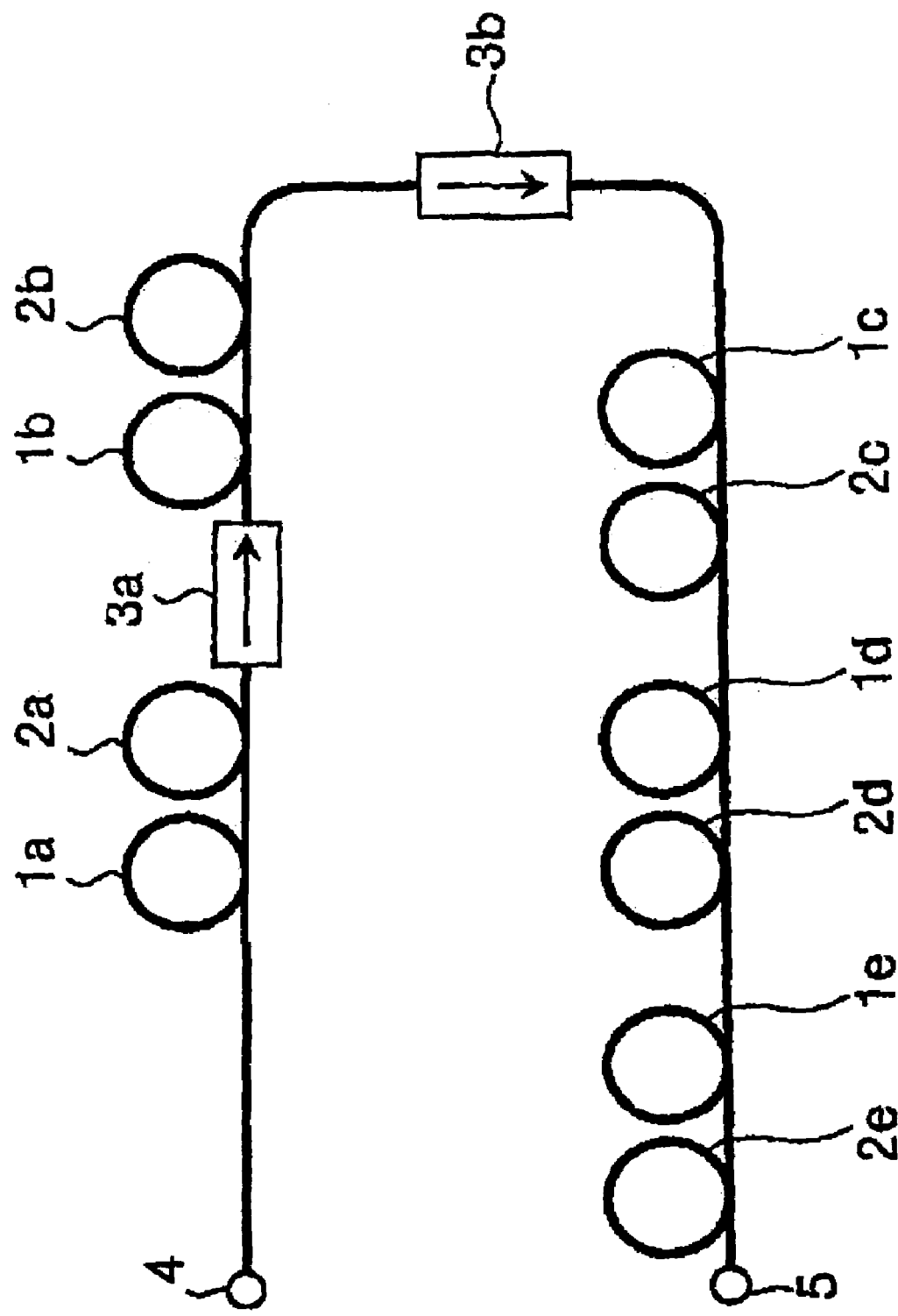
FIG. 61 is a schematic diagram illustrating a configuration of a waveform shaper according to the example 12.

Next description is made about a waveform shaper according to the example 12. FIG. 61 illustrates a configuration of the waveform shaper of the example 12. In order to suppress SBS, the waveform shaper of the example 12 is configured to have optical isolators arranged in the waveform shaper of the example 11. With reference to FIG. 61, the waveform shaper of this example 12 is described in detail below.

The waveform shaper of the example 12 is configured by highly nonlinear optical transmission lines 1*a*, 1*b*, 1*c*, 1*d* and 1*e*, for example composed of a highly nonlinear fiber, of which the nonlinearity coefficient is 5.0 km−1 W−1, and low nonlinear optical transmission lines 2*a*, 2*b*, 2*c*, 2*d* and 2*e*, for example composed of a single mode fiber, of which the nonlinearity coefficient is 1 km−1 W−1 or less, the highly nonlinear optical transmission lines and the low nonlinear optical transmission lines being connected alternately as shown in FIG. 61. In addition, the waveform shaper of this example 12 has optical isolators 3*a* and 3*b* arranged at positions away from the input end 4 by distances less than the soliton period. Specifically, the optical isolator 3*a* is arranged between the low nonlinear optical transmission line 2*a* and the highly nonlinear optical transmission line 1*b* and the optical isolator 3*b* is arranged between the low nonlinear optical transmission line 2*b* and the highly nonlinear optical transmission line 1*c*. Here, as the highly nonlinear optical transmission lines 1*a* through 1*e* and the low nonlinear optical transmission lines 2*a* through 2*e* have the same structures as those in the example 11, description thereof is omitted here.

The optical isolators 3*a* and 3*b* are provided for suppressing SBS occurrence inside the waveform shaper. The optical isolators 3*a* and 3*b* have function of allowing light propagating in the longitudinal direction to pass therethrough and cutting off reflected light, and are configure by a combination of birefringent crystal, wavelength plate, Faraday rotator and the like.

Next description is made about the reason that the optical isolators 3*a* and 3*b* are arranged away from the input end 4 by distances that are shorter than the soliton period. The inventors of the present application have measured relationship between the position where optical isolator is arranged and the intensity of input light when SBS occurs (Hereinafter referred to as "SBS threshold intensity") and optimized the arranging position of the optical isolator.

First description is made about the waveform shaper of the present example 12 which is configured to have only alternately combined highly nonlinear optical transmission lines 1*a* through 1*e* and low nonlinear optical transmission lines 2*a* through 2*e* but no optical isolator. When no optical isolator is arranged, the SBS threshold intensity becomes the order of 50 mW. When the input light intensity becomes 50 mW or more, reflected light by SBS is rapidly increased and the intensity of light output from the waveform shaper becomes saturated. Besides, when an optical isolator is arranged between the low nonlinear optical transmission line 2*d* and the highly nonlinear optical transmission line 1*e* and the SBS threshold intensity is measured, the SBS threshold intensity is 50 mW like in the case where no optical isolator is arranged. Then, when the waveform shaper is elongated and an optical isolator is arranged away from the input end 4 by a longer distance, the SBS threshold intensity becomes also 50 mW, which means that the SBS threshold intensity has not been improved by insertion of the optical isolator.

On the other hand, when an optical isolator is arranged between the low nonlinear optical transmission line 2*c* and the highly nonlinear optical transmission line 1*d*, SBS threshold intensity is improved to be 75 mW, from which it is clear that the SBS threshold intensity is improved by insertion of the optical isolator. In further measurement, when an optical isolator is arranged between the low nonlinear optical transmission line 2*b* and the highly nonlinear optical transmission line 1*c*, SBS threshold intensity is 100 mW, and when an optical isolator is arranged between the low nonlinear optical transmission line 2*a* and the highly nonlinear optical transmission line 1*b*, SBS threshold intensity is 150 mW. These measurement results show that when an optical isolator is arranged away from the input end 4 by a distance that is a predetermined value or less, the SBS threshold intensity is improved to a given degree.

From consideration of the insertion position of an optical isolator which brings about improvement of SBS threshold intensity based on these measurement results, it becomes clear that it is effective that the optical isolator is arranged away from the input end 4 by a distance shorter than the soliton period. As explained above, the soliton period is a value corresponding to the transmission path length required for input light to be converted into soliton light. That is, as SBS always occurs on the way of the input light being converted into the soliton light, if an optical isolator is arranged away from the input end 4 by a distance shorter than the soliton period, SBS can be prevented from occurring. On the other hand, after input light is converted into soliton light, there occurs almost no SBS, and if an optical isolator is arranged away from the input end 4 by a distance longer than the soliton period, the SBS threshold intensity is hardly improved.

Accordingly, since the optical isolators 3*a* and 3*d* are arranged away from the input end 4 by distances shorter than the soliton period, the SBS threshold intensity is improved and the waveform shaper of this example 12 is allowed to output soliton light of high intensity.

Figure 62A:
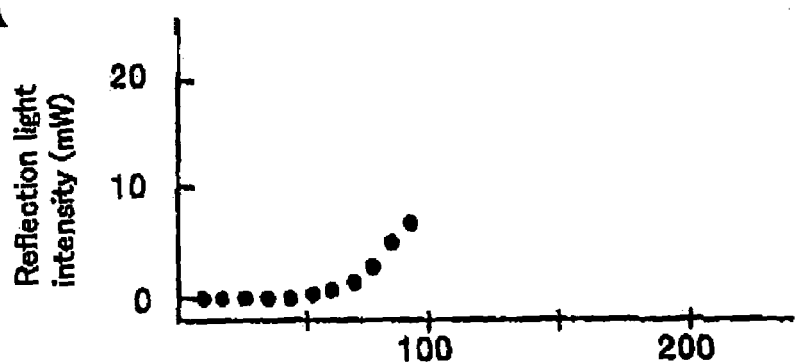
FIGS. 62A to 62D are graphs for explaining intensity variation of reflection light depending on presence of absence of an optical isolator and on where an optical isolator is arranged.
Figure 62B:
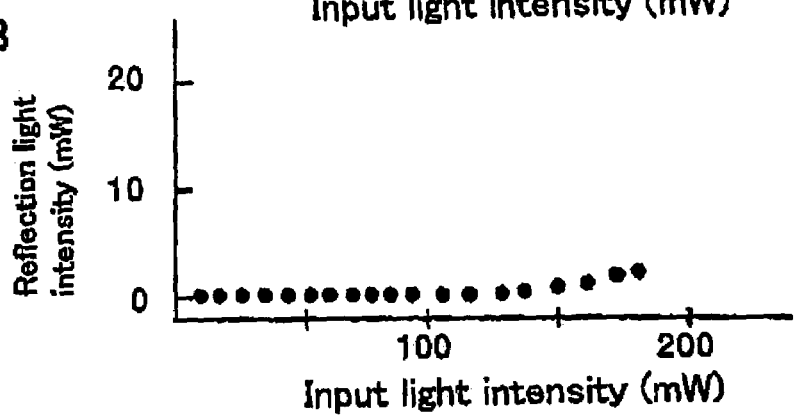
Figure 62C:
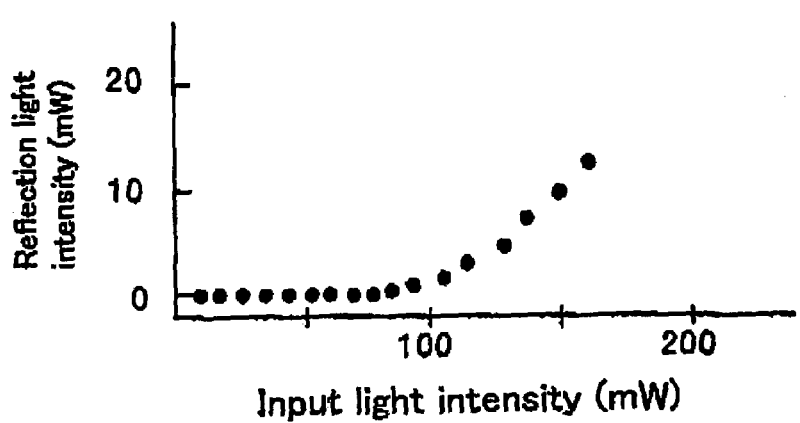
Figure 62D:
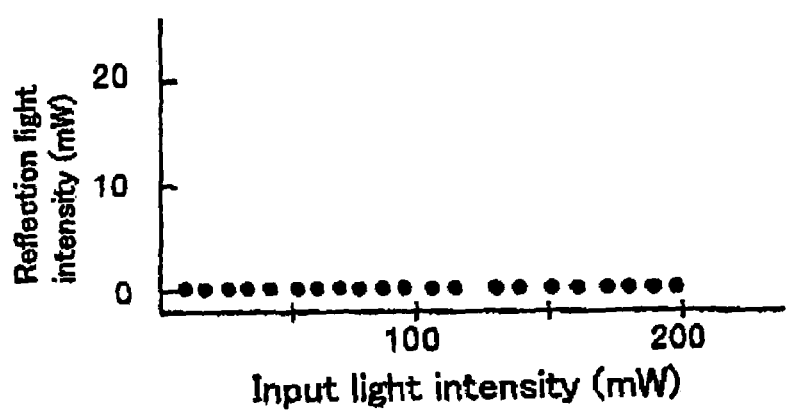

FIGS. 62A to 62D are graphs for explaining the degree of improvement of the SBS threshold intensity by arrangement of an optical isolator. Specifically, FIG. 62A shows the intensity of reflected light in a waveform shaper in which no optical isolator is arranged, while FIGS. 62B through 62D show the intensity of reflected light when the optical isolator 3*a* is only arranged, the intensity of reflected light when the optical isolator 3*b* is only arranged, and the intensity of reflected light when the optical isolators 3*a* and 3*b* are arranged, respectively.

As is seen from the graph of FIG. 62A, when no optical isolator is arranged, the intensity of reflected light due to SBS is rapidly increased in an area where the intensity of input light is 50 mW or more, that is, the SBS threshold intensity becomes 50 mW. On the other hand, as shown in FIGS. 62B through 62D, insertion of an optical isolator contributes to significant improvement of the SBS threshold intensity. Particularly, when both of the optical isolators 3*a* and 3*b* are arranged, the SBS threshold intensity is improved to be 200 mW or more. As is clear from the graph of FIG. 62D, in order to suppress SBS occurrence effectively, it is preferable that plural optical isolators are arranged away from the input end 4 by distances shorter than the soliton period.

Figure 63A:
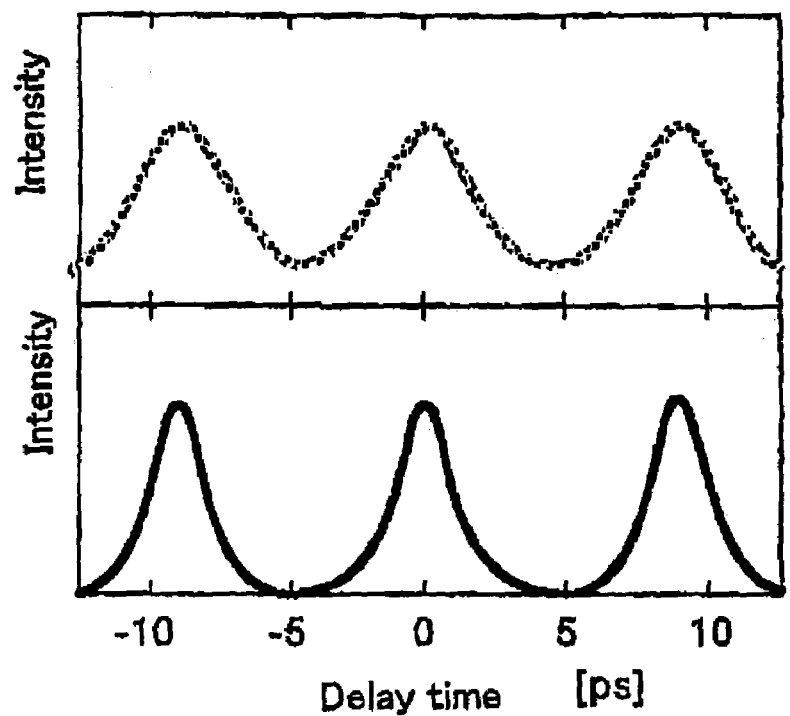
FIG. 63A is a graph showing autocorrelation of output light.
Figure 63B:
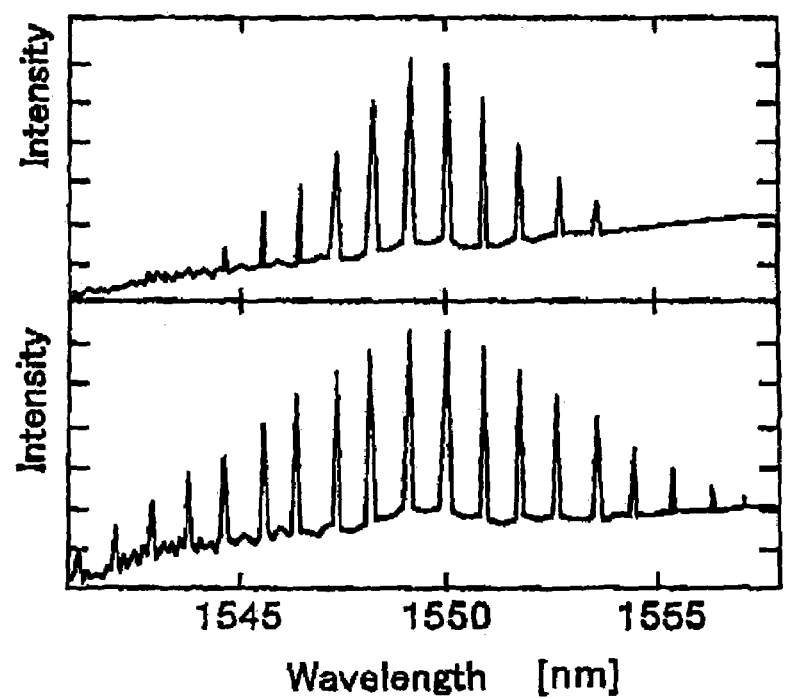
FIG. 63B is a graph showing a spectral profile of output light.

Next, measurement is carried out on optical characteristics of output light obtained by the waveform shaper of the present example 12 when light of high intensity is input. FIG. 63A is a graph showing autocorrelation traces of the output light, and the upper graph of FIG. 63A is of the waveform shaper with no optical isolator while the lower graph of FIG. 63A is of the waveform shaper of the present example 12. FIG. 63B is a graph showing a spectrum of the output light, and the upper graph of FIG. 63B is of the waveform shaper with no optical isolator while the lower graph of FIG. 63B is of the waveform shaper of the present example 12.

When light of high intensity is input, in the case of a waveform shaper with no optical isolator, since SBS occurs and the optical intensity in the optical transmission line is limited. Hence, the optical intensity of propagating light is limited to a given value and enough intensity can not be obtained. Because of this, soliton conversion cannot be performed sufficiently, which results in as shown in the upper graph of FIG. 63A and the upper graph of FIG. 63B.

On the other hand, in the waveform shaper of the example 12 since optical isolators are arranged, SBS occurrence during light propagation can be suppressed. For this reason, there occurs a soliton compression phenomenon and desired picosecond soliton pulse trains can be obtained as seen in the lower graph of FIG. 63A and the lower graph of FIG. 63B.

Here, the optical isolator 3a or the optical isolator 3b may be arranged at a midway of a highly nonlinear optical transmission line or a low nonlinear optical transmission line. However, they are preferably arranged at different connecting portions of the optical transmission line. If they are arranged at the connecting portions, a complicated procedure is omitted in the waveform shaper manufacturing method, and for example, if an optical isolator is formed with both ends of different optical transmission lines used as both side pigtails, it becomes possible to reduce the number of fusion splicing points between the different optical transmission lines. There occurs a given optical loss at a fusion splicing portion between the optical transmission lines. Since the number of fusion splicing points is reduced, the waveform shaper of the present example 12 has an advantage in reducing optical loss in the waveform shaper.

In addition, as shown in FIG. 61, when the waveform shaper is formed by combination of highly nonlinear optical transmission line segments and low nonlinear optical transmission line segments, an optical isolator is preferably arranged anterior to a highly nonlinear optical transmission line segment. Since SBS is one nonlinear optical phenomenon, SBS often occurs in the highly nonlinear optical transmission line of which the nonlinearity coefficient is high. Therefore, if an optical isolator is arranged anterior to a highly nonlinear optical transmission line segment, reflected light occurring in the highly nonlinear optical transmission line can be cut off thereby preventing SBS from occurring effectively.

Here, if an optical isolator is inserted in a waveform shaper according to a modification of the example 11, SBS can be suppressed effectively. Also in this case, if an optical isolator is arranged away from the input end by a distance shorter than the soliton period, it becomes possible to improve SBS threshold intensity and to output soliton light with high optical intensity.

EXAMPLE 13

Figure 64:
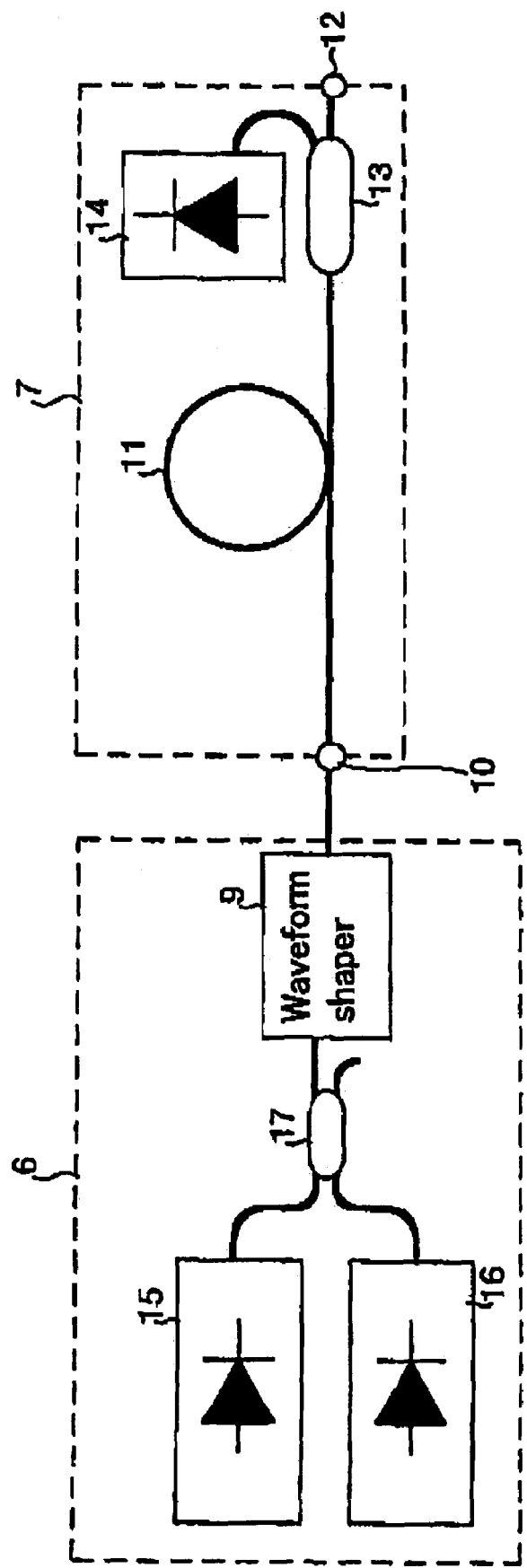
FIG. 64 is a schematic diagram illustrating a configuration of an optical pulse generator according to the example 13.

Next description is made about an optical pulse generator according to the example 13. FIG. 64 us a schematic view illustrating a configuration of the optical pulse generator of the example 13. The optical pulse generator can be structurally divided into a soliton light source 6 and an optical pulse compressor 7. The soliton light source 6 is for supplying soliton light to the optical pulse compressor 7 and the optical pulse compressor is for performing adiabatic soliton compression on the input soliton light to compress the pulse width.

The soliton light source includes a light emitting portion 8 for outputting beat light, for example, and a waveform shaper 9. The optical pulse compressor 7 includes an input end 10 for inputting light from the outside, a pulse compressing transmission path 11 connected to the input end 10 and an output end 12. And, a multiplexer 13 is arranged between the pulse compressing transmission pwth 11 and the output end 12. A pumping light source 14 is connected to the multiplexer 13 so as to supply pumping light to the pulse compressing transmission path 11.

First description is made about the soliton light source 6. The light emitting portion 8 of the soliton light source 6 used here in the example 13 is one that outputs beat light. Specifically, the light emitting portion 8 has a configuration including a semiconductor laser device 15 for outputting laser light of frequency f0, a semiconductor laser device 16 for outputting laser light of frequency f0+Δf, and a multiplexer 17 for multiplexing laser light outputs from the semiconductor laser devices 15 and 16. Since the laser light of frequency f0 and the laser light of frequency f0+Δf are combined, the light emitting portion 8 has a function of outputting beat wave having a repetition period of Δf.

The waveform shaper of the soliton light source 6 may have any structure, and preferably uses a waveform shaper according to the embodiment 1 or 2. Use of a waveform shaper according to the embodiment 1 or 2 allows a downsized device to supply soliton light of high output.

Next description is made about a structure of the optical pulse compressor 7. First, the pulse compressing transmission line 11 is formed by an optical fiber with abnormal dispersion, that is a positive dispersion value. Further, the pulse compressing transmission path 11 has a nonlinearity coefficient γ which is, for example, 3 km−1×W−1 or more, or preferably, 5.0 km−1 W−1 or more, or more preferably, 15.0 km−1 W−1. Description below treats the pulse compressing transmission line 11 with nonlinearity coefficient γ of 15.0 km−1 W−1.

The pumping light source 14 is for supplying pumping light to the pulse compressing transmission path 11. Specifically, the pumping light source 14 is composed of a semiconductor laser device, for example and has a function of outputting laser light of a predetermined wavelength to the pulse compressing transmission path 11. Raman amplification adopted in the embodiment 3 is counter-pumping Raman amplification of which the propagating direction of pumping light is opposed to the propagating direction of light amplified. However, Raman amplification adopted here may be co-pumping Raman amplification of which the propagating direction of pumping light is the same as the propagating direction of light amplified or bi-directional Raman amplification which is a combination of co-pumping system and counter-pumping system.

Light output from the pumping light source 14 has a wavelength about 100 nm shifted to the short wavelength side with respect to the wavelength of light to be amplified. This is because in Raman amplification, a peak amplification gain is obtained at a wavelength 100 m shifted to the long wavelength side with respect to the wavelength of the pumping light.

Then, an operation of the optical pulse compressor according to the example 13 is described. First, soliton light which satisfies a predetermined condition is input to the pulse compressing transmission path 11 via the input end from the outside. As an example taken, soliton light input to the optical pulse compressor of the example 13 satisfies a basic soliton condition. The input soliton light is subjected to adiabatic soliton compression in the pulse compressing transmission path 11 and pulse-compressed light is output to the outside from the output end 12.

Adiabatic soliton compression in the pulse compressing transmission path 11 is described in detail below. Soliton light which satisfies a basic soliton condition has a property of maintaining the basic soliton condition, that is, the condition such that the soliton order becomes 1, while propagating in the pulse compressing transmission path 11 even after being input the optical pulse compressor of the example 13. Soliton order N is obtained from the following equation (1).

$$N=(\gamma PT2/|\beta2|)^{1/2} \quad (1)$$

Here, γ denotes a nonlinearity coefficient of the pulse compressing transmission path 11, and β2 is a second-order dispersion value of the pulse compressing transmission path 11. P denotes peak intensity of soliton light in the pulse compressing transmission path 11 and T denotes a pulse width of the soliton light in the pulse compressing transmission path 11.

Since soliton light propagating along the pulse compressing transmission path 11 has a property of maintaining the soliton order 1, the left side value of the equation (1) becomes 1 throughout the pulse compressing transmission path 11. Besides, in the pulse compressing transmission path 11, Raman amplification occurs by the pumping light source 14 which supplies pumping light and the peak intensity P of the propagating soliton light is increased.

Accordingly, in the right side of the equation (1), the peak intensity P increases as the soliton light propagates. On the other hand, in order to keep the basic soliton condition, N=1 is kept while propagating along the pulse compressing transmission path 11, and the nonlinearity coefficient γ does not vary. In order to keep the equality sign of the equation (1), the pulse width T of the propagating soliton light decreases and therefore, compression of the pulse width T is performed.

Since the optical pulse compressor of the present example 13 has a high nonlinearity coefficient γ, Raman amplification subjected to the input soliton light can be performed effectively with a short fiber length. As Raman amplification is one kind of the nonlinear phenomena, the larger the nonlinearity coefficient γ is, the more amplification efficiency per unit fiber length is enhanced.

This makes it possible to shorten the fiber length required to obtain a predetermined peak intensity P, and the fiber length of pulse compressing transmission line 11 used for optical pulse compression can be set to be extremely short, or specifically, the order of 2 km. This is an extremely important advantage in term of downsizing of the optical pulse compressor. Due to this advantage, the pulse compressing transmission path 11 can be used to realize a downsized optical pulse compressor. More specifically, it is possible to reduce the length of the pulse compressing transmission path 11 by one tenth as compared with the length of the conventional optical pulse compressor, thereby realizing a pulse generator with a downsized optical pulse compressor.

Figure 65:
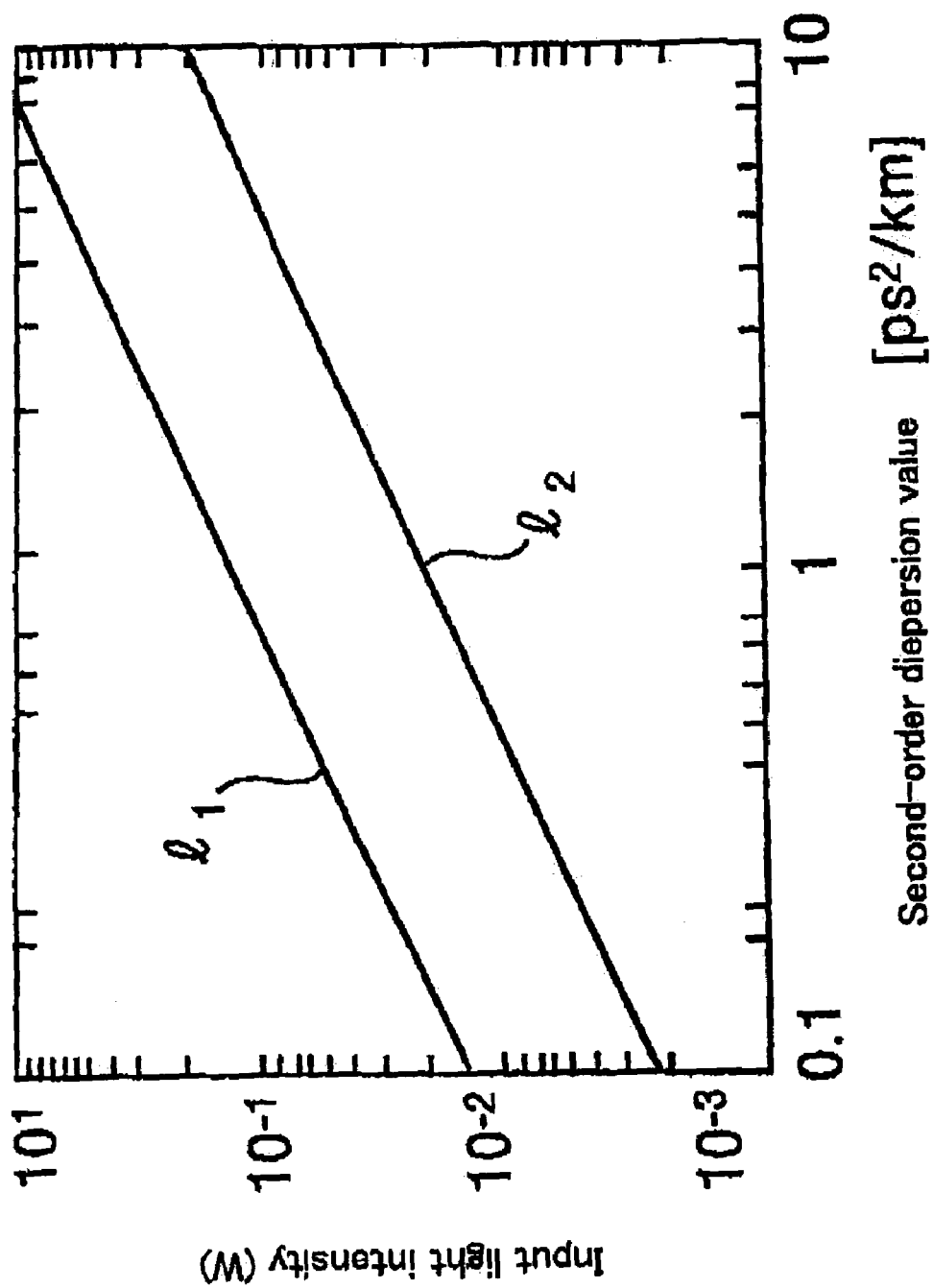
FIG. 65 is a graph showing dependence of intensity of input light required for basic soliton pumping on an absolute value of second-order dispersion value $\beta_2$.

In addition, according to the optical pulse compressor 7, it is possible, with respect to the an absolute value of a given second-order dispersion value β2, to reduce the intensity of input soliton light as compared with that of the conventional art. FIG. 65 is a graph showing dependence of the intensity of input light necessary for basic soliton pumping on an absolute value of the second-order dispersion value β2. In FIG. 65, the curve line l1 is of the conventional optical pulse compressor and the curve line l2 denotes the optical pulse compressor 7 of the present example 13.

As is seen from FIG. 65, for example, when |β2|=1 ps2/km is satisfied, the intensity of input light required is about 150 mW for the conventional optical pulse compressor while the intensity of input light required for pulse compression is only about 20 mW for the optical pulse compressor 7 of the present example 13. As a semiconductor laser device used as the light source can easily provide an output of about 20 mW with low input current, the optical pulse generator of the present example 13 does not require an optical amplifier, thereby realizing low power consumption in the optical pulse generator.

Further, since the optical pulse compressor 7 of the present example 13 has a higher nonlinearity coefficient γ, it is possible to use an optical fiber with a second-order dispersion value β2 higher than that of the conventional optical pulse compressor. As described above, input soliton light is preferably satisfies the basic soliton condition, or more specifically, N=1 in the equation (1). Accordingly, when the nonlinearity coefficient γ is small, in order that the second-order dispersion value β2 may be set larger, the intensity of input soliton light needs to be high, and therefore, generally it is required to reduce the second-order dispersion value β2. Since the optical pulse compressor 7 of the present example 13 has a high nonlinearity coefficient γ, if the second-order dispersion value β2 is correspondingly set to be high, the intensity of input soliton light does not need to high, thereby allowing highly-efficient pulse compression by low-intensity input light.

Next description is made about a merit by a higher second-order dispersion value β2 in the pulse compressing transmission path 11. Compression of the pulse width by adiabatic soliton compression is basically performed in accordance with the above-mentioned equation (1), however, it is known pulse width compression is actually limited by higher-order dispersion values. More specifically, when the third-order dispersion value $\beta_3$ and the fourth-order dispersion value $\beta_4$ are predetermined values or more as compared with the second-order dispersion value $\beta_2$, compression of the pulse width of soliton light can not be performed effectively. When the pulse compressing transmission path 11 used has a high second-order dispersion value $\beta_2$ as described in the example 13, higher-order dispersion values are relatively lowered, which makes it possible to eliminate the influence of the higher-order dispersion values when pulse compression of soliton light is performed. Further, the third-order dispersion value $\beta_3$ of the pulse compressing transmission path 11 can be set lower than that of the conventional transmission path and for example, the third-order dispersion value $\beta_3$ is one third of the conventional transmission path, that is, about 0.03 ps3/km. This makes it possible to compress the pulse width of output light into a smaller value.

Figure 66:
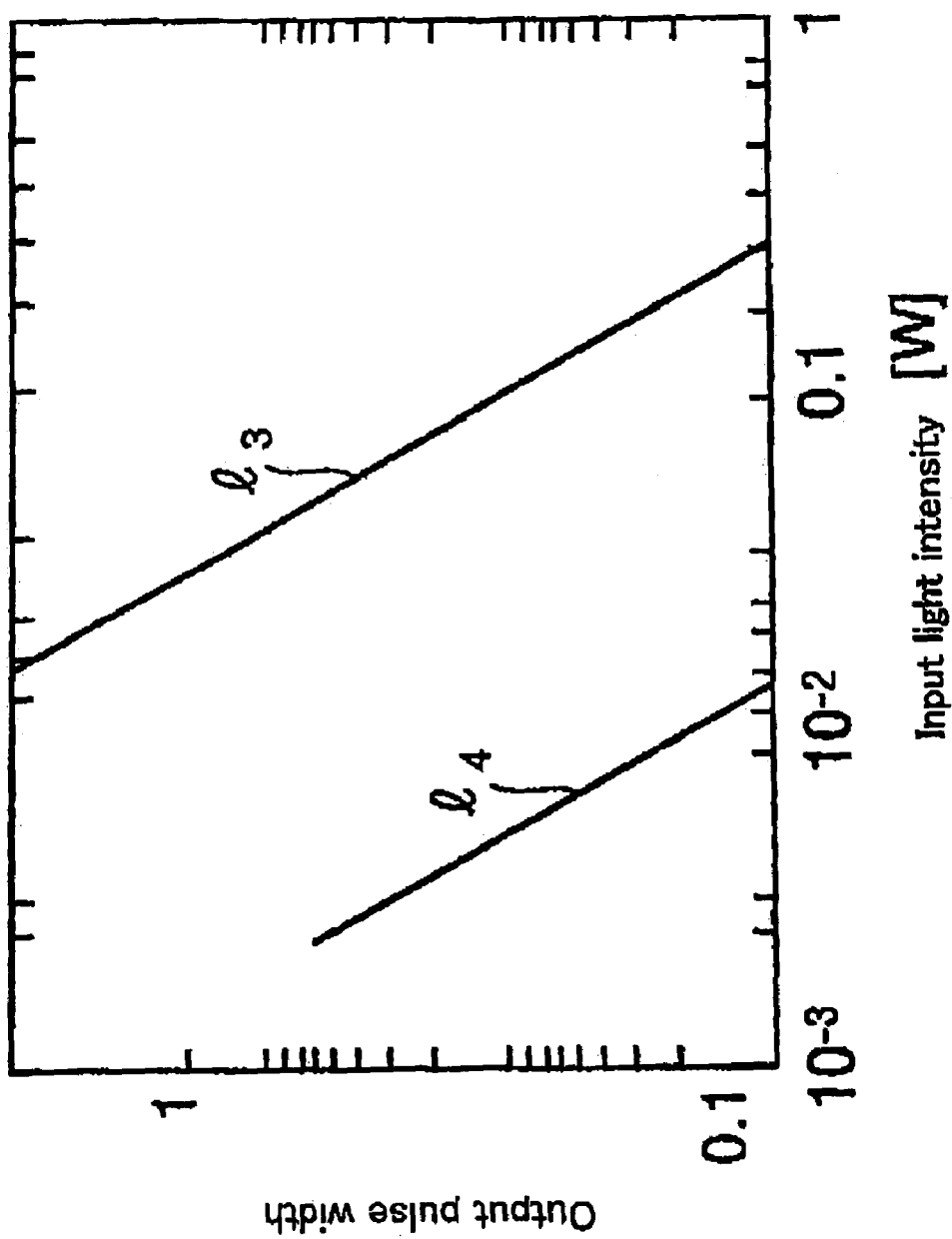
FIG. 66 is a graph showing a relationship between the intensity of input light into the pulse compressing transmission path and the limit of compression pulse width.

FIG. 66 is a graph showing the relationship between the intensity of input light into the pulse compressing transmission path 11 and the limit of compression pulse width, in which the curve line l3 is of the optical pulse compressor of the present embodiment 13 and the curve line l4 is of the optical pulse compressor using a conventional dispersion shift fiber for comparison. As is clear from the curve lines l3 and l4, the optical pulse compressor of the present embodiment 13 is allowed to perform pulse compression into narrower width range for the same input light intensity. Specifically, in the case of the input light intensity of about 10 mW, when the conventional dispersion shift fiber is used, pulse width compression even into a few ps is difficult, while pulse width compression into 200 fs is possible for the optical pulse compressor of the present embodiment 13.

Here, when the pulse width is compressed into 100 fs, the input light intensity need to be about 250 mW for the conventional fiber, while only 46 mW of the intensity is enough for the optical pulse compressor of the present embodiment 13 when the nonlinearity coefficient γ satisfies γ=15 km−1

W−1 and the third-order dispersion value $\beta_3$ satisfies $\beta_3=0.1$ ps3/km. Further in the optical pulse compressor of the present embodiment 13, when the nonlinearity coefficient γ satisfies γ=15 km−1 W−1 and the third-order dispersion value $\beta_3$ satisfies $\beta_3=0.03$ ps3/km, only 15 mW of the input light intensity is enough, and when the nonlinearity coefficient γ satisfies γ=25 km−1 W−1 and the third-order dispersion value $\beta_3$ satisfies $\beta_3=0.03$ ps3/km, even 8.3 mW of the input light intensity is enough to achieve 100 fs pulse width.

Here, the pulse compressing transmission path 11 is allowed to have a higher-order dispersion value lower than that of the conventional dispersion shift fiber. For example, The third-order dispersion value $\beta_3$ of the conventional dispersion shift fiber is generally 0.1 ps3/km while the third-order dispersion value $\beta_3$ of the pulse compressing transmission path 11 can be reduced to about 0.03 ps3/km. Since the third-order dispersion value $\beta_3$ can be reduced, in the pulse compressing transmission path 11 it is possible to increase the second-order dispersion value $\beta_2$ relatively as compared with the higher-order dispersion values. For example, when the third-order dispersion value $\beta_3$ of the pulse compressing transmission path 11 is 0.03 ps3/km, the second-order dispersion value $\beta_2$ required for pulse width compressing into 100 fs is about 2 ps2/km for the conventional dispersion shift fiber, while about 0.6 ps2/km of the second-order dispersion value $\beta_2$ is sufficient for pulse width compressing into 100 fs of the optical pulse compressor of the present example 13.

MODIFICATION OF EXAMPLE 13

Figure 67:
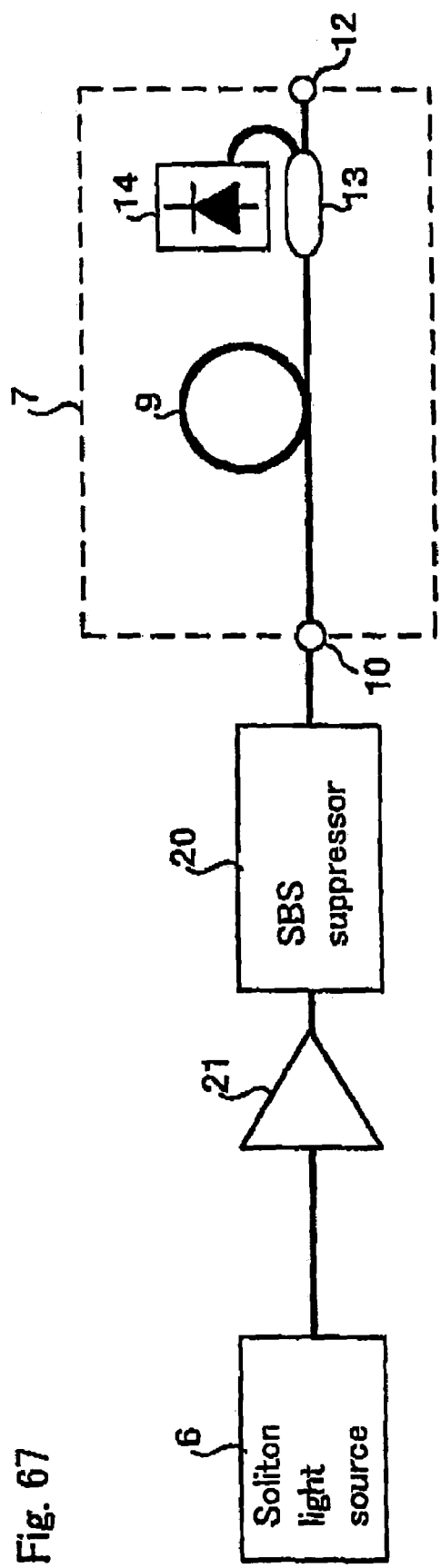
FIG. 67 is a schematic diagram illustrating a configuration of an optical pulse generator according to a modification of the example 13.

Next description is made about a modification of an optical pulse generator according to the example 13. FIG. 67 illustrates a structure of an optical pulse generator according to the modification. In modification, provided between a soliton light source 6 and an optical pulse compressor 7 is an SBS Stimulated Brillouin Scattering) suppressing portion 20 for suppressing occurrence of SBS and an optical amplifier 21. Here, the SBS suppressing portion 20 may be a conventional one or may be configured by arranging an optical isolator in the optical transmission line like in the example 2. Besides, the optical pulse generator may be configured such that either the SBS suppressing portion 20 or the optical amplifier 21 is arranged.

Up to this point the examples 11 through 13 have been described. However, the present invention is not limited to these examples. Various modifications and examples could be conceived by a person skilled in the art. For example, in the examples 11 and 12, another pair of a highly nonlinear optical transmission line and a low nonlinear transmission path may be arranged anterior to the input end 4. Here, if the highly nonlinear optical transmission line arranged anterior to the input end is shorter than the highly nonlinear optical transmission line 1a, soliton conversion can be performed more effectively.

In addition, in the example 13, the waveform shaper 9 and the optical pulse compressor 7 are arranged independently, however, they may be arranged integrally to be one piece. The pulse compressing transmission path 11 making up optical pulse compressor 7 has a high nonlinearity coefficient thereby to be able to perform adiabatic soliton compression on beat light. Then, if the transmission path length of the pulse compressing transmission path 11 is increased, the waveform shaper 9 and the optical pulse compressor 7 can be integrally formed into one piece.

EXAMPLE 14

Figure 68:
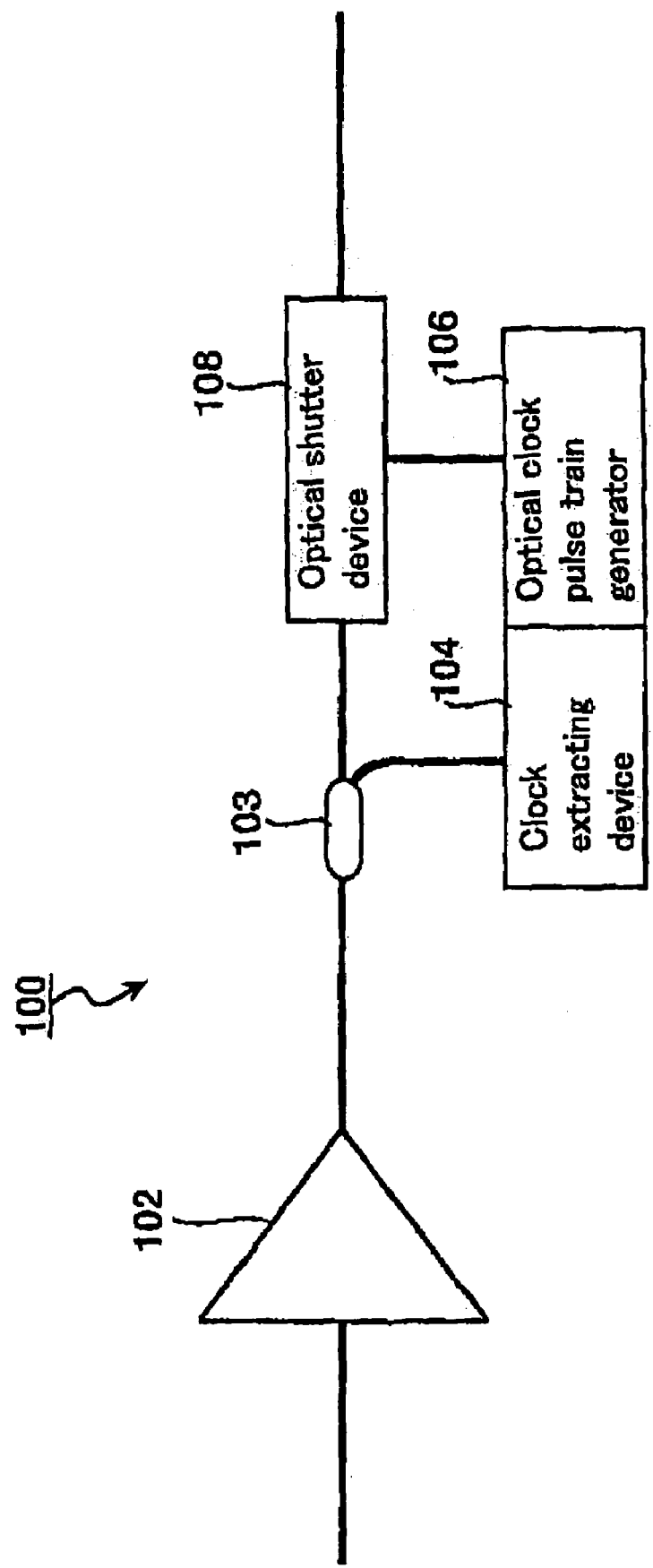
FIG. 68 is a view illustrating a configuration of an optical regenerating system including a waveform shaper according to the present invention.

Next description is made about an example 14. An optical regenerating system according to the example 14 utilizes a waveform shaper according to the example 11 or 12 or an optical pulse generator according to the example 13. With reference to FIG. 68, the above-mentioned optical regenerating system using a waveform shaper is described below.

The optical regenerating system 100 shown in FIG. 68 includes an amplifier 102, a multiplexer 103, a clock extracting device 104, an optical clock pulse train generator 106 composed by an optical pulse generator which includes a waveform shaper according to example 1 or 2) (see FIGS. 58 ad 62) or an optical pulse generator according to the example 13 (see FIGS. 64 ad 67), and an optical shutter device 108. The amplifier 102 is for amplifying attenuated signal light and may be configured by an Erbium-doped Fiber Amplifier, a Raman amplifier, a semiconductor amplifier, a parametric amplifier or the like.

The clock extracting device 104 is provided for extracting the repetition frequency of a signal light pulse. As is not shown, the clock extracting device 104 is configured by including an electronic circuit based device composed of, for example, a photo detector, an electric clock extracting circuit and a semiconductor laser. An all-optic clock extracting device may be used which is composed of an amplifier, a nonlinear optical medium and optical filter Here, the nonlinear optical medium may be for example, highly nonlinear fiber or a semiconductor device.

The optical clock pulse train generator 106 is provided for generating an optical clock pulse train with a repetition frequency of a signal light pulse, and utilizes an optical pulse generator which includes a waveform shaper (see FIGS. 58 ad 62) or an optical pulse generator (see FIGS. 64 ad 67). Since its configuration, function and the like are already described above, their description is omitted here.

The optical shutter device 108 is a device for modulating output light from the optical clock pulse train generator 106 by signal light divided by the multiplexer 103.

In the optical regenerating system 100 of the example 14, transmitted signal light is amplified by the amplifier 102 and divided by the multiplexer 103. A part of the signal light is propagated as it is to be input into the optical shutter device 108. The other part of the signal light is input to the clock extracting device 104. An output electric signal from the clock extracting device 104 is used to control output light from the optical clock pulse train generator 106, which is then input to the optical shutter device 108. In the optical shutter device 108, an optical clock pulse train is modulated by the signal light propagating from the multiplexer 103 and thereby signal light timing is regenerated.

Thus, when the optical pulse generator of the present invention is used as the optical clock pulse train generator 106, it becomes possible to obtain optical pulse trains with less fluctuation in optical pulse intensity and time.

(Effects of Waveform Shaper and Optical Regenerating System)

As described above, according to the present invention, as a plurality of highly nonlinear optical transmission lines and a plurality of low nonlinearity optical transmission lines are arranged and absolute values of second-order dispersion values of the highly nonlinear optical transmission lines and the low nonlinearity optical transmission lines are differentiated, it is possible to realize a dispersion-decreasing transmission path equivalently. Further, as highly nonlinear optical transmission lines are use, it becomes possible to realize a waveform shaper with a high dispersion value as a whole.

Further, according to the present invention, as an optical isolator is arranged at a distance that is equal to or less than a soliton period, it is possible to suppress SBS occurrence in the waveform shaper and to output soliton light of high intensity.

Furthermore, according to the present invention, as an optical isolator is arranged at a connecting portion of optical transmission lines, it is possible to reduce the number of fusion splicing portions and to realize a waveform shaper with reduced optical loss.

Furthermore, according to the present invention, as an optical isolator is arranged anterior to the highly nonlinear optical transmission line, it is possible to suppress SBS occurrence more effectively. In addition, as SBS is one of nonlinear phenomena, it is apt to occur in a highly nonlinear optical transmission line. Therefore, as an isolator is arranged anterior to the highly nonlinear optical transmission line, SBS occurrence can be suppressed more effectively.

Furthermore, according to the present invention, as Raman amplification is performed on light propagating in a highly nonlinear optical transmission line, it is possible to shorten the highly nonlinear optical transmission line and to compress the pulse width of output light.

Furthermore, according to the present invention, as a waveform shaper as described above and/or an optical pulse generator as described above is as an optical clock pulse generator making up the optical regenerating system, it is possible to obtain optical clock pulse trains with less fluctuation in optical pulse intensity and in time.

(Another Embodiment of the Present Invention)

Further, another embodiment of the present invention is described below.

This embodiment relates to a method for forming various optical pulse trains based on a single frequency light source. Basically, by one single frequency light source or after a plurality of single frequency light sources is combined, signal light with a plurality of frequencies correlated with each other is generated. The signal light is divided into the correlated frequencies by arrayed waveguide grating, and phases and intensities of the divided signal light are adjusted before the divided signal light is combined again by the same type of arrayed waveguide grating. Since the phase and intensity of each divided signal light, it is possible to obtain a desired pulse train and to make the waveform of this pulse train vary as appropriate.

The present embodiment is configured as follows.

Figure 69:
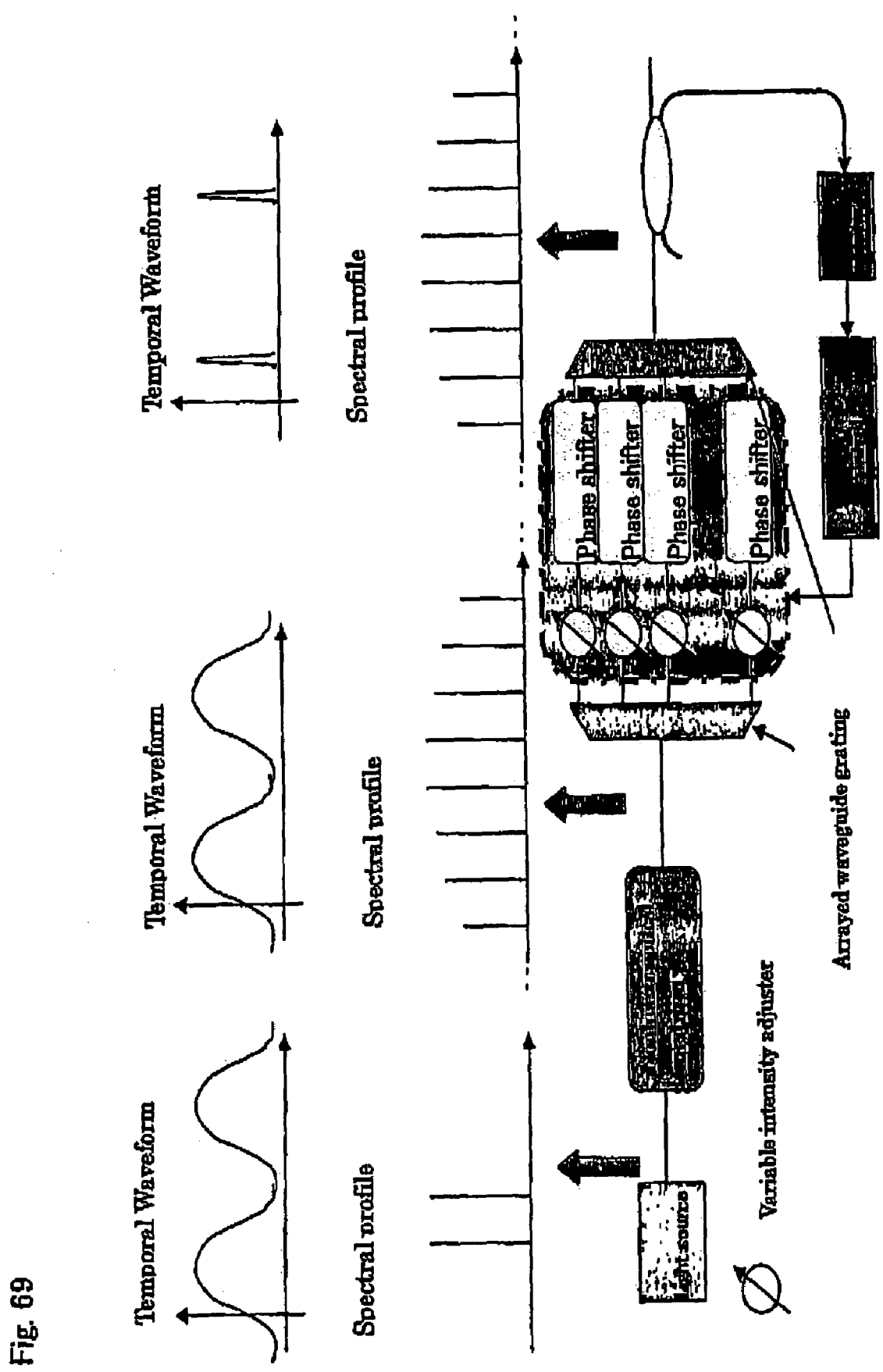
FIG. 69 is a schematic view illustrating a configuration of another example.

As shown in FIG. 69, the present invention includes a light source, a nonlinear medium for increasing the number of spectral lines, an adjuster for adjusting the phase and the intensity of light per spectral component and a monitoring and controlling portion. Control by the adjuster makes it possible to manipulate the desired waveform flexibly.

In this embodiment, an output of light source having two wavelengths or several frequencies with correlation in phase is formed via the nonlinear medium into light with plural frequencies that are spaced by a predetermined distance. At this stage, input light occurs via nonlinear interaction, and therefore, plural frequencies of generated light are correlated in phase with each other. As with this phase correlation maintained, the phase and the intensity of light of each frequency are adjusted, it becomes possible to multiplex into a flexible pulse waveform with a repetition frequency period corresponding to the inverse of the frequency period. Time width of the pulse waveform is given by the inverse of the spectral envelop width broadened by the nonlinear medium. That is, the present invention is based on free adjustment and combining of Fourier components of a Fourier-series-developed pulse train.

In the conventional art, the waveform of a pulse can no be changed freely. The waveform is fixed by nonlinearity of a medium, dispersion, loss and its spectrum. Further, when conventional materials are prepared to realize a desired characteristic, there are limits to the spectrum, the length and the like. According to the conventional art, in order to obtain a high-quality pulse waveform, a thermal insulation step is required to be used and therefore, there presents a problem that the length and dimensions are too large for a waveform shaper. In the system of the present invention, the pulse waveform can be made variable, precise control is possible, less limit is imposed on the spectrum as compared with the conventional art, and therefore, the system of the present invention can be realized advantageously in dimensions, length and power consumption. Accordingly, the present invention is superior to the conventional art in changeability of a pulse waveform, dimensions, power consumption and spectrum.

An example according to the present invention is described below.

EXAMPLE 15

A light source used in this embodiment may be a beat light source configured by combining two single frequency light sources (variable wavelength may be used) such as DFB lasers having different oscillation wavelengths or may be a pulse light source configured by a single frequency light source and an external modulator. The nonlinear medium used in this example is a PPLN, an optical fiber, a photonic crystal or the like. The phase and intensity adjuster used in this example includes an arrayed waveguide grating (AWG) using PLC technique, a variable optical attenuator (VOA) to which the thermo-optic effect is applied, and a phase shifter. The phase shifter maybe only able to control a phase delay which is the order of an optical wavelength. As these are provided on an integrated circuit based on the PLC technique, the stability and the controllability of phase control can be significantly improved. If this system is realized in the polarization maintaining system, the stability is further improved.

The invention claimed is:

1. An optical pulse train generator operatively coupled to a light source generating an optical signal, comprising:

a shaper coupled to the light source for shaping the optical signal from the light source to produce a shaped optical signal;

a compressor coupled to the shaper for compressing the shaped optical signal from the compressor to produce a shaped and compressed optical signal in the form of an optical pulse train;

wherein the shaper comprises a first CPF (comb-like profiled fiber) formed by an alternating arrangement of nonlinear medium and dispersion medium;

wherein the compressor comprises a second CPF (comb-like profiled fiber) formed by an alternating arrangement of nonlinear medium and dispersion medium;

wherein the shaper has an average dispersion profile which increases in propagation direction of the optical signal; and wherein the compressor has an average dispersion profile which decreases in the propagation direction of the optical signal;

wherein the nonlinear medium is given by $L_{NL}<L_D$, the dispersion medium is given by $L_{NL}>L_D$, and $L_{NL}$ and $L_D$ are expressed by an equation:

$$L_D = T_0^2/\beta_2, L_{NL} = 1/\gamma p_0$$

where:

$T_0$: pulse $1/e^2$ width
$P_0$: pulse peak power
$\gamma$: nonlinearity coefficient
$\beta_2$: dispersion value.

2. The optical pulse train generator as claimed in claim 1, wherein a phase shift due to a nonlinear effect in the nonlinear medium is 1 radian or less and a phase shift due to a dispersion effect in the dispersion medium is 1 radian or less.

3. The optical pulse train generator as claimed in claim 1, wherein the nonlinear medium has a nonlinearity coefficient that is 5/W/km or more.

4. The optical pulse train generator as claimed claim 1, further comprising an isolator at a distance within a soliton period.

5. The optical pulse train generator as claimed in claim 1, wherein said light source is configured to generate a beat light signal as said optical signal.

6. An SBS suppressor using the optical pulse train generator of claim 1.

7. The optical pulse train generator as claimed in claim 1, configured to form a Raman gain medium have a nonlinearity coefficient which is 5/W/km or more;
wherein the light source comprises a pumping LD, and a coupler for inputting output light from said pumping LD into said Raman gain medium.

8. The optical pulse train generator as claimed in claim 1, configured to form an SBS suppressor for suppressing SBS.

* * * * *

UNITED STATES PATENT AND TRADEMARK OFFICE
CERTIFICATE OF CORRECTION

PATENT NO. : 7,447,444 B2 Page 1 of 1
APPLICATION NO. : 11/134275
DATED : November 4, 2008
INVENTOR(S) : Koji Igarashi et al.

It is certified that error appears in the above-identified patent and that said Letters Patent is hereby corrected as shown below:

Column 30, line 58, change, "maybe" to --may be--.

Column 36, line 30, change, "path" to --line--,
line 41, change, "path" to --line--,
line 66, change, "path" to --line--.

Column 37, line 2, change, "path" to --line--,
line 12, change, "path" to --line--,
line 13, change, "path" to --line--,
line 15, change, "path" to --line--,
line 16, change, "path" to --line--,
line 19, change, "path" to --line--,
line 21, change, "path" to --line--,
line 22, change, "path" to --line--,
line 30, change, "path" to --line--,
line 48, change, "path" to --line--,
line 50, change, "path" to --line--.

Column 42, line 37, change, "maybe" to --may be--.

Signed and Sealed this

Thirty-first Day of August, 2010

David J. Kappos
*Director of the United States Patent and Trademark Office*